US010422208B2

(12) United States Patent
Weng et al.

(10) Patent No.: US 10,422,208 B2
(45) Date of Patent: Sep. 24, 2019

(54) STACKED HEIGHT GROWTH FRACTURE MODELING

(71) Applicant: Schlumberger Technology Corporation, Sugar Land, TX (US)

(72) Inventors: Xiaowei Weng, Fulshear, TX (US); Charles-Edouard Cohen, Rio de Janeiro (BR); Olga Kresse, Sugar Land, TX (US)

(73) Assignee: Schlumberger Technology Corporation, Sugar Land, TX (US)

( * ) Notice: Subject to any disclaimer, the term of this patent is extended or adjusted under 35 U.S.C. 154(b) by 0 days.

(21) Appl. No.: 14/664,362

(22) Filed: Mar. 20, 2015

(65) Prior Publication Data

US 2016/0357883 A1 Dec. 8, 2016

Related U.S. Application Data

(63) Continuation-in-part of application No. 14/356,369, filed as application No. PCT/US2012/063340 on Nov. 2, 2012.
(Continued)

(51) Int. Cl.
*E21B 43/267* (2006.01)
*E21B 43/26* (2006.01)
(Continued)

(52) U.S. Cl.
CPC ............ *E21B 43/267* (2013.01); *E21B 43/26* (2013.01); *G06F 17/13* (2013.01); *G06F 17/5009* (2013.01)

(58) Field of Classification Search
None
See application file for complete search history.

(56) References Cited

U.S. PATENT DOCUMENTS 6,101,447 A 8/2000 Poe, Jr.
6,439,310 B1 8/2002 Scott, III et al.
(Continued)

FOREIGN PATENT DOCUMENTS

CN 1916359 2/2007
CN 102606126 A 7/2012
(Continued)

OTHER PUBLICATIONS

Britt et al., "Horizontal Well Completion, Stimulation Optimization, and Risk Mitigation", Paper SPE 125526 presented at the 2009 SPE Eastern Regional Meeting, Charleston, Sep. 23-25, 2009, 17 pages.
(Continued)

*Primary Examiner* — Andrew Sue-Ako

(57) ABSTRACT

A method involves generating a hydraulic fracture growth pattern for a fracture network. The generating involves representing hydraulic fractures as a vertically stacked elements, extending the represented hydraulic fractures laterally from the wellbore and into the formation to form a hydraulic fracture network by adding new elements to the vertically stacked elements over time, determining hydraulic fracture parameters of the represented hydraulic fractures, determining transport parameters for the proppant passing through the hydraulic fracture network, deriving an estimated fracture tip velocity from a pressure and a stress profile of the formation; extending a height of the vertically stacked elements and the new elements over time based on the derived velocity to form extended vertically stacked elements. If a zone property change is encountered, then generating another stack of the vertically stacked elements in the zones of property change by splitting at least a portion of the extended vertically stacked elements.

30 Claims, 29 Drawing Sheets

Related U.S. Application Data

(60) Provisional application No. 61/628,690, filed on Nov. 4, 2011.

(51) Int. Cl.
  *G06F 17/13*    (2006.01)
  *G06F 17/50*    (2006.01)

(56) References Cited

U.S. PATENT DOCUMENTS

| | | |
|---|---|---|
| 6,462,549 B1 | 10/2002 | Curtis et al. |
| 6,812,334 B1 | 11/2004 | Mirkin et al. |
| 6,876,959 B1 | 4/2005 | Peirce et al. |
| 6,947,843 B2 | 9/2005 | Fisher et al. |
| 7,363,162 B2 | 4/2008 | Thambynayagam et al. |
| 7,509,245 B2 | 3/2009 | Siebrits et al. |
| 7,663,970 B2 | 2/2010 | Duncan et al. |
| 7,788,074 B2 | 8/2010 | Scheidt et al. |
| 7,819,181 B2 | 10/2010 | Entov et al. |
| 8,061,424 B2 | 11/2011 | Willberg et al. |
| 8,126,689 B2 | 2/2012 | Soliman et al. |
| 8,408,313 B2 | 4/2013 | Yale et al. |
| 8,412,500 B2 | 4/2013 | Weng et al. |
| 8,428,923 B2 | 4/2013 | Siebrits et al. |
| 8,498,852 B2 | 7/2013 | Xu et al. |
| 8,571,843 B2 | 10/2013 | Weng et al. |
| 8,584,755 B2 | 11/2013 | Willberg et al. |
| 8,812,334 B2 | 8/2014 | Givens et al. |
| 8,991,494 B2 | 3/2015 | Willberg et al. |
| 9,715,026 B2 | 7/2017 | Ejofodomi et al. |
| 2005/0017723 A1 | 1/2005 | Entov et al. |
| 2005/0060099 A1 | 3/2005 | Sorrells et al. |
| 2005/0125209 A1 | 6/2005 | Soliman et al. |
| 2006/0081412 A1 | 4/2006 | Wright et al. |
| 2007/0272407 A1 | 11/2007 | Lehman et al. |
| 2007/0294034 A1 | 12/2007 | Bratton et al. |
| 2008/0093073 A1 | 4/2008 | Bustos et al. |
| 2008/0133186 A1 | 6/2008 | Li et al. |
| 2008/0164021 A1 | 7/2008 | Dykstra |
| 2008/0183451 A1 | 7/2008 | Weng et al. |
| 2009/0048783 A1 | 2/2009 | Jechumtalova et al. |
| 2009/0065253 A1 | 3/2009 | Suarez-Rivera et al. |
| 2009/0093965 A1 | 4/2009 | Godfrey et al. |
| 2009/0125280 A1 | 5/2009 | Soliman et al. |
| 2010/0004906 A1 | 1/2010 | Searles et al. |
| 2010/0138196 A1 | 6/2010 | Hui et al. |
| 2010/0250215 A1 | 9/2010 | Kennon et al. |
| 2010/0252268 A1 | 10/2010 | Gu et al. |
| 2010/0256964 A1 | 10/2010 | Lee et al. |
| 2010/0262372 A1 | 10/2010 | Le Calvez et al. |
| 2011/0029291 A1 | 2/2011 | Weng et al. |
| 2011/0069584 A1 | 3/2011 | Eisner et al. |
| 2011/0077918 A1 | 3/2011 | Mutlu et al. |
| 2011/0125471 A1 | 5/2011 | Craig et al. |
| 2011/0257944 A1 | 10/2011 | Du et al. |
| 2012/0160481 A1 | 6/2012 | Williams |
| 2012/0173216 A1 | 7/2012 | Koepsell et al. |
| 2012/0179444 A1 | 7/2012 | Ganguly et al. |
| 2012/0232872 A1 | 9/2012 | Nasreldin et al. |
| 2012/0310613 A1 | 12/2012 | Moos et al. |
| 2012/0325462 A1 | 12/2012 | Roussel et al. |
| 2013/0140031 A1 | 6/2013 | Cohen et al. |
| 2013/0144532 A1 | 6/2013 | Williams et al. |
| 2014/0052377 A1 | 2/2014 | Downie |
| 2014/0083687 A1 | 3/2014 | Poe et al. |
| 2014/0151033 A1 | 6/2014 | Xu et al. |
| 2014/0299315 A1 | 10/2014 | Chuprakov et al. |
| 2014/0352949 A1 | 12/2014 | Amendt et al. |
| 2015/0204174 A1 | 7/2015 | Kresse et al. |

FOREIGN PATENT DOCUMENTS

| | | |
|---|---|---|
| RU | 2412454 C2 | 2/2011 |
| WO | 2010136764 A2 | 12/2010 |
| WO | 2013016733 | 4/2013 |
| WO | 2013055930 | 4/2013 |
| WO | 2013067363 | 5/2013 |
| WO | 2015003028 A1 | 1/2015 |
| WO | 2015069817 | 5/2015 |

OTHER PUBLICATIONS

Cheng, "Boundary Element Analysis of the Stress Distribution around Multiple Fractures: Implications for the Spacing of Perforation Clusters of Hydraulically Fractured Horizontal Wells", Paper SPE 125769 presented at the 2009 SPE Eastern Regional Meeting, Charleston, Sep. 23-25, 2009.

Cipolla et al., "Integrating Microseismic Mapping and Complex Fracture Modeling to Characterize Fracture Complexity", Paper SPE 140185 presented at the SPE Hydraulic Fracturing Conference and Exhibition, Woodlands, Texas, USA, Jan. 24-26, 2011.

Cohen et al., "Parametric Study on Completion Design in Shale Reservoirs Based on Fracturing-to-Production Simulations," Paper IPTC 17462, presented at International Petroleum Technology Conference, Doha, Qatar, Jan. 20-22, 2014, 11 pages.

Crouch et al., "The Displacement Discontinuity Method", Chapter 5, Appendix B (TWODD) of Boundary Element Methods in Solid Mechanics: With Applications in Rock Mechanics and Geological Engineering, George Allen & Unwin Ltd, London, Jan. 20, 1983, p. 79-109, 293-303.

Daneshy et al., "Fracture shadowing: a direct method for determining of the reach and propagation pattern of hydraulic fractures in horizontal wells", SPE paper 151980 presented at the SPE Hydraulic Fracturing Technology Conference, The Woodlands, Texas Feb. 6-8, 2012, 9 pages.

Daniels et al., "Contacting More of the Barnett Shale Through an Integration of Real-Time Microseismic Monitoring, Petrophysics, and Hydraulic Fracture Design", Paper SPE 110562 presented at the 2007 SPE Annual Technical Conference and Exhibition, Anaheim, California, USA, Oct. 12-14, 2007, 12 pages.

Derschowitz et al., "A Discrete fracture network approach for evaluation of hydraulic fracture stimulation of naturally fractured reservoirs", ARMA 10-475, Presented at 44th US Rock Mechanics symposium, Salt Lake City, Utah, Jun. 27-30, 2010, 8 pages.

Fisher et al., "Optimizing horizontal completion techniques in the Barnett Shale using microseismic fracture mapping", SPE 90051 presented at the SPE Annual Technical Conference and Exhibition, Houston, Sep. 26-29, 2004, 11 pages.

Fu et al., "Simulating complex fracture system in geothermal reservoirs using an explicitly coupled hydro-geomechanical model", ARMA 11-244, presented at 45 US Rock Mechanics Symposium, San Francisco, CA, Jun. 26-29, 2011, 10 pages.

Germanovich et al., "Fracture Closure in Extension and Mechanical Interaction of Parallel Joints", J. Geophys. Res., 109, 2004, 22 pages.

Gu et al., "Criterion for Fractures Crossing Frictional Interfaces at Non-orthogonal Angles", ARMA10-198, 44th US Rock symposium, Salt Lake City, Utah, Jun. 27-30, 2010, pp. 333-338.

Gu et al., "Hydraulic Fracture Crossing Natural Fracture at Non-Orthogonal Angles, a Criterion, Its Validation and Applications", Paper SPE 139984 presented at the SPE Hydraulic Fracturing Conference and Exhibition, The Woodlands, Texas, Jan. 24-26, 2011, 11 pages.

Koutsabeloulis et al., "3D Reservoir Geomechanics Modeling in Oil/Gas Field Production", SPE Paper 126095, 2009 SPE Saudi Arabia Section Technical Symposium and Exhibition held in Al Khobar, Saudi Arabia, May 9-11, 2009, 14 pages.

Kresse et al., "Numerical Modeling of Hydraulic Fractures Interaction in Complex Naturally Fractured Formations," ARMA 12-292, 46th U.S. Rock Mechanics / Geomechanics Symposium, Jun. 24-27, 2012, Chicago, IL, 11 pages.

Mack et al., "Mechanics of Hydraulic Fracturing. Chapter 6, Reservoir Stimulation", 3rd Ed., eds. Economides, M.J. and Nolte, K.G. John Wiley & Sons, 2000, pp. 6-1-6-49.

Meyer et al., "A Discrete Fracture Network Model for Hydraulically Induced Fractures: Theory, Parametric and Case Studies", Paper

(56) References Cited

OTHER PUBLICATIONS

SPE 140514 presented at the SPE Hydraulic Fracturing Conference and Exhibition, The Woodlands, Texas, USA, Jan. 24-26, 2011, 36 pages.
Nagel et al., "Simulating hydraulic fracturing in real fractured rock—overcoming the limits of Pseudo3D Models", SPE Paper 140480 presented at the SPE Hydraulic Fracturing Conference and Exhibition, The Woodlands, Texas, Jan. 24-26, 2011, 15 pages.
Nagel et al., "Stress shadowing and microseismic events: a numerical evaluation", SPE Paper 147363 presented at the SPE Annual Technical conference and Exhibition, Denver, Colorado, Oct. 30-Nov. 2, 2011, 21 pages.
Narendran et al., "Analysis of growth and interaction of multiple hydraulic fractures", SPE paper 12272 presented at the Reservoir Simulation Symposium, San Francisco, CA, Nov. 15-18, 1983, 14 pages.
Nolte, "Fracturing Pressure Analysis for nonideal behavior", Journal of Petroleum Technology, Feb. 1991, pp. 210-218.
Olson, "Multi-Fracture Propagation Modeling: Applications to Hydraulic Fracturing in Shales and Tight Gas Sands", ARMA 08-327, 42nd US Rock Mechanics Symposium and 2nd US-Canada Rock Mechanics Symposium, San Francisco, CA, Jun. 29-Jul. 2, 2008, 8 pages.
Olson, "Predicting Fracture Swarms—The Influence of Sub critical Crack Growth and the Crack-Tip Process Zone on Joints Spacing in Rock", Geological Society—Special Publications, London, Geological Society Publishing House, vol. 231, 2004, pp. 73-87.
Olson, J. E "Fracture Mechanics Analysis of Joints and Veins", PhD dissertation, Stanford University, San Francisco, California, 1990, 191 pages.
Renshaw et al., "An Experimentally Verified Criterion for Propagation across Unbounded Frictional Interfaces in Brittle, Linear Elastic Materials", Int. J. Rock Mech. Min. Sci. & Geomech. Abstr., vol. 32, 1995, pp. 237-249.
Rich et al., "Unconventional Geophysics for Unconventional Plays", Paper SPE 131779 presented at the Unconventional Gas Conference, Pittsburgh, Pennsylvania, USA, Feb. 23-25, 2010, 7 pages.
Rogers et al., "Understanding hydraulic fracture geometry and interactions in pre-conditioning through DFN and numerical modeling", ARMA 11-439, presented at 45 US Rock Mechanics Symposium, San Francisco, CA, Jun. 26-29, 2011, 6 pages.
Rogers et al., "Understanding hydraulic fracture geometry and interactions in the Horn River Basin through DFN and numerical modeling", CSUG/SPE paper 137488 presented at CSUG conference, Calgary, Alberta, Canada, Oct. 19-21, 2010, 12 pages.
Roussel et al., "Implications of fracturing pressure data recorded during a horizontal completion on stage spacing design", SPE paper 152631 presented at the SPE Hydraulic Fracturing Technology Conference, The Woodlands, Texas, Feb. 6-8, 2012, 14 pages.
Roussel et al., "Optimizing Fracture Spacing and Sequencing in Horizontal-Well Fracturing", SPE Production & Operation, May 2011, pp. 173-184.
Sneddon et al., "The opening of a Griffith crack under internal pressure", Quarterly Applied Mathematics. vol. 4, No. 3, 1946, pp. 262-267.
Sneddon, "The distribution of stress in the neighborhood of a crack in an elastic solid", Proc. Royal Society of London, Series A, vol. 187, 1946, pp. 229-260.
Warpinski et al., "Altered-Stress Fracturing", Journal of Petroleum Technology, Sep. 1989, pp. 990-997.
Warpinski et al., "Influence of Geologic Discontinuities on Hydraulic Fracture Propagation", Journal of Petroleum Technology, Feb. 1987, pp. 209-220.
Weng et al., "Modeling of Hydraulic-Fracture-Network Propagation in a Naturally Fractured Formation," J. SPE Production & Operations, vol. 26. No. 4, pp. 368-380, Nov. 2011.
Weng et al., "Modeling of Hydraulic-Fracture-Network Propagation in a Naturally Fractured Formation," Paper SPE 140253 presented at the SPE Hydraulic Fracturing Conference and Exhibition, Woodlands, Texas, USA, Jan. 24-26, 2011, 18 pages.
Weng, "Fracture Initiation and Propagation from Deviated Wellbores" Paper SPE 26597 presented at SPE 68th Annual Technical Conference and Exhibition, Houston, TX, Oct. 3-6, 1993, 16 pages.
Wu et al., "Modeling of Interaction of Hydraulic Fractures in Complex Fracture Networks", SPE 152052 prepared for presentation at the SPE Hydraulic Fracturing Technology Conference held in The Woodlands, Texas, USA, Feb. 6-8, 2012, 15 pages.
Xu et al., "Characterization of Hydraulically-Induced Fracture Network Using Treatment and Microseismic Data in a Tight-Gas Formation: A Geomechanical Approach", SPE-125237, 2009 SPE Tight Gas Completions Conference, Jun. 2009, 5 pages.
Yew et al., "On Perforating and Fracturing of Deviated Cased Wellbores", Paper SPE 26514 presented at SPE 68th Annual Technical Conference and Exhibition, Houston, TX, Oct. 3-6, 1993, 12 pages.
Zhang et al., "Deflection and Propagation of Fluid-Driven Fractures at Frictional Bedding Interfaces: A Numerical Investigation", Journal of Structural Geology, vol. 29, 2007, pp. 396-410.
Cipolla et al., "Effect of Well Placement on Production and Frac Design in a Mature Tight Gas Field", SPE 95337, 2005 SPE Annual Technical Conference and Exhibition, Oct. 9-12, 2005, 10 pages.
Cipolla et al., "Hydraulic Fracture Complexity: Diagnosis, Remediation, and Exploitation", SPE 115771, 2008 SPE Asia Pacific Oil & Gas Conference and Exhibition, Oct. 20-22, 2008, 24 pages.
Cipolla et al., "The Relationship Between Fracture Complexity, Reservoir Properties, and Fracture Treatment Design",SPE 115796, 2008 SPE Annual Technical Conference and Exhibition, Sep. 21-24, 2008, 25 pages.
Craig et al., "Using Maps of Microseismic Events to Define Reservoir Discontinuities", SPE 135290, SPE Annual Technical Conference and Exhibition, Sep. 19-22, 2010, 8 pages.
Crouch et al., Element Methods in Solid Mechanics, with applications in rock mechanics and geological engineering, 1983, pp. 93-96, London, George Allen & Unwin.
Examination Report issued in European Application No. 12845204.2 dated Dec. 21, 2015; 8 pages.
Fisher et al., "Integrating Fracture-Mapping Technologies to Improve Stimulations in the Barnett Shale", SPE Production & Facilities, Society of Petroleum Engineers, May 2005, pp. 85-93.
International Search Report and Written Opinion issued in corresponding International Application No. PCT/US2012/063340 dated Apr. 9, 2014; 10 pages.
International Search Report and Written Opinion issued in corresponding International Application No. PCT/US2013/076765 dated Apr. 9, 2014; 10 pages.
Itasca Consulting Group Inc., 2002, FLAC3D (Fast Lagrangian Analysis of Continua in 3 Dimensions), Version 2.1, Minneapolis: ICG (2002)—product brochure for newest version 5.01 submitted, 12 pages.
Jeffrey et al., "Hydraulic Fracture Offsetting in Naturally Fractured Reservoirs: Quantifying a Long-Recognized Process", SPE 119351, 2009 SPE Hydraulic Fracturing Technology Conference, Jan. 19-21, 2009, 15 pages.
Maxwell et al., "Key Criteria for a Successful Microseismic Project", SPE 134695, SPE Annual Technical Conference and Exhibition, Sep. 19-22, 2010, 16 pages.
Maxwell et al., "Microseismic Imaging of Hydraulic Fracture Complexity in the Barnett Shale", SPE 77440, SPE Annual Technical Conference and Exhibition, Sep. 29-Oct. 2, 2002, 9 pages.
Maxwell et al., "What Does Microseismicity Tell Us About Hydraulic Fracturing?", SPE 146932, SPE Annual Technical Conference and Exhibition, Oct. 30-Nov. 2, 2011, 14 pages.
Maxwell, "Microseismic Location Uncertainty", CSEG Recorder, Apr. 2009, pp. 41-46.
Mayerhofer et al., "Integration of Microseismic Fracture Mapping Results With Numerical Fracture Network Production Modeling in the Barnett Shale", SPE 102103, 2006 SPE Annual Technical Conference and Exhibition, Sep. 24-27, 2006, 8 pages.
Mayerhofer et al., "What is Stimulated Reservoir Volume (SRV)?", SPE 119890, 2008 SPE Shale Gas Production Conference, Nov. 16-18, 2008, 14 pages.
Office Action issued in Chinese Patent Application No. 201280066343.7 dated Nov. 26, 2015; 10 pages.

(56) References Cited

OTHER PUBLICATIONS

Search Report issued in European Application No. 12845204.2 dated Dec. 8, 2015; 5 pages.
Warpinski et al., "Comparison of Single- and Dual-Array Microseismic Mapping Techniques in the Barnett Shale", SPE 95568, 2005 SPE Annual Technical Conference and Exhibition, Oct. 9-12, 2005, 10 pages.
Warpinski et al., "Mapping Hydraulic Fracture Growth and Geometry Using Microseismic Events Detected by a Wireline Retrievable Accelerometer Array", SPE 40014, 1998 SPE Gas Technology Symposium, Mar. 15-18, 1998, pp. 335-346.
Warpinski et al., "Stimulating Unconventional Reservoirs: Maximizing Network Growth while Optimizing Fracture Conductivity", 2008 SPE Unconventional Reservoirs Conference, Feb. 10-12, 2008, 19 pages.
Williams et al., "Quantitative interpretation of major planes from microseismic event locations with application in production prediction", SEG Denver 2010 Annual Meeting, 2010, pp. 2085-2089.
Williams-Stroud, "Using Microseismic Events to Constrain Fracture Network Models and Implications for Generating Fracture Flow Properties for Reservoir Stimulation", SPE 119895, 2008 SPE Shale Gas Production Conference, Nov. 16-18, 2008, 7 pages.
Zhang et al., "Coupled geomechanics-flow modelling at and below a critical stress state used to investigate common statistical properties of field production data", In: Jolley, S. J., Barr, D., Walsh, J. J. & Knipe, R. J. (eds) Structurally Complex Reservoirs, 2007, vol. 292, pp. 453-468, London, Special Publications, The Geological Society of London.
Zhao et al., "Numerical Stimulation of Seismicity Induced by Hydraulic Fracturing in Naturally Fractured Reservoirs", SPE 124690, 2009 SPE Annual Technical Conference and Exhibition, Oct. 4-7, 2009, 17 pages.
International Search Report and Written Opinion issued in PCT/US2016/023013 dated Jun. 24, 2016; 10 pages.
International Search Report and Written Opinion issued in International Patent Application No. PCT/US2014/064205 dated Feb. 23, 2016; 11 pages.
Decision on Grant issued in Russian Patent Application No. 2015130593/03(047134) dated Jul. 6, 2016; 22 pages (with English Translation).
Examination Report issued in European Patent Application No. 12845204.2 dated Nov. 24, 2016; 7 pages.
Office Action issued in Chinese Patent Application No. 201380073405.1 dated Nov. 2, 2016; 10 pages.
Non-Final Office Action issued in U.S. Appl. No. 15/034,927 dated Jun. 22, 2017; 20 pages.
Bratton et al., Rock Strength Parameters from Annular Pressure While Drilling and Dipole Sonic Dispersion Analysis, Presented at the SPWLA 45th Annual Logging Symposium, Noordwijk, The Netherlands, Jun. 6-9, 2004, 14 pages.
Cipolla, C., Maxwell, S., and Mack, M. 2012. Engineering Guide to Applications of Microseismic Interpretations, SPE 152165, Hydraulic Fracturing Technology Conference, Woodlands, Texas, Feb. 6-8, 2012, 24 pages.
Cipolla, C.L., Williams, M.J., Weng, X., Mack, M., and Maxwell, S. 2010. Hydraulic Fracture Monitoring to Reservoir Simulation: Maximizing Value. Paper SPE 133877 presented at the SPE Technical Conference and Exhibition held in Florence, Italy, Sep. 19-22, 2010, 26 pages.
Downie et al., Using Microseismic Source Parameters to Evaluate the Influence of Faults on Fracture Treatments: A Geophysical Approach to Interpretation, SPE Annual Technical Conference and Exhibition, Sep. 19-22, 2010, Florence, Italy, 13 pages.
Du, C., et al., "A Workflow for Integrated Barnett Shale Gas Reservoir Modeling and Simulation," SPE 122934, Society of Petroleum Engineers, Jun. 2009, 12 pages.
Fisher et al., Integrating Fracture Mapping Technologies to Optimize Stimulations in the Barnett Shale, SPE 77411 presented at the SPE Annual Technical Conference and Exhibition, San Antonio, Texas, Sep. 29-Oct. 2, 2002, pp. 85-93.
Fomin, S. & Hashida, T., "Advances in mathematical modeling of hydraulic stimulation of a subterranean fractures reservoir", SPIE 5831, 2005, pp. 148-154.
Hanks, T.C., "A Moment Magnitude Scale", Journal of Geophysical Research, American Geophysical Union, vol. 84 No. B5, 1979, pp. 2348-2350.
International Search Report and Written Opinion issued in International Patent Appl. No. PCT/US2014/045182 dated Oct. 24, 2014; 13 pages.
Kresse et al., Numberical Modeling of Hydraulic Fracturing in Naturally Fractured Formations, 45th US Rock Mechanics/Geomechanics Symposium, San Francisco, CA, Jun. 26-29, 2011, 11 pages.
Kresse et al., Numerical Modeling of Hydraulic Fractures Interaction in Complex naturally Fractured Formations, ARMA 12-292, Rock Mech Rock Eng., Jan. 2013, 11 pages.
Le Calvez, "Using Induced Microseismicity to Monitor Hydraulic Fracture Treatment: A Tool to Improve Completion Techniques and Reservoir Management", SPE 104570, Oct. 11-13, 2006, 9 pages.
Maxwell et al., Microseismic Deformation Rate Monitoring, SPE 116596, SPE Annual Technical Conference and Exhibition, Sep. 21-24, 2008, Denver, Colorado, USA, 9 pages.
Maxwell et al., Modeling Microseismic Hydraulic Fracture Deformation, SPE 166312-MS, SPE Annual Technical Conference and Exhibition held in New Orleans, Louisiana, USA, Sep. 30-Oct. 2, 2013, 10 pages.
Maxwell et al., Monitoring SAGD Steam Injection Using Microseismicity and Tiltmeters, SPE 110634, SPE Annual Technical Conference and Exhibition, Nov. 11-14, 2007, Anaheim, California, U.S.A., 7 pages.
Maxwell et al., Monitoring SAGD Steam Injection Using Microseismicity and Tiltmeters, SPE Reservoir Evaluation & Engineering, vol. 12, No. 2, Apr. 2009, pp. 311-317.
Maxwell et al., Monitoring Steam Injection Deformation Using Microseismicity and Tiltmeters, ARMA 08-335, The 42nd U.S. Rock Mechanics Symposium (USRMS), Jun. 29-Jul. 2, 2008 , San Francisco, CA, 8 pages.
Maxwell et al., Seismic Velocity Model Calibration Using Dual Monitoring Well Data, SPE 119596, SPE Hydraulic Fracturing Technology Conference, Jan. 19-21, 2009, The Woodlands, Texas, 10 pages.
Maxwell, S.C., "Simulation of Microseismic Deformation During Hydraulic Fracturing", GeoConvention 2013, 2013, Integration, 4 pages.
Maxwell, S.C., Waltman, C.K., Warpinski, N.R., Mayerhofer, M.J., and Boroumand, N. 2006. Imaging Seismic Deformation Associated with Hydraulic Fracture Complexity, SPE 102801 Annual Technical Conference and Exhibition, San Antonio, Texas, U.S.A., Sep. 24-27, 2006, 6 pages.
Napier, J., & Backers, T., "Comparison of Numerical and Physical Models for Understanding Shear Fracture Processes", Pure and Applied Geophysics, 2006, No. 163, pp. 1153-1174.
Neuhaus et al., Analysis of Surface and Downhole Microseismic Monitoring Coupled with Hydraulic Fracture Modeling in the Woodford Shale, SPE 154804, SPE Europec/EAGE Annual Conference, Jun. 4-7, 2012, Copenhagen, Denmark, 21 pages.
Olsen, J.E., et al., "Modeling Simultaneous Growth of Multiple Hydraulic Fractures and Their Interaction With Natural Fractures", SPE 119739, Society of Petroleum Engineers, Jan. 2009, 7 pages.
Osorio et al., Correlation Between Microseismicity and Reservoir Dynamics in a Tectonically Active Area of Colombia, SPE 115715, SPE Annual Technical Conference and Exhibition, Sep. 21-24, 2008, Denver, Colorado, USA, 14 pages.
Prince et al., Identifying Stress Transfer in CSS Reservoir Operations Through Integrated Microseismic Solutions, SPE Middle East Oil and Gas Show and Conference, Sep. 25-28, 2011, Manama, Bahrain, 7 pages.
Qui, Y., "Applying Curvature and Fracture Analysis to the Placement of Horizontal Wells: Example from the Mabee (San Andres) Resevoir, Texas", SPE 70010, Society of Petroleum Engineers, Inc., May 2001, 9 pages.

(56) References Cited

OTHER PUBLICATIONS

Sahimi, S., "New Models for Natural and Hydraulic Fracturing of Heterogeneous Rock", SPE 29648, Society of Petroleum Engineers, Inc., Mar. 1995, 16 pages.

Sayers, C.M., and J. LeCalvez, 2010, Characterization of Microseismic Data in Gas Shales Using the Radius of Gyration Tensor, SEG expanded abstract, 2010, SEG Denver 2010 Annual Meeting, pp. 2080-2084.

Shou et al., "A Higher Order Displacement Discontinuity Method for Three-dimensional Elastostatic Problems", Int. J. Rock Mech. Min. Sci.; vol. 34, No. 2, p. 317-322, 1997.

Sweby et al., High Resolution Seismic Monitoring at Mt Keith Open Pit Mine, Golden Rocks 2006, ARMA/USRMS 06-1159, The 41st U.S. Symposium on Rock Mechanics (USRMS), Jun. 17-21, 2006, Golden, CO, 6 pages.

Tezuka, K., et al., "Fractured Reservoir Characterization Incorporating Microseismic Monitoring and Pressure Analysis During Massive Hydraulic Injection", IPTC 12391, International Petroleum Technology Conference, Dec. 2008, 7 pages.

Urbancic et al., Long-term Assessment of Reservoir Integrity Utilizing Seismic Source Parameters as Recorded With Integrated Microseismic-pressure Arrays, 2011 SEG Annual Meeting, Sep. 18-23, 2011, San Antonio, Texas, pp. 1529-1533.

Warpinski, "Integrating Microseismic Monitoring With Well Completions, Reservoir Behavior, and Rock Mechanics", SPE 125239, SPE Tight Gas Completions Conference, San Antonio, Jun. 15-17, 2009, 13 pages.

Will, R., "Integration of Seismic Anisotrophy and Reservoir Performance Data for Characterization of Naturally Fractured Reservoirs Using Discrete Feature Network Models", SPE 84412, Society of Petroleum Engineers, Inc., Oct. 2003, 12 pages.

Xu, W, et al., "Characterization of Hydraulically-Induced Shale Fracture Network Using an Analytical/Semu-Analytical Model", SPE 124697, Society of Petroleum Engineers, Oct. 2009, 7 pages.

Extended European Search Report issued in European Patent Appl. No. 16769390.2 dated Dec. 7, 2018; 6 pages.

FIG.1.1

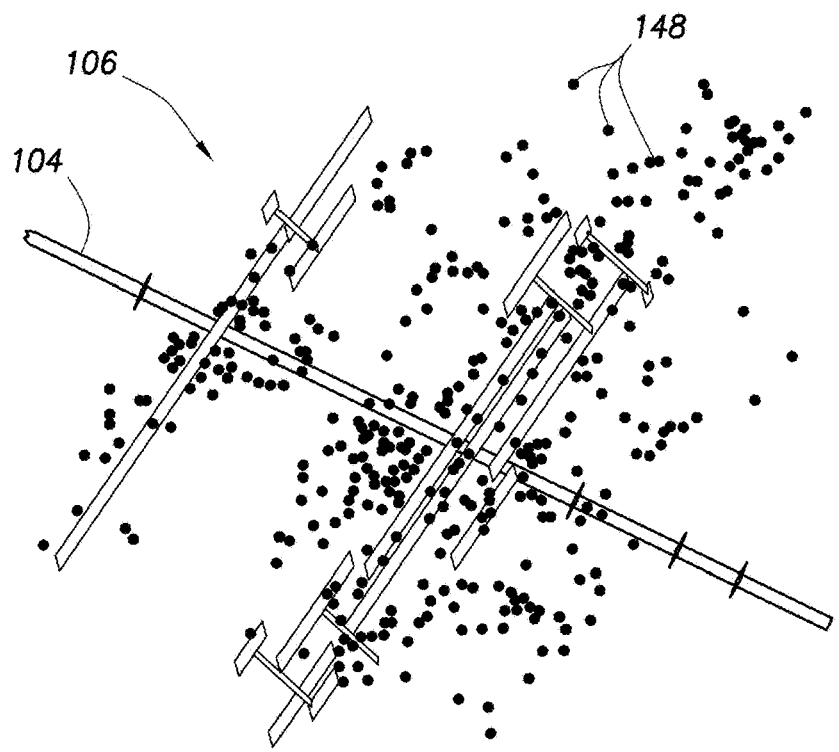
FIG.1.2
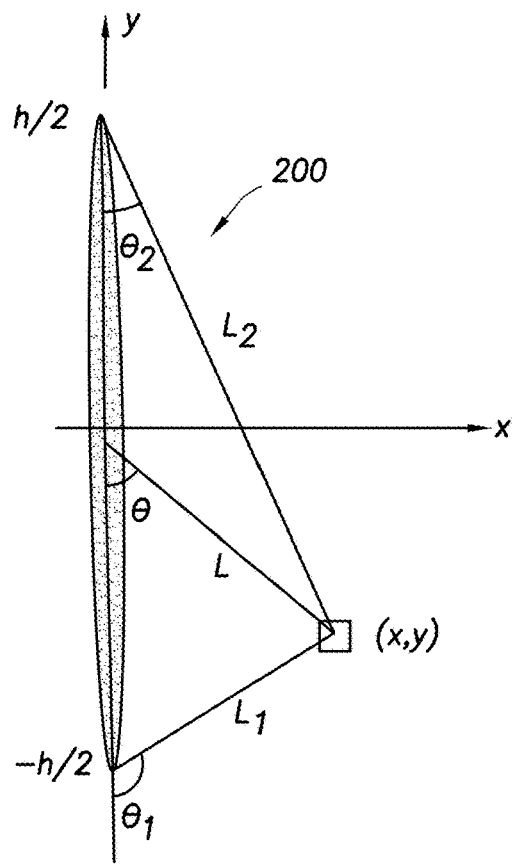
FIG.2

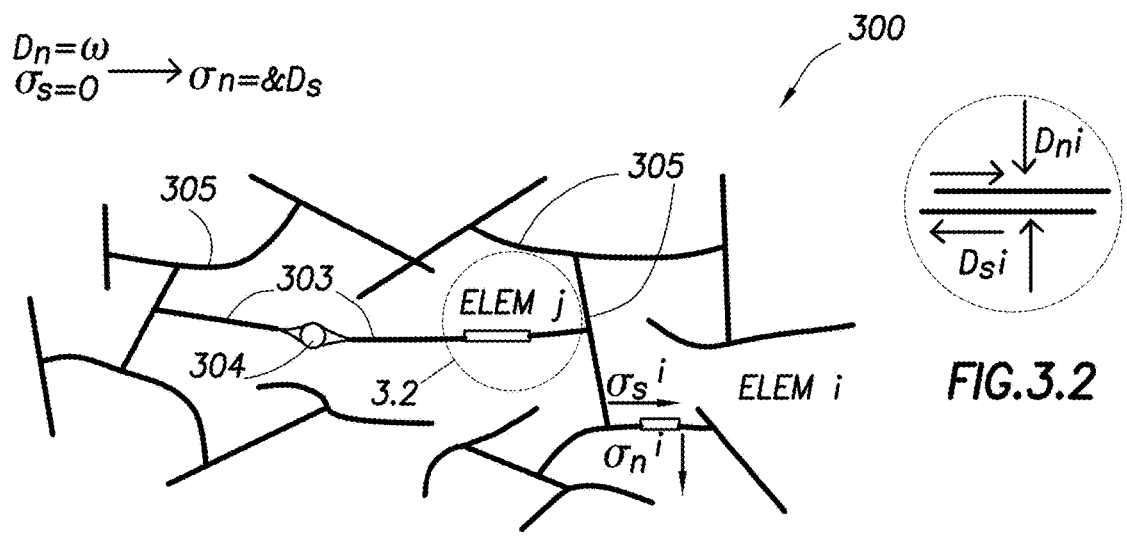
FIG.3.1
FIG.3.2
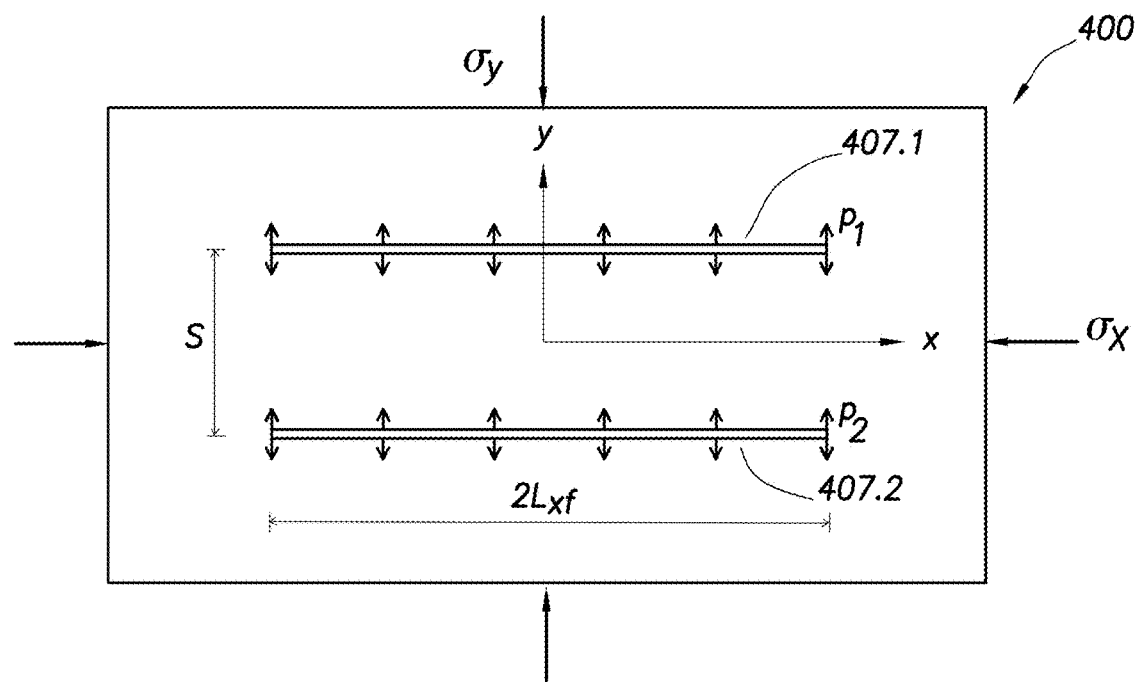
FIG.4

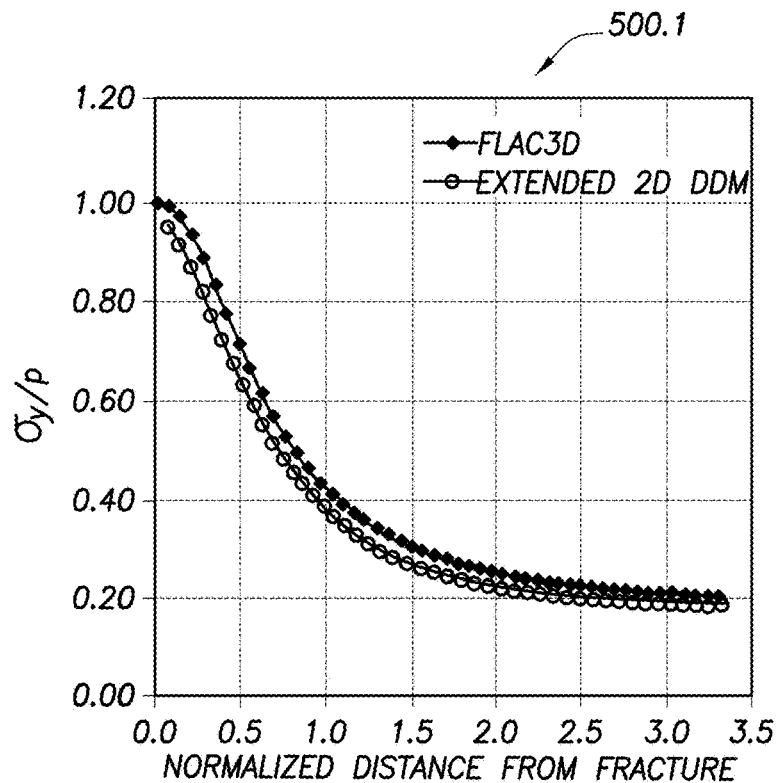
FIG.5.1
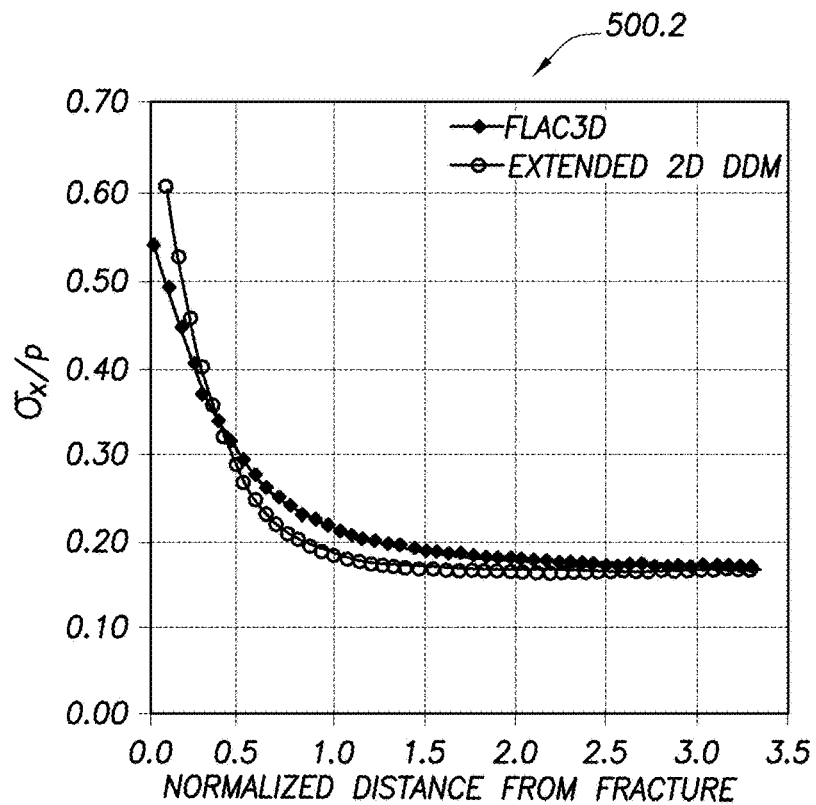
FIG.5.2

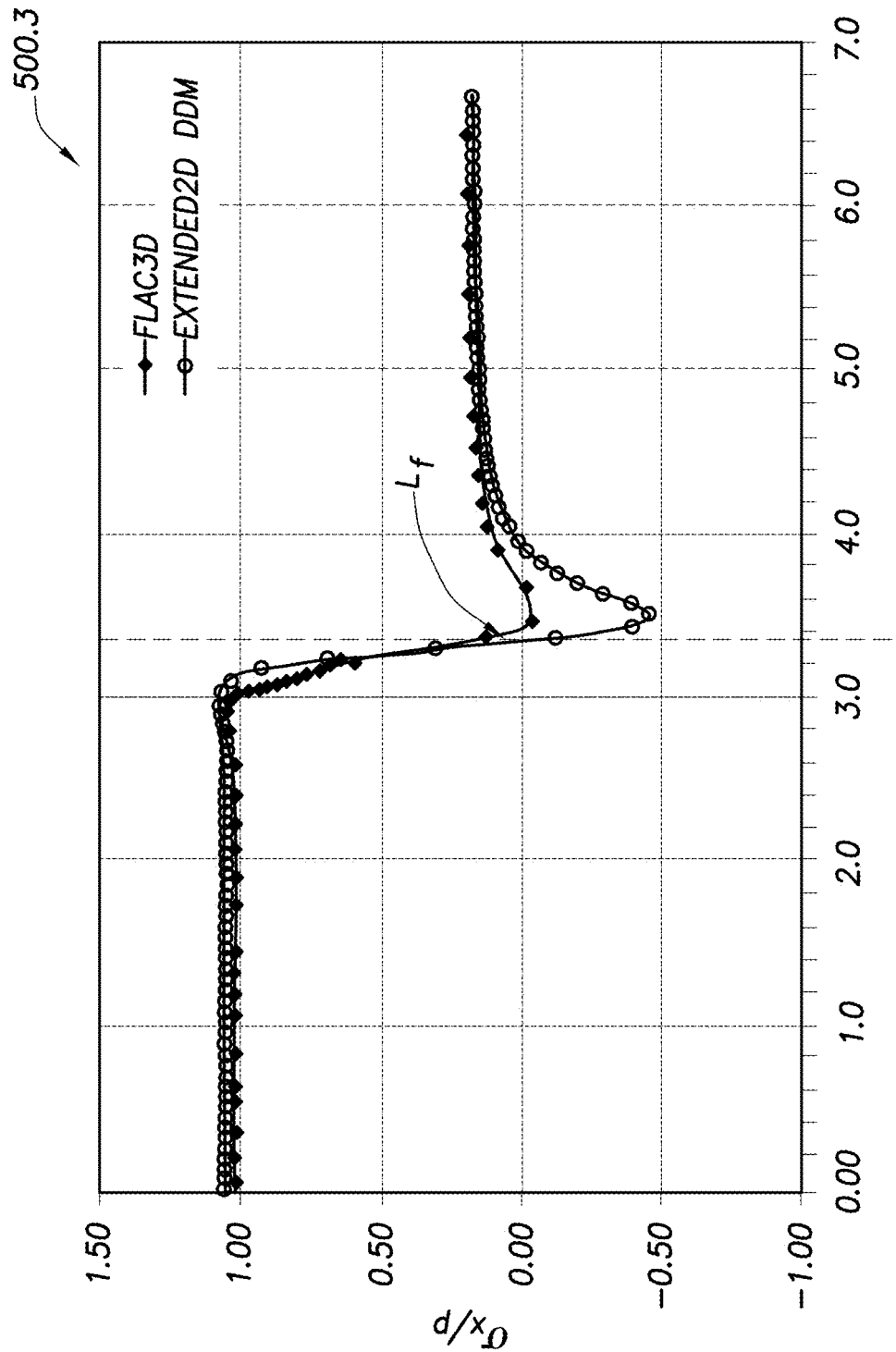
FIG.5.3

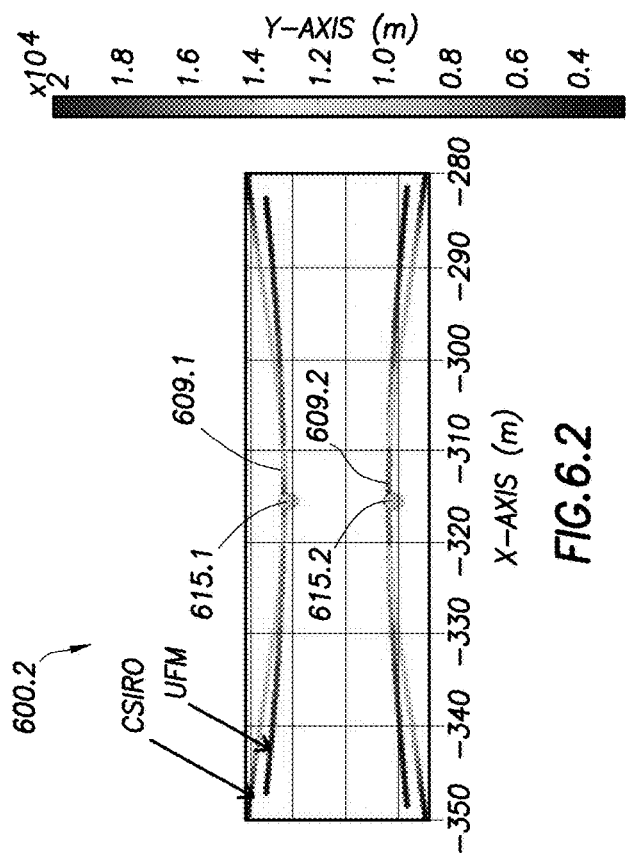
FIG.6.2
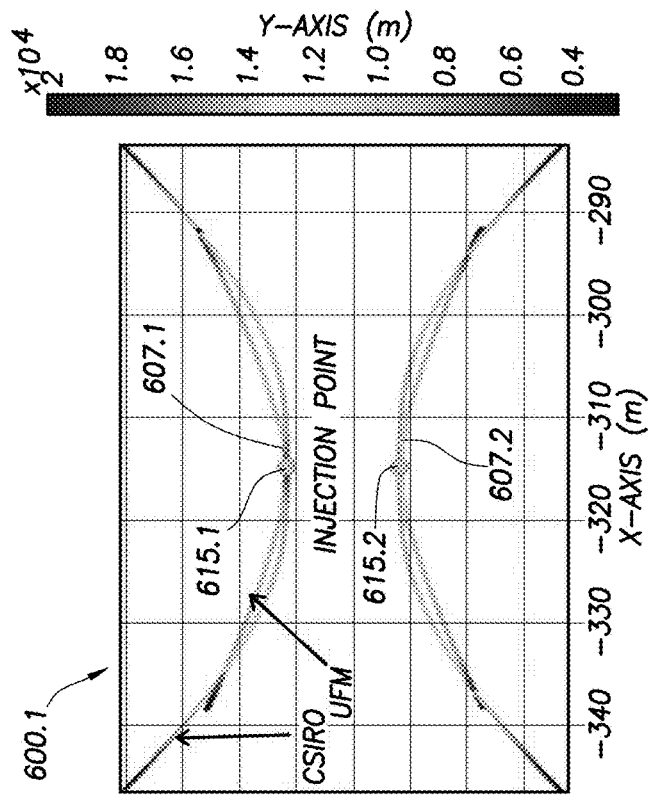
FIG.6.1

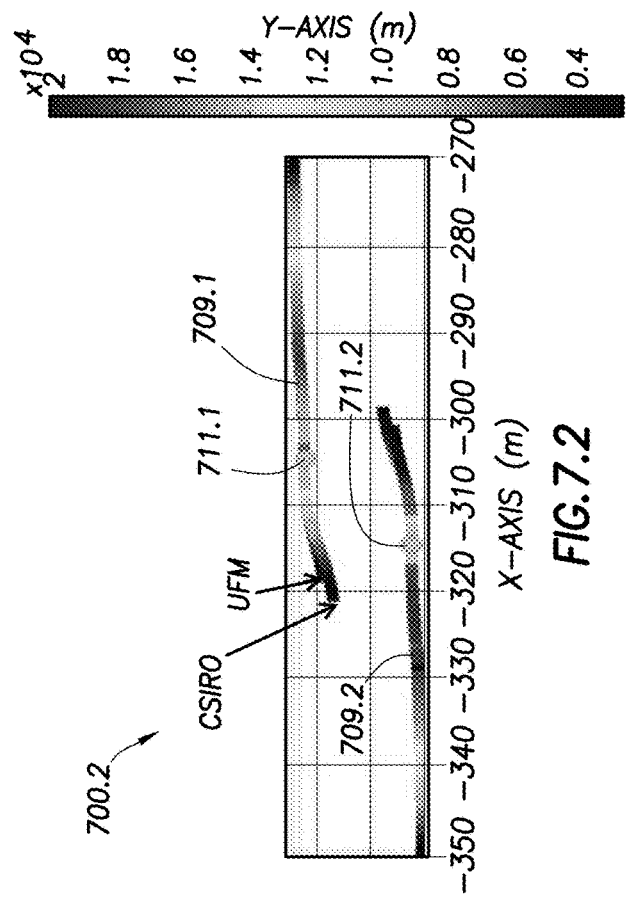
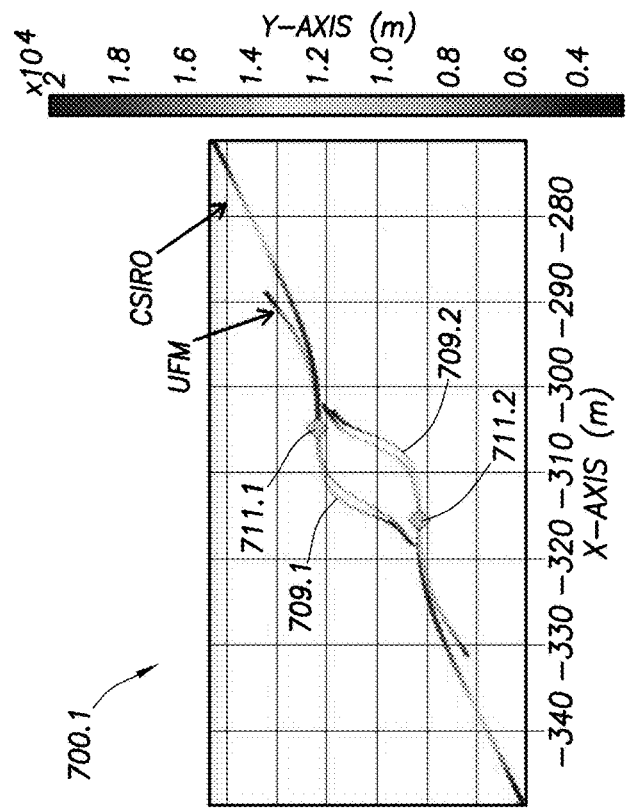
FIG.7.2
FIG.7.1

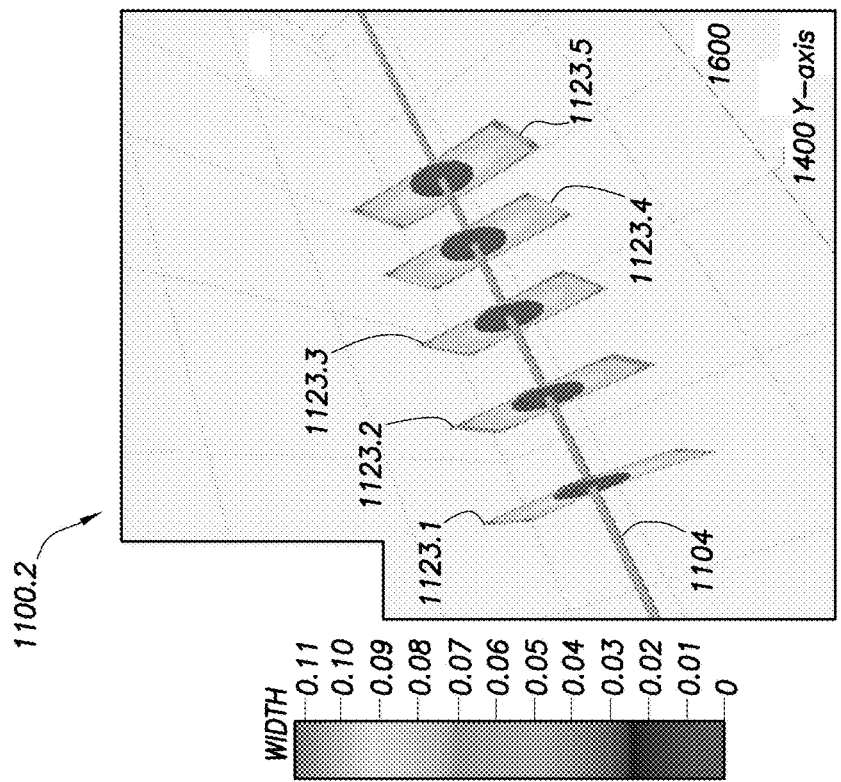
FIG.11.2
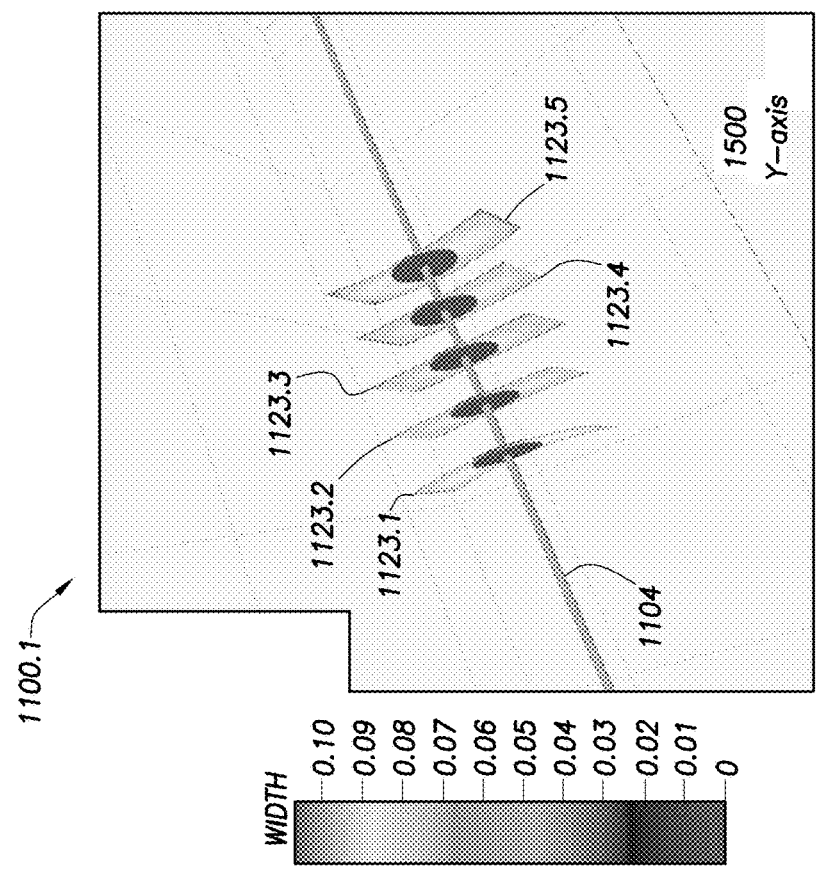
FIG.11.1

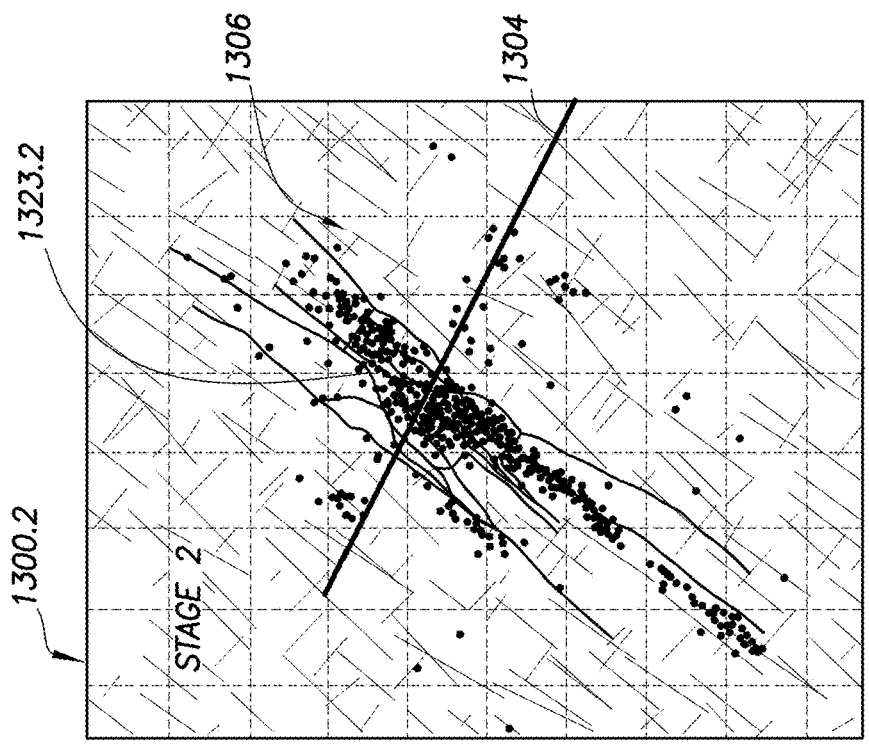
FIG.13.2
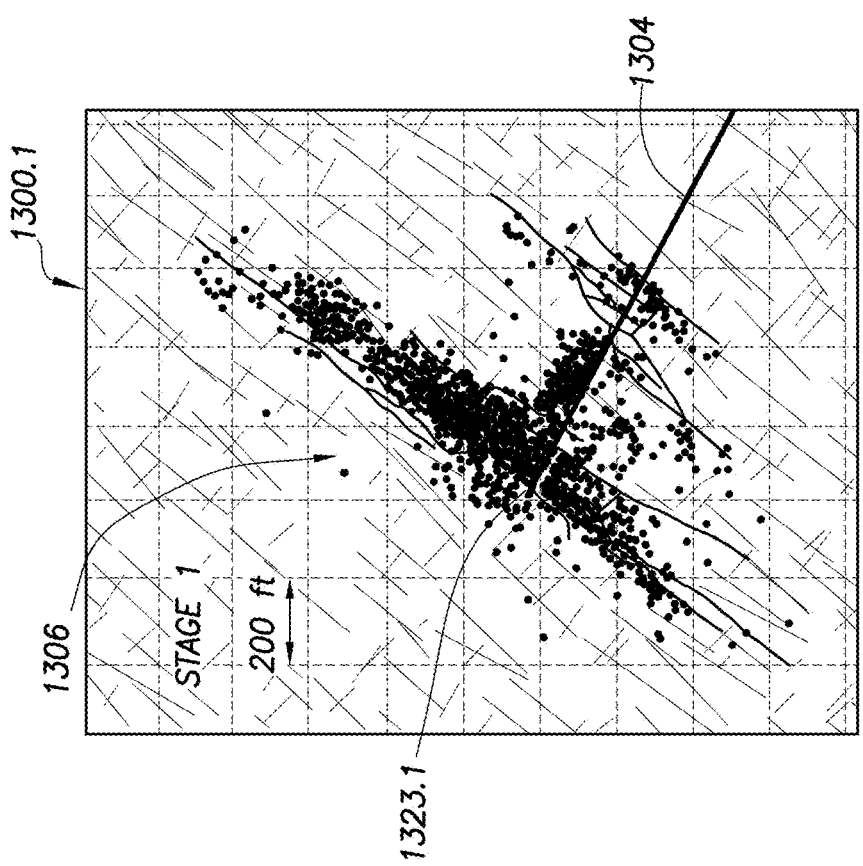
FIG.13.1

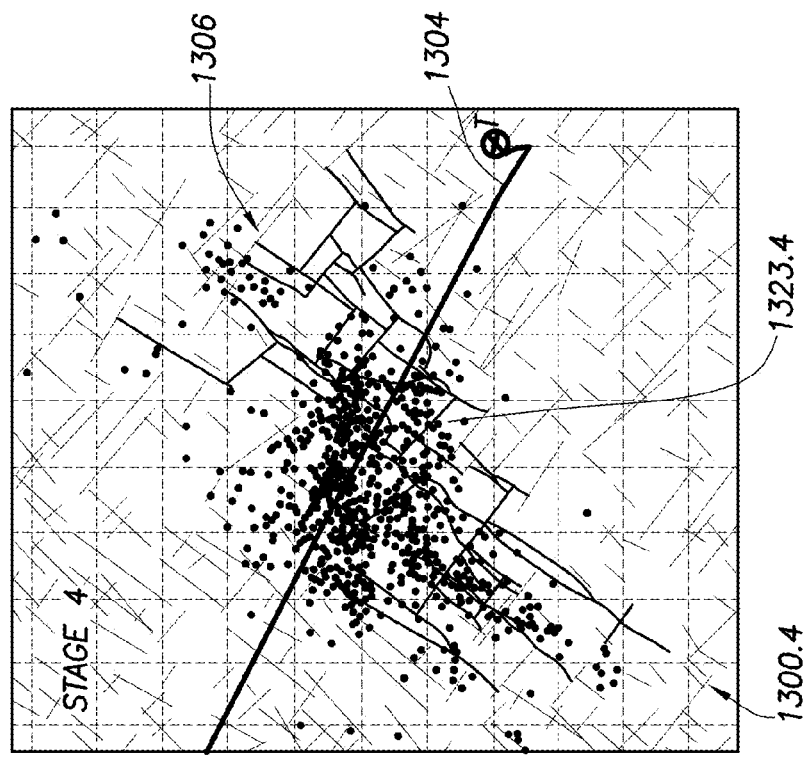
FIG.13.4
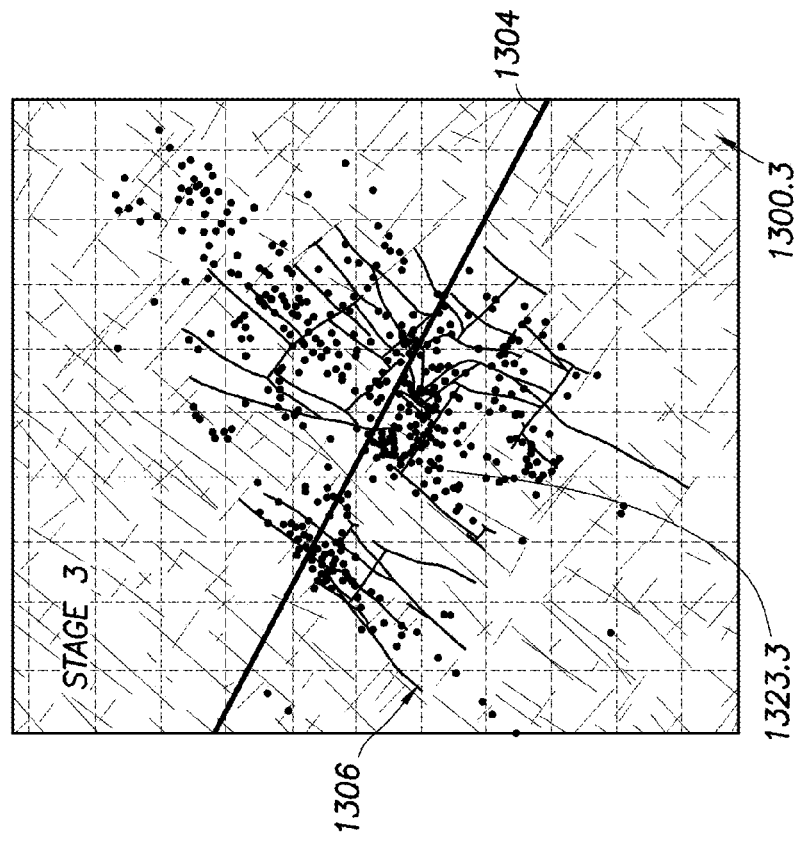
FIG.13.3

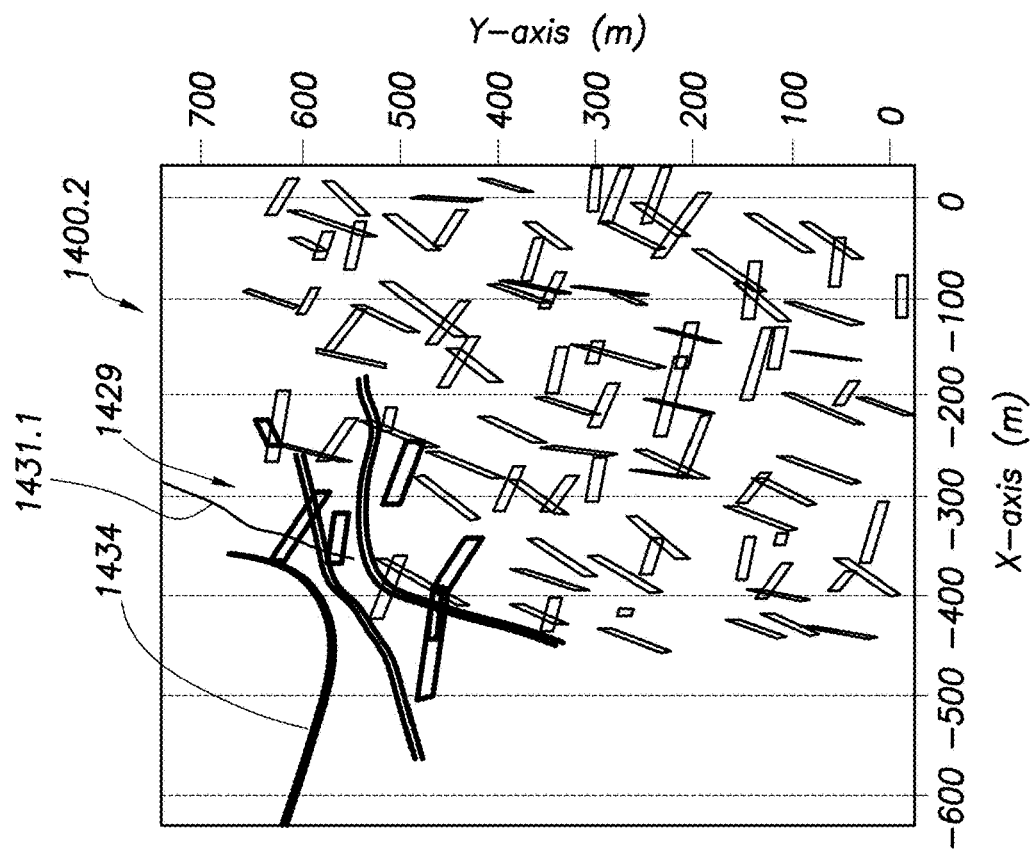
FIG.14.2
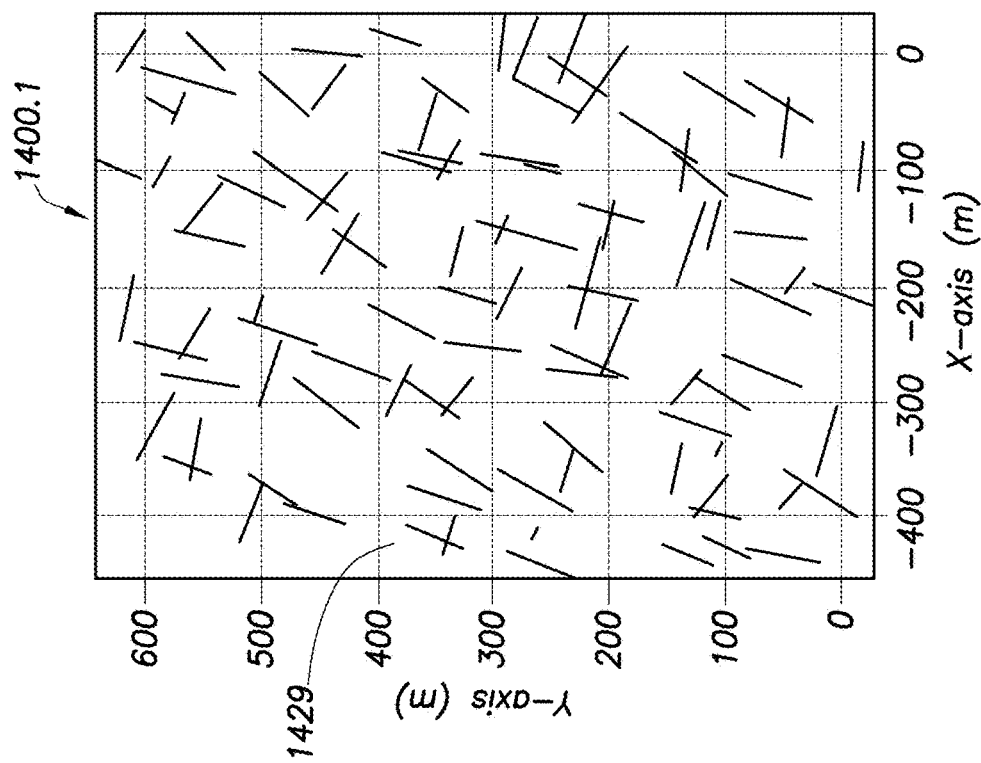
FIG.14.1

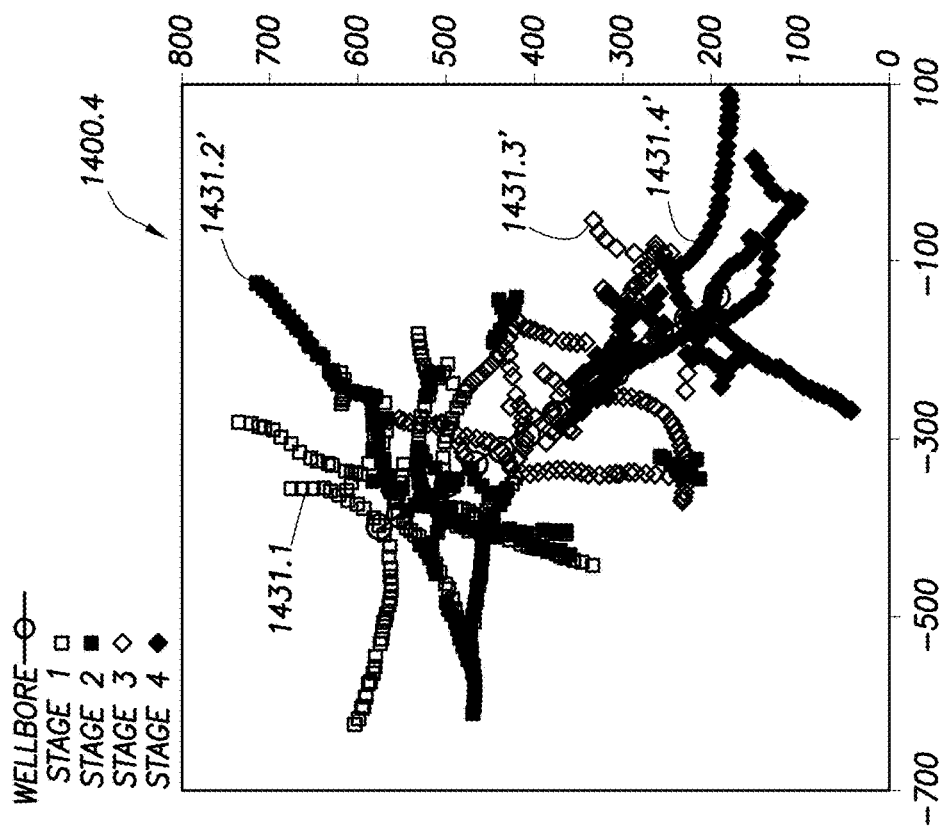
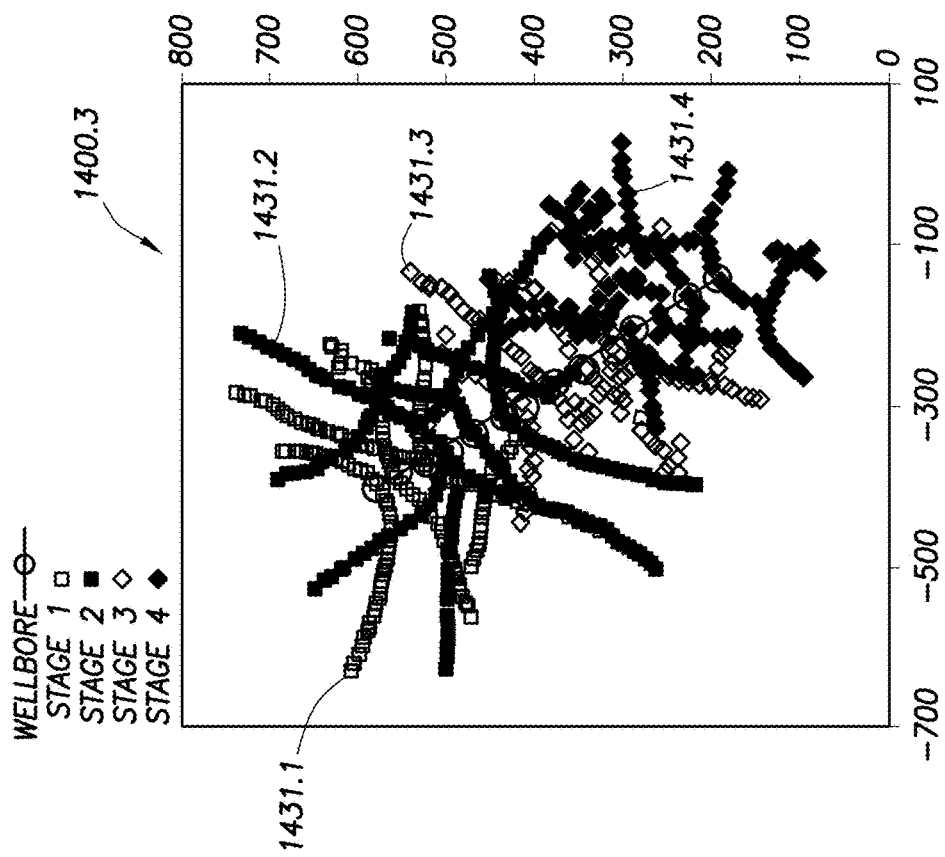
FIG. 14.4
FIG. 14.3

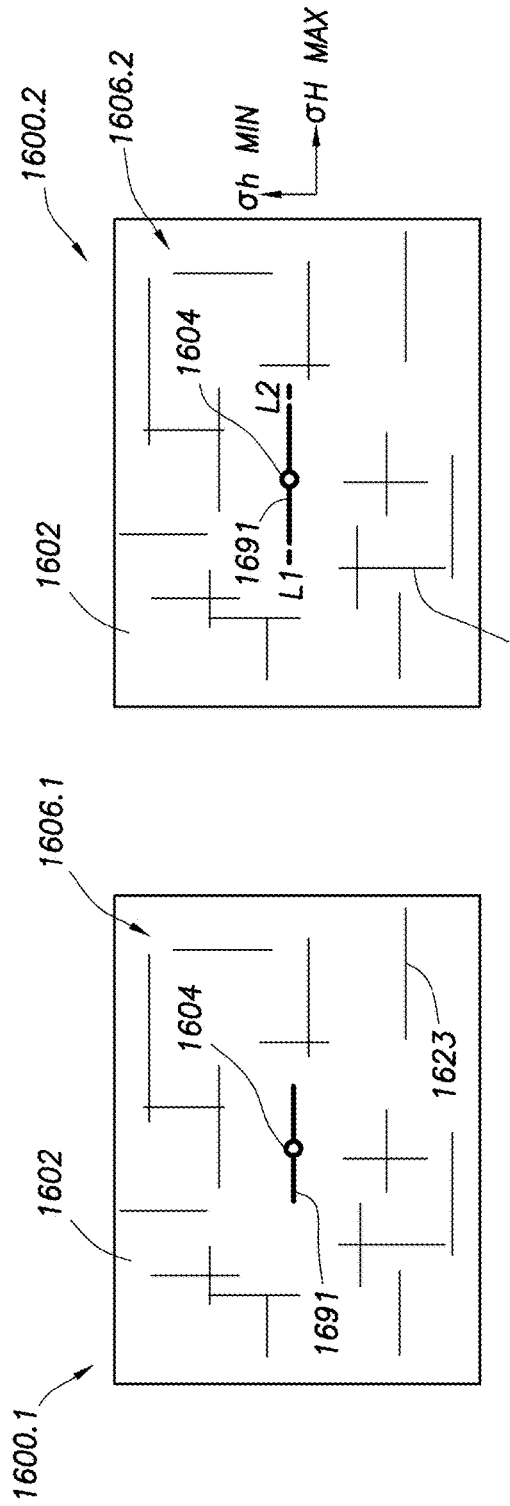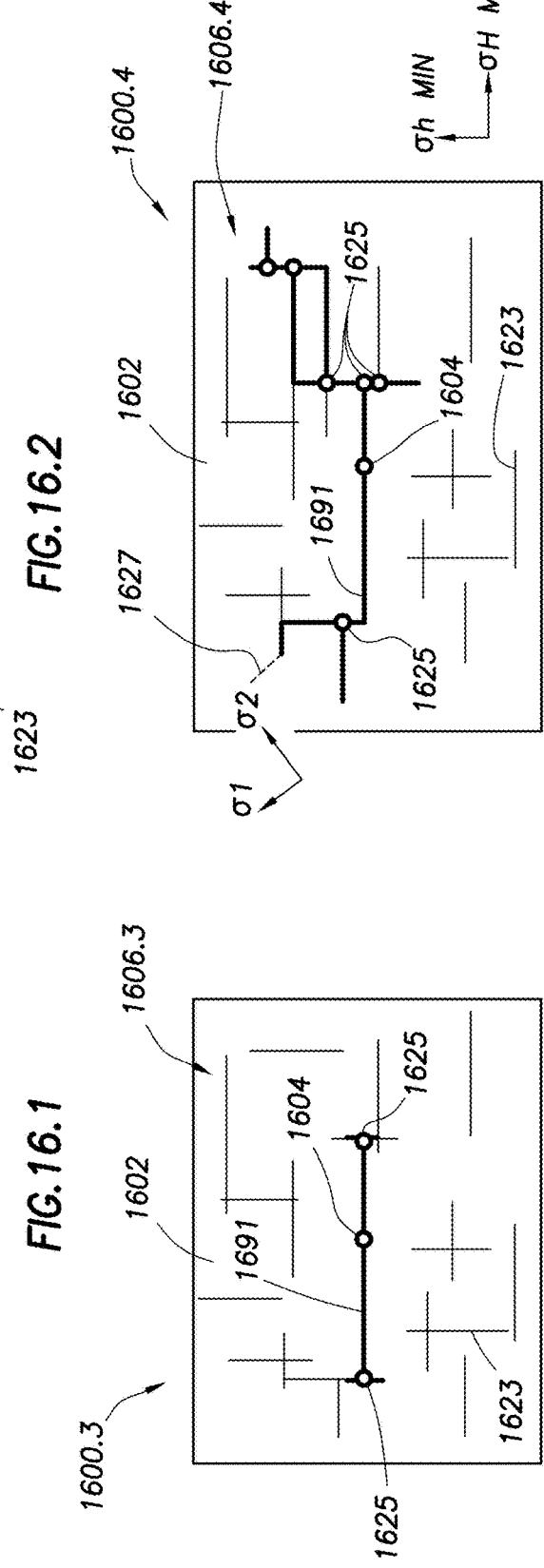

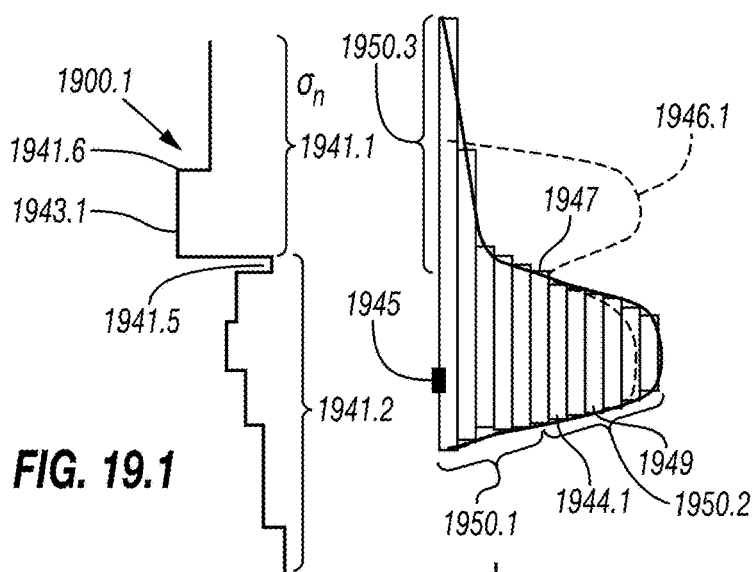
FIG. 19.1
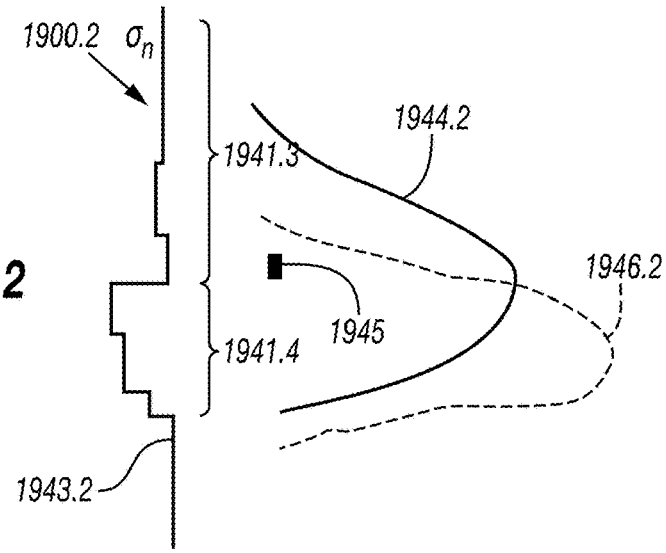
FIG. 19.2
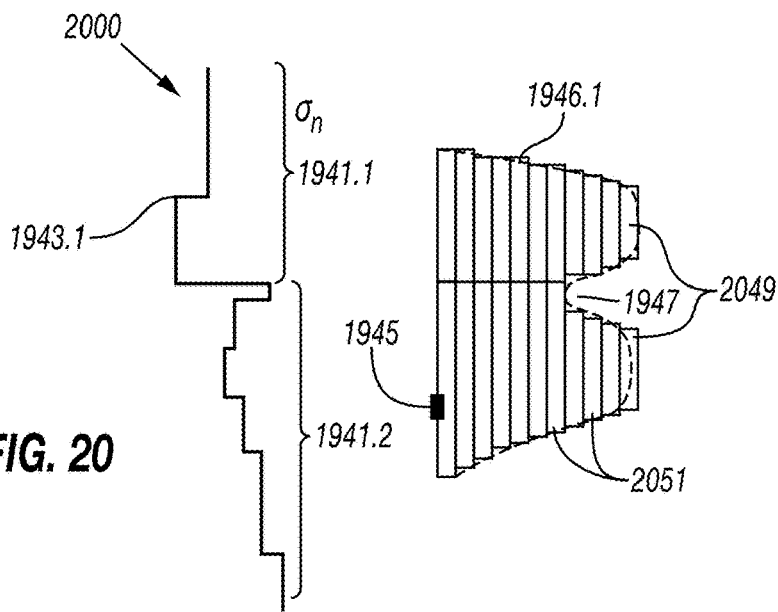
FIG. 20

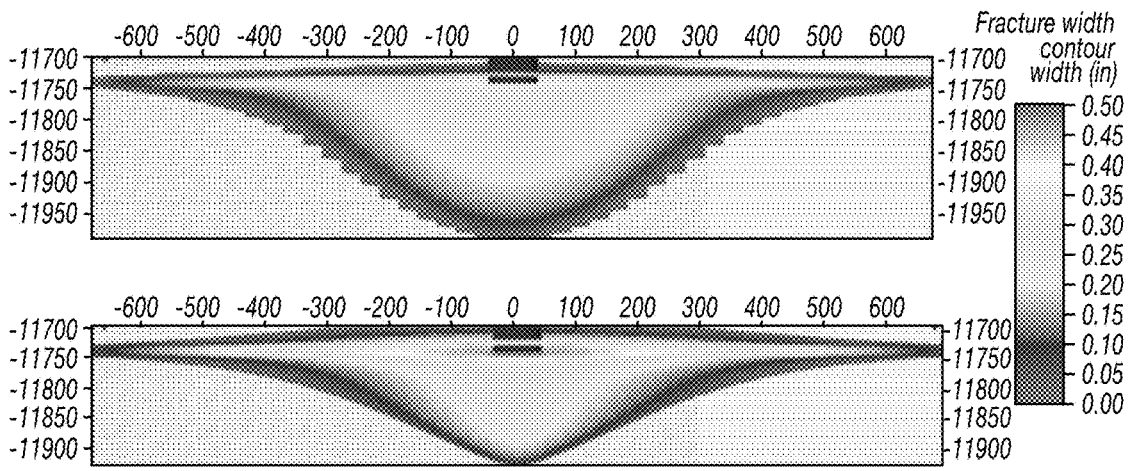
FIG. 25.1
FIG. 25.2
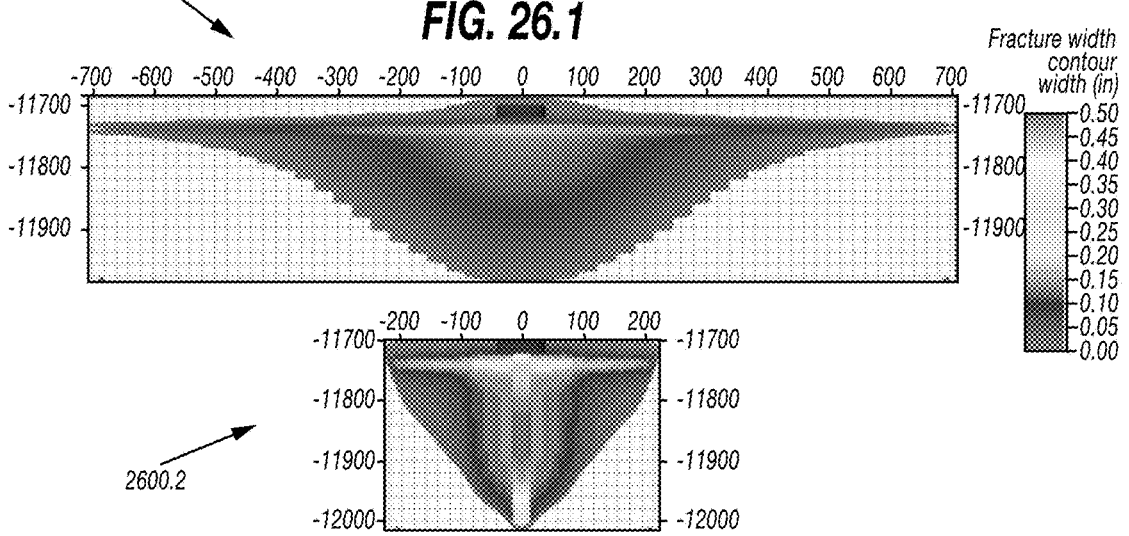
FIG. 26.1
FIG. 26.2
FIG. 27

FIG. 28.1
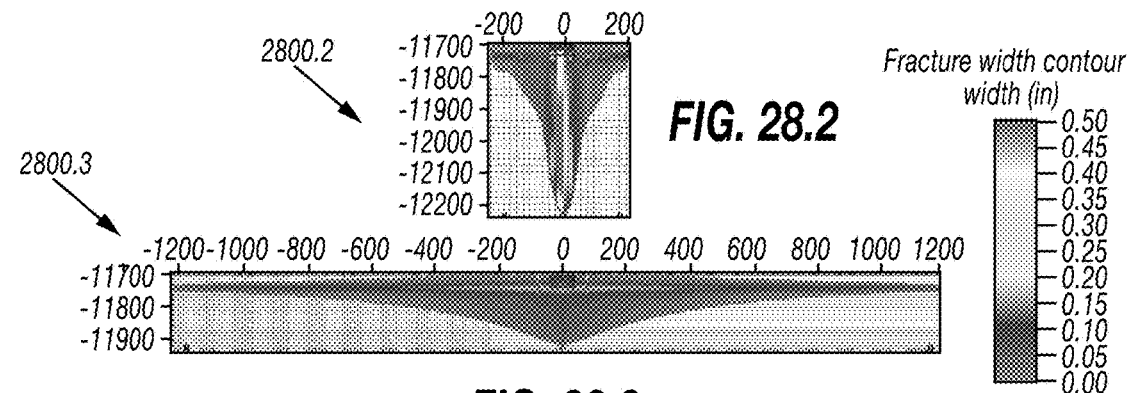
FIG. 28.2
FIG. 28.3
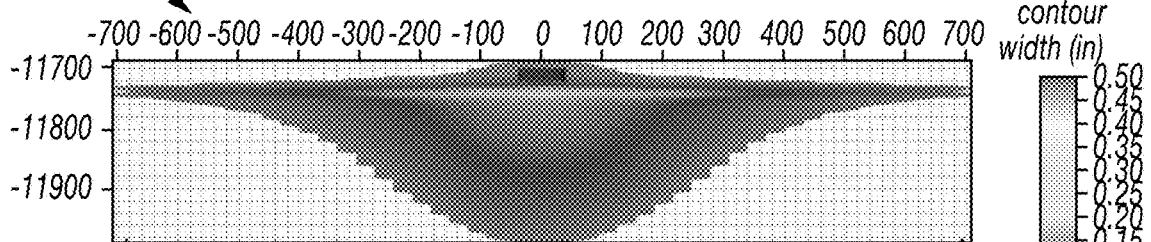
FIG. 29.1
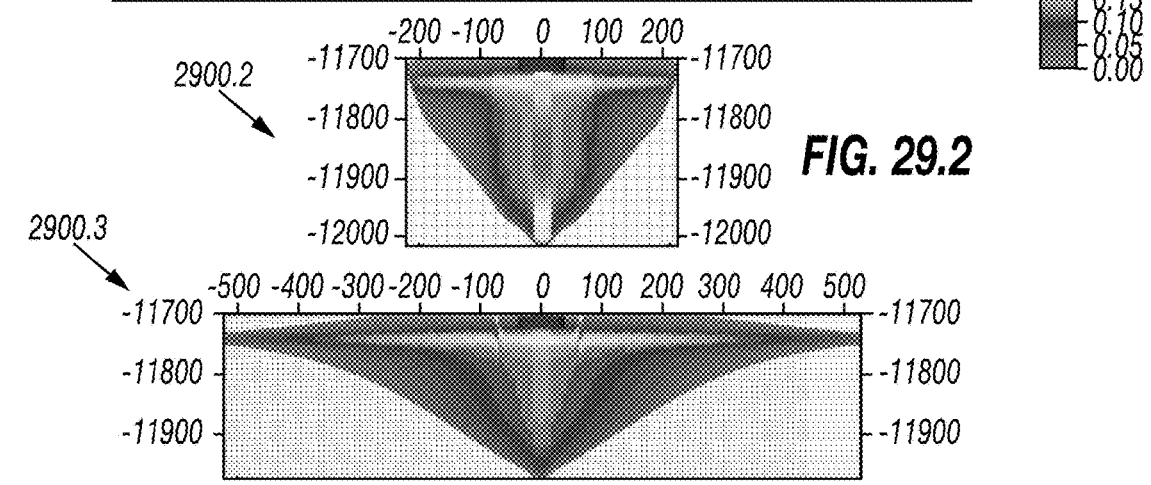
FIG. 29.2
FIG. 29.3

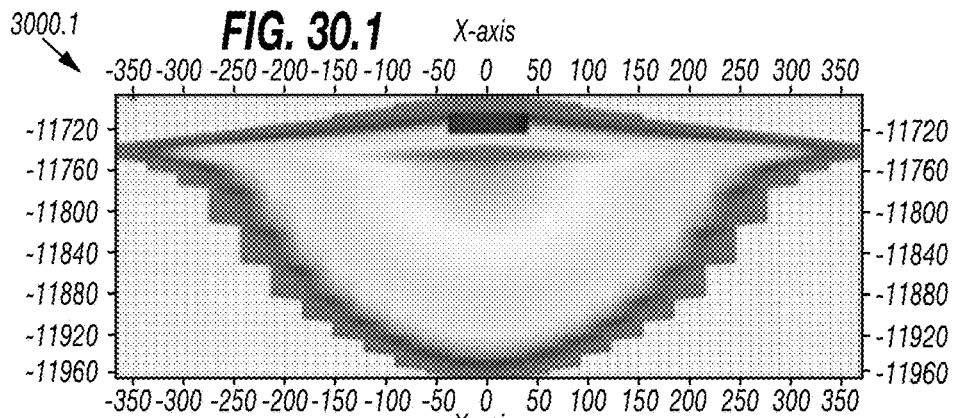
FIG. 30.1
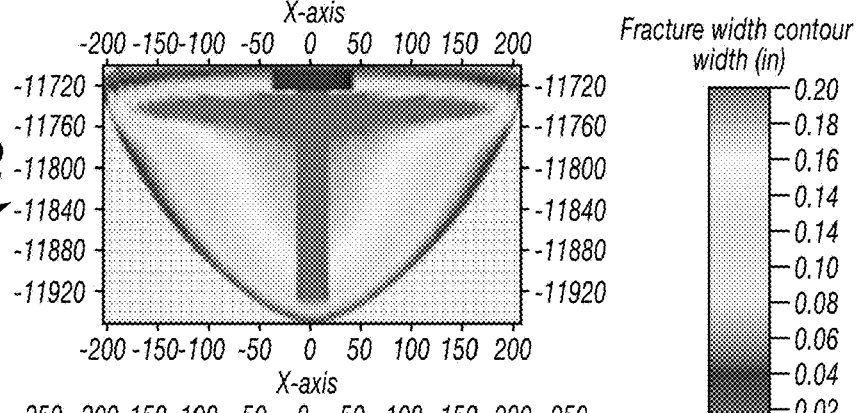
FIG. 30.2
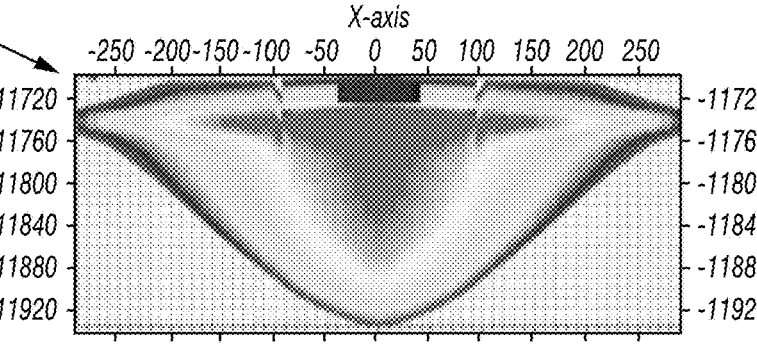
FIG. 30.3
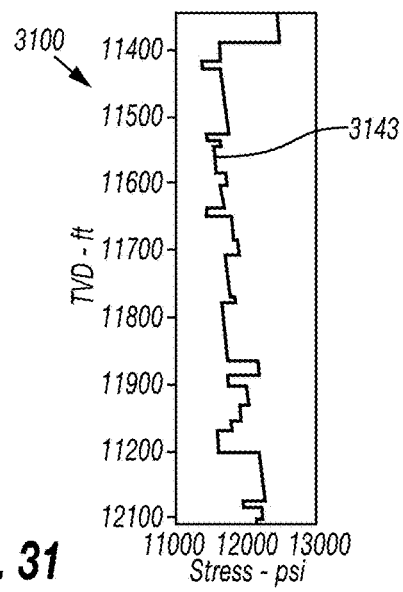
FIG. 31

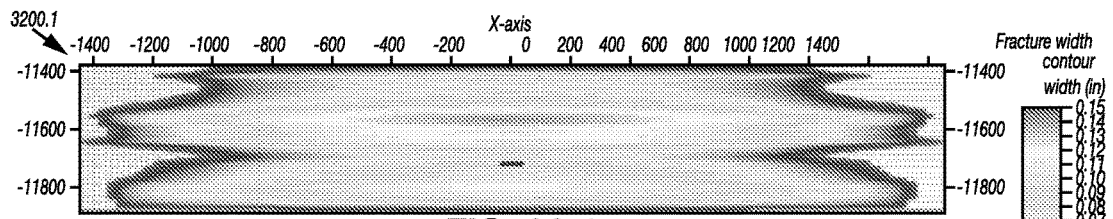
FIG. 32.1
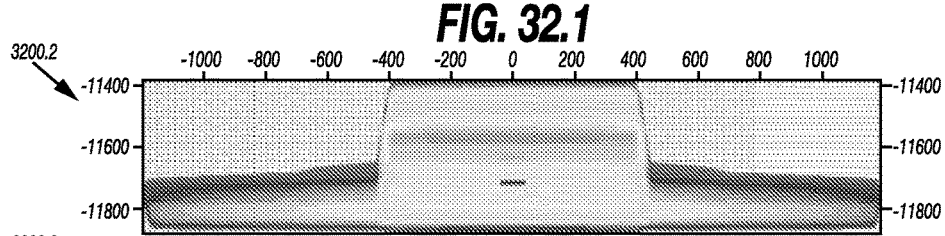
FIG. 32.2
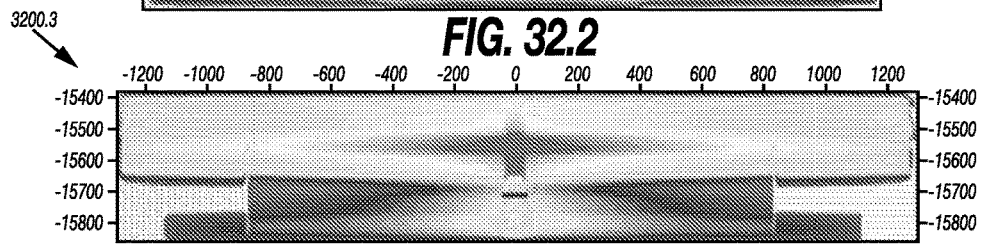
FIG. 32.3
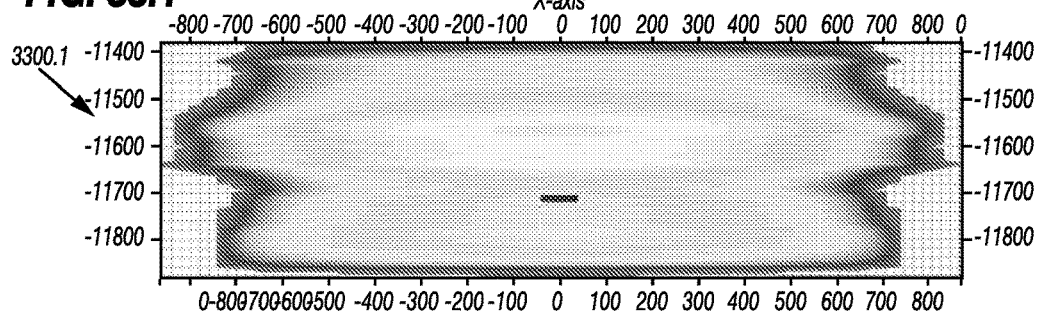
FIG. 33.1
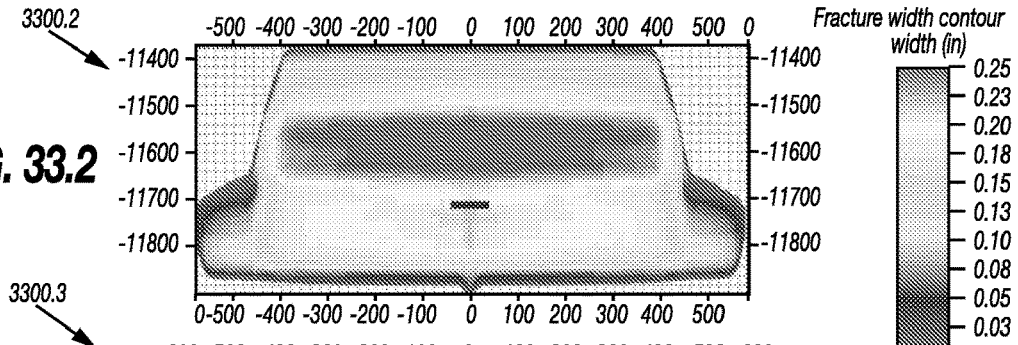
FIG. 33.2
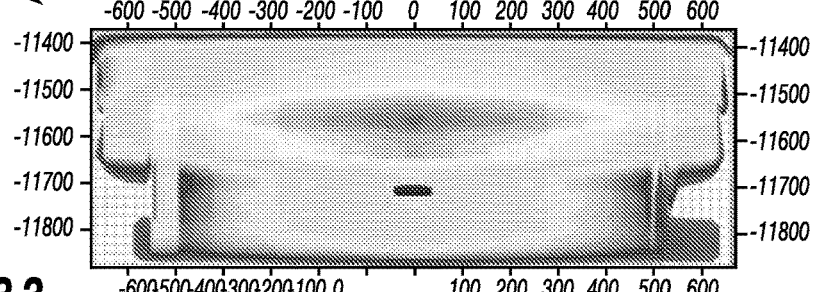
FIG. 33.3

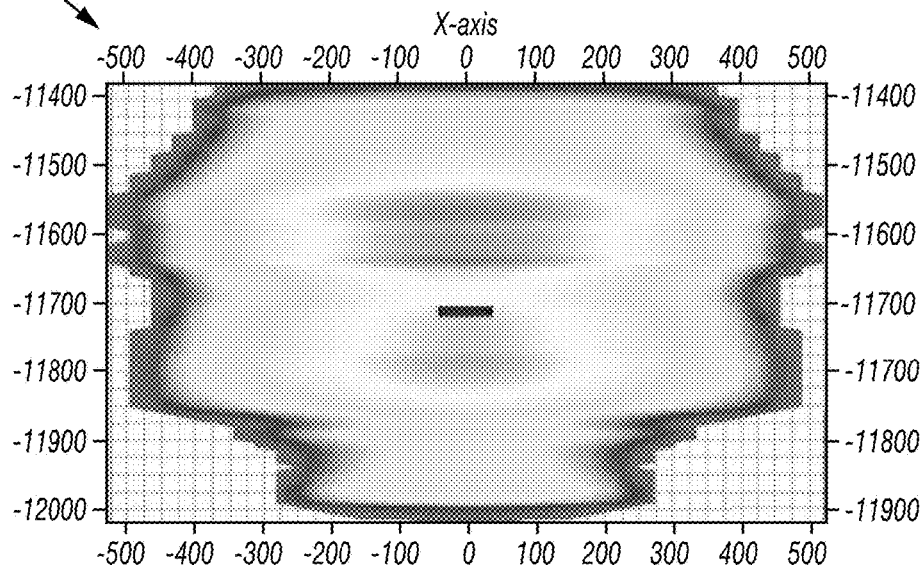
FIG. 34.1
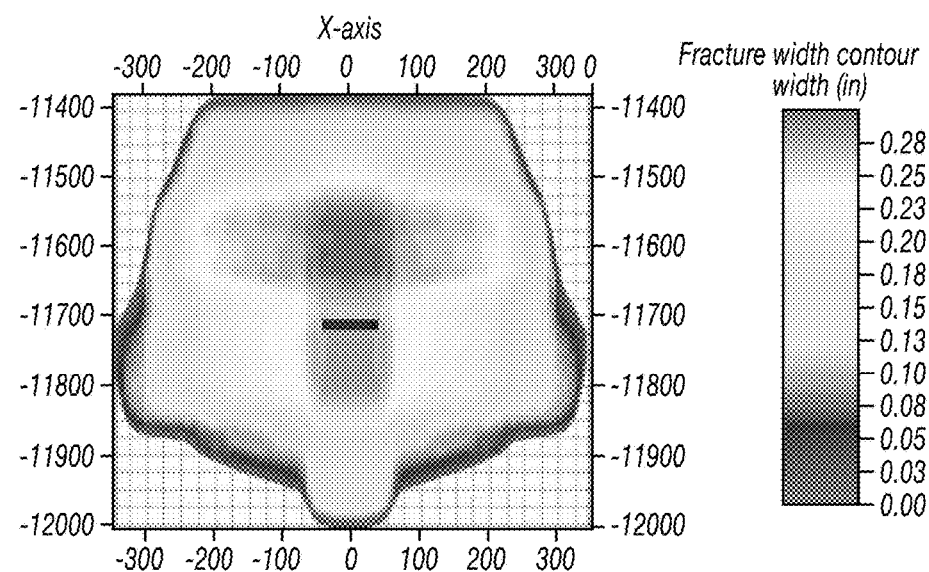
FIG. 34.2
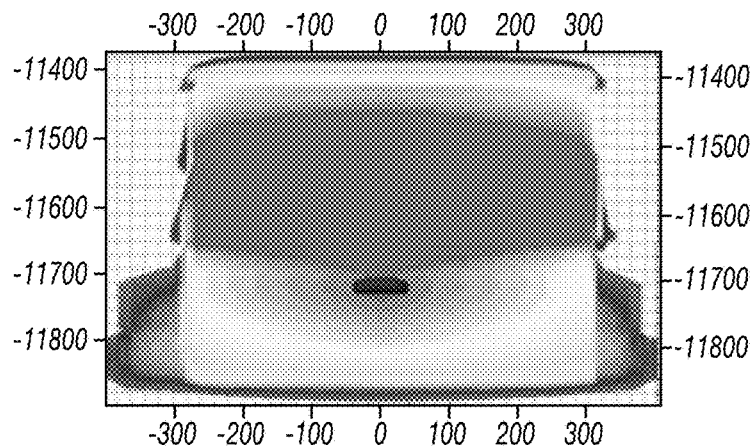
FIG. 34.3

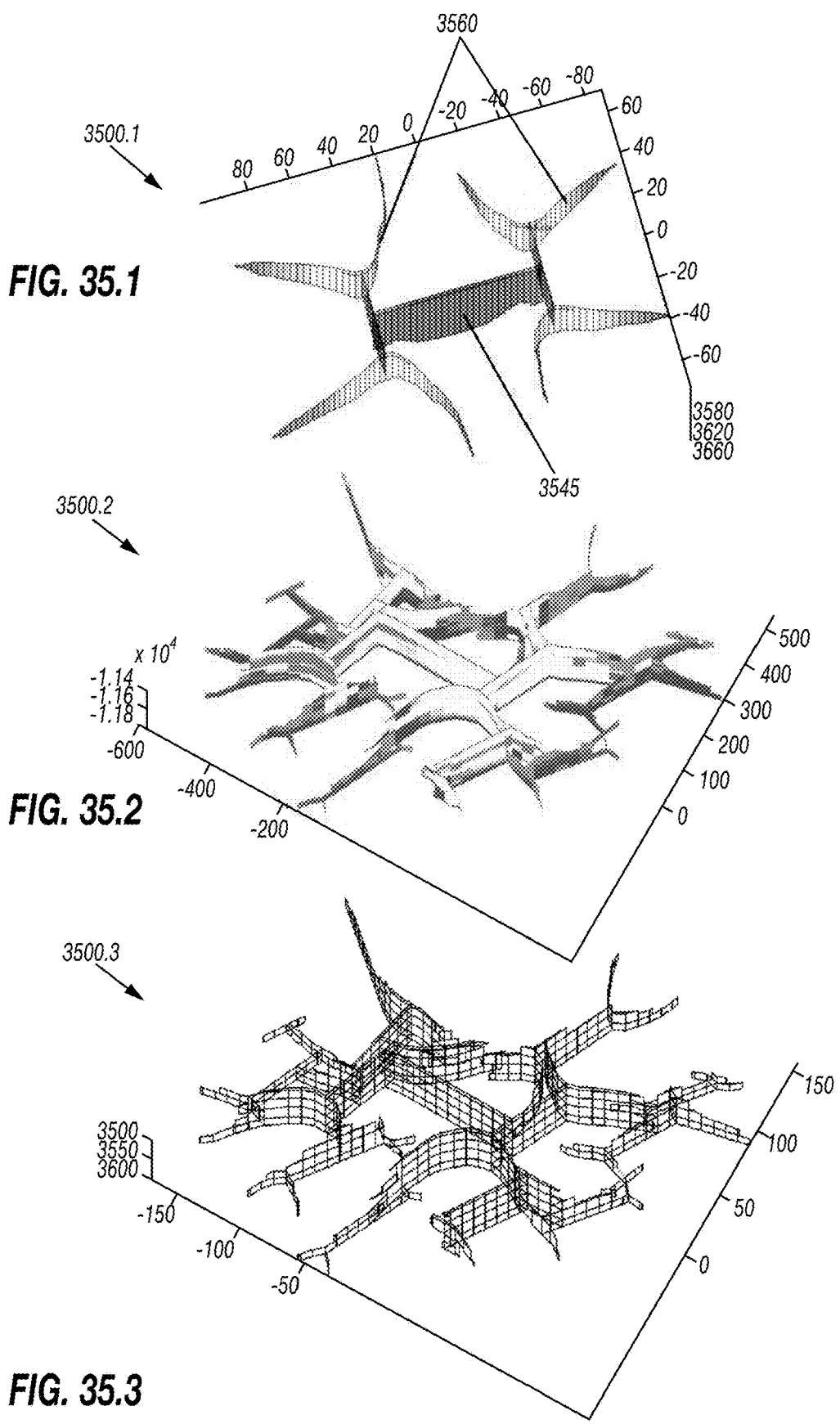
FIG. 35.1
FIG. 35.2
FIG. 35.3

STACKED HEIGHT GROWTH FRACTURE MODELING

CROSS-REFERENCE TO RELATED APPLICATIONS

The application is a continuation in part of U.S. patent application Ser. No. 14/356,369, filed on Nov. 2, 2012 which claims the benefit of U.S. Provisional Application No. 61/628,690, filed on Nov. 4, 2011. The application also claims priority to PCT Application No. PCT/US2012/063340, filed on Nov. 2, 2012. The entire contents of all three applications are hereby incorporated by reference herein.

BACKGROUND

The present disclosure relates generally to methods and systems for performing wellsite operations. More particularly, this disclosure is directed to methods and systems for performing fracture operations, such as investigating subterranean formations and characterizing hydraulic fracture networks in a subterranean formation.

In order to facilitate the recovery of hydrocarbons from oil and gas wells, the subterranean formations surrounding such wells can be hydraulically fractured. Hydraulic fracturing may be used to create cracks in subsurface formations to allow oil or gas to move toward the well. A formation is fractured by introducing a specially engineered fluid (referred to as "fracturing fluid" or "fracturing slurry" herein) at high pressure and high flow rates into the formation through one or more wellbores. Hydraulic fractures may extend away from the wellbore hundreds of feet in two opposing directions according to the natural stresses within the formation. Under certain circumstances, they may form a complex fracture network.

Current hydraulic fracture monitoring methods and systems may map where the fractures occur and the extent of the fractures. Some methods and systems of microseismic monitoring may process seismic event locations by mapping seismic arrival times and polarization information into three-dimensional space through the use of modeled travel times and/or ray paths. These methods and systems can be used to infer hydraulic fracture propagation over time.

Patterns of hydraulic fractures created by the fracturing stimulation may be complex and may form a fracture network as indicated by a distribution of associated microseismic events. Complex hydraulic fracture networks have been developed to represent the created hydraulic fractures. Examples of fracture models are provided in U.S. Pat. Nos. 6,101,447, 7,363,162, 7,509,245, 7,788,074, 8,428,923, 8,412,500, 8,571,843, 20080133186, 20100138196, and 20100250215, and PCT Application Nos. WO2013/067363, PCT/US2012/48871 and US2008/0183451, and PCT/US2012/059774, the entire contents of which are hereby incorporated by reference herein.

SUMMARY

In at least one aspect, the present disclosure relates to a method of performing a fracture operation at a wellsite. The wellsite is positioned about a subterranean formation having a wellbore therethrough and a fracture network therein. The fracture network comprises natural fractures. The wellsite is stimulated by injection of an injection fluid with proppant into the fracture network. The method involves obtaining wellsite data comprising natural fracture parameters of the natural fractures and obtaining a mechanical earth model of the subterranean formation, and generating a hydraulic fracture growth pattern for the fracture network over time. The generating comprises representing hydraulic fractures as vertically stacked elements, extending the represented hydraulic fractures laterally from the wellbore and into the subterranean formation to form a hydraulic fracture network comprising the natural fractures and the hydraulic fractures by adding new elements to the vertically stacked elements over time, determining hydraulic fracture parameters of the represented hydraulic fractures, determining transport parameters for the proppant passing through the hydraulic fracture network, deriving an estimated fracture tip velocity from a pressure and a stress profile of the formation, extending a height of the vertically stacked elements and the new elements over time based on the derived estimated fracture tip velocity to form extended vertically stacked elements, and if a zone property change is encountered during the extending the height, then generating another stack of the vertically stacked elements in the zones of property change by splitting at least a portion of the extended vertically stacked elements.

In another aspect, the disclosure relates to performing stress shadowing on the hydraulic fractures to determine stress interference between the hydraulic fractures, and repeating the generating based on the determined stress interference.

In another aspect, the present disclosure relates to stimulating the wellsite by injection of an injection fluid with proppant into the fracture network, and obtaining wellsite data comprising natural fracture parameters of the natural fractures and obtaining a mechanical earth model of the subterranean formation.

This summary is provided to introduce a selection of concepts that are further described below in the detailed description. This summary is not intended to identify key or essential features of the claimed subject matter, nor is it intended to be used as an aid in limiting the scope of the claimed subject matter.

BRIEF DESCRIPTION OF THE DRAWINGS

Embodiments of the system and method for generating a hydraulic fracture growth pattern are described with reference to the following figures. The same numbers are used throughout the figures to reference like features and components.

FIG. 1.2 is a schematic illustration of a hydraulic fracture site with microseismic events depicted thereon;

FIG. 2 is a schematic illustration of a 2D fracture;

FIGS. 3.1 and 3.2 are schematic illustrations of a stress shadow effect;

FIG. 4 is a schematic illustration comparing 2D DDM and Flac3D for two parallel straight fractures;

FIGS. 5.1-5.3 are graphs illustrating 2D DDM and Flac3D of extended fractures for stresses in various positions;

FIGS. 6.1-6.2 are graphs depicting propagation paths for two initially parallel fractures in isotropic and anisotropic stress fields, respectively;

FIGS. 7.1-7.2 are graphs depicting propagation paths for two initially offset fractures in isotropic and anisotropic stress fields, respectively;

FIGS. 11.1-11.2 are schematic diagrams depicting fracture geometry for a high perforation friction case and a large fracture spacing case, respectively;

FIGS. 13.1-13.4 are schematic diagrams illustrating a simulated fracture network compared to the microseismic measurements for stages 1-4, respectively;

FIGS. 14.1-14.4 are schematic diagrams depicting a distributed fracture network at various stages;

FIGS. 16.1-16.4 are schematic illustrations depicting fracture growth about a wellbore during a fracture operation;

FIGS. 19.1 and 19.2 are schematic diagrams depicting a stress profile shown with a pseudo-3D (P-3D) prediction of fracture growth and an expected fracture growth;

FIG. 20 is a schematic diagram depicting the stress profile and expected fracture of FIG. 19.1 shown with a Stacked Height Growth (SHG) prediction of the fracture growth;

FIGS. 25.1 and 25.2 are graphs depicting estimated fracture growth for the stress profile of FIG. 24 using a planar 3D (PL3D) model and the P3D models, respectively;

FIGS. 26.1 and 26.2 are graphs depicting estimated fracture growth for the stress profile of FIG. 24 using the PL3D model and the P3D model, respectively;

FIG. 27 is a graph depicting estimated fracture growth for the stress profile of FIG. 24 using the SHG model;

FIGS. 28.1-28.3 are graphs depicting estimated fracture growth for the stress profile of FIG. 24 the PL3D, P3D, and SHG models, respectively, for a fluid viscosity of 1 cp;

FIGS. 29.1-29.3 are graphs depicting estimated fracture growth for the stress profile of FIG. 24 using the PL3D, P3D, and SHG models, respectively, for a fluid viscosity of 10 cp;

FIGS. 30.1-30.3 are graphs depicting estimated fracture growth for the stress profile of FIG. 24 using the PL3D, P3D, and SHG models, respectively, for a fluid viscosity of 100 cp;

FIG. 31 is a graph depicting a stress profile of a complex formation;

FIGS. 32.1-32.3 are graphs depicting estimated fluid pressure for the stress profile of FIG. 31 using the PL3D, P3D, and SHG models, respectively, for a fluid viscosity of 1 cp;

FIGS. 33.1-33.3 are graphs depicting estimated fluid pressure for the stress profile of FIG. 31 using the PL3D, P3D, and SHG models, respectively, for a fluid viscosity of 10 cp;

FIGS. 34.1-34.3 are graphs depicting estimated fluid pressure for the stress profile of FIG. 31 using the PL3D, P3D, and SHG models, respectively, for a fluid viscosity of 100 cp;

FIGS. 35.1-35.3 are graphs depicting various views of the simulated hydraulic fracture network.

DETAILED DESCRIPTION

Figure 1:
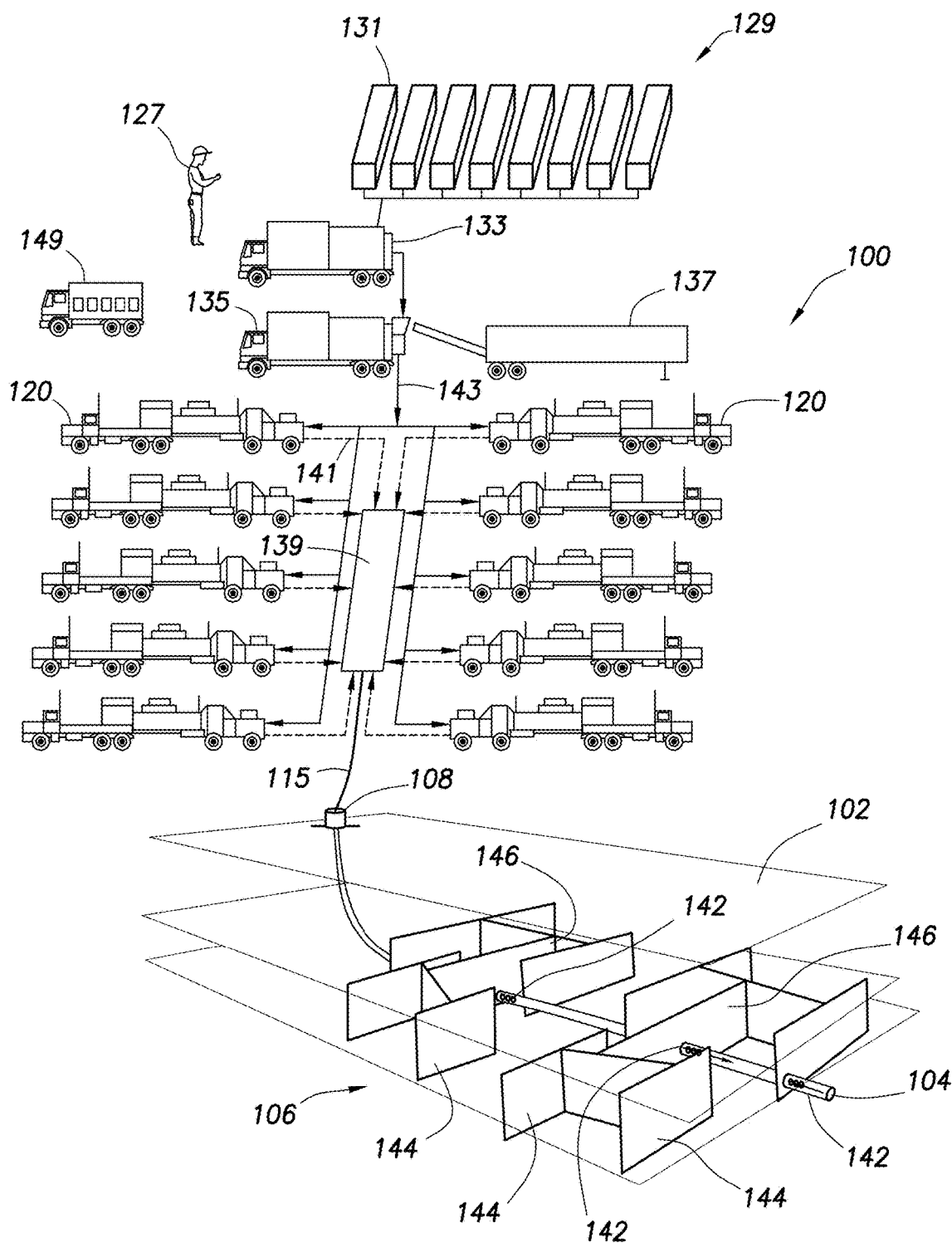
FIG. 1.1 is a schematic illustration of a hydraulic fracturing site depicting a fracture operation.

The description that follows includes exemplary apparatuses, methods, techniques, and instruction sequences that embody techniques of the inventive subject matter. However, it is understood that the described embodiments may be practiced without these specific details.

Stress Shadow Operations

Models have been developed to understand subsurface fracture networks. The models may consider various factors and/or data, but may not be constrained by accounting for either the amount of pumped fluid or mechanical interactions between fractures and injected fluid and among the fractures. Constrained models may be provided to give a fundamental understanding of involved mechanisms, but may be complex in mathematical description and/or require computer processing resources and time in order to provide accurate simulations of hydraulic fracture propagation. A constrained model may be configured to perform simulations to consider factors, such as interaction between fractures, over time and under desired conditions.

An unconventional fracture model (UFM) (or complex model) may be used to simulate complex fracture network propagation in a formation with pre-existing natural fractures. Multiple fracture branches can propagate simultaneously and intersect/cross each other. Each open fracture may exert additional stresses on the surrounding rock and adjacent fractures, which may be referred to as "stress shadow" effect. The stress shadow can cause a restriction of fracture parameters (e.g., width), which may lead to, for example, a greater risk of proppant screenout. The stress shadow can also alter the fracture propagation path and affect fracture network patterns. The stress shadow may affect the modeling of the fracture interaction in a complex fracture model.

A method for computing the stress shadow in a complex hydraulic fracture network is presented. The method may be performed based on an enhanced 2D Displacement Discontinuity Method (2D DDM) with correction for finite fracture height or 3D Displacement Discontinuity Method (3D DDM). The computed stress field from 2D DDM may be compared to 3D numerical simulation (3D DDM or flac3D) to determine an approximation for the 3D fracture problem. This stress shadow calculation may be incorporated in the UFM. The results for simple cases of two fractures shows the fractures can either attract or expel each other depending, for example, on their initial relative positions, and may be compared with an independent 2D non-planar hydraulic fracture model.

Additional examples of both planar and complex fractures propagating from multiple perforation clusters are presented, showing that fracture interaction may control the fracture dimension and propagation pattern. In a formation with small stress anisotropy, fracture interaction can lead to dramatic divergence of the fractures as they may tend to repel each other. However, even when stress anisotropy is large and fracture turning due to fracture interaction is limited, stress shadowing may have a strong effect on fracture width, which may affect the injection rate distribution into multiple perforation clusters, and hence overall fracture network geometry and proppant placement.

FIGS. 1.1 and 1.2 depict fracture propagation about a wellsite 100. The wellsite has a wellbore 104 extending from a wellhead 108 at a surface location and through a subterranean formation 102 therebelow. A fracture network 106 extends about the wellbore 104. A pump system 129 is positioned about the wellhead 108 for passing fluid through tubing 142.

The pump system 129 is depicted as being operated by a field operator 127 for recording maintenance and operational data and/or performing maintenance in accordance with a prescribed maintenance plan. The pumping system 129 pumps fluid from the surface to the wellbore 104 during the fracture operation.

The pump system 129 includes a plurality of water tanks 131, which feed water to a gel hydration unit 133. The gel hydration unit 133 combines water from the tanks 131 with a gelling agent to form a gel. The gel is then sent to a blender 135 where it is mixed with a proppant from a proppant transport 137 to form a fracturing fluid. The gelling agent may be used to increase the viscosity of the fracturing fluid, and to allow the proppant to be suspended in the fracturing fluid. It may also act as a friction reducing agent to allow higher pump rates with less frictional pressure.

The fracturing fluid is then pumped from the blender 135 to the treatment trucks 120 with plunger pumps as shown by solid lines 143. Each treatment truck 120 receives the fracturing fluid at a low pressure and discharges it to a common manifold 139 (sometimes called a missile trailer or missile) at a high pressure as shown by dashed lines 141. The missile 139 then directs the fracturing fluid from the treatment trucks 120 to the wellbore 104 as shown by solid line 115. One or more treatment trucks 120 may be used to supply fracturing fluid at a desired rate.

Each treatment truck 120 may be normally operated at any rate, such as well under its maximum operating capacity. Operating the treatment trucks 120 under their operating capacity may allow for one to fail and the remaining to be run at a higher speed in order to make up for the absence of the failed pump. A computerized control system may be employed to direct the entire pump system 129 during the fracturing operation.

Various fluids, such as conventional stimulation fluids with proppants, may be used to create fractures. Other fluids, such as viscous gels, "slick water" (which may have a friction reducer (polymer) and water) may also be used to hydraulically fracture shale gas wells. Such "slick water" may be in the form of a thin fluid (e.g., nearly the same viscosity as water) and may be used to create more complex fractures, such as multiple micro-seismic fractures detectable by monitoring.

As also shown in FIGS. 1.1 and 1.2, the fracture network includes fractures located at various positions around the wellbore 104. The various fractures may be natural fractures 144 present before injection of the fluids, or hydraulic fractures 146 generated about the formation 102 during injection. FIG. 1.2 shows a depiction of the fracture network 106 based on microseismic events 148 gathered using conventional means.

Multi-stage stimulation may be the norm for unconventional reservoir development. However, an obstacle to optimizing completions in shale reservoirs may involve a lack of hydraulic fracture models that can properly simulate complex fracture propagation often observed in these formations. A complex fracture network model (or UFM), has been developed (see, e.g., Weng, X., Kresse, O., Wu, R., and Gu, H., *Modeling of Hydraulic Fracture Propagation in a Naturally Fractured Formation*. Paper SPE 140253 presented at the SPE Hydraulic Fracturing Conference and Exhibition, Woodlands, Tex., USA, Jan. 24-26 (2011) (hereafter "Weng 2011"); Kresse, O., Cohen, C., Weng, X., Wu, R., and Gu, H. 2011 (hereafter "Kresse 2011"). *Numerical Modeling of Hydraulic Fracturing in Naturally Fractured Formations*. 45th US Rock Mechanics/Geomechanics Symposium, San Francisco, Calif., June 26-29, the entire contents of which are hereby incorporated herein).

Existing models may be used to simulate fracture propagation, rock deformation, and fluid flow in the complex fracture network created during a treatment. The model may also be used to solve the fully coupled problem of fluid flow in the fracture network and the elastic deformation of the fractures, which may have similar assumptions and governing equations as conventional pseudo-3D fracture models. Transport equations may be solved for each component of the fluids and proppants pumped.

Conventional planar fracture models may model various aspects of the fracture network. The provided UFM may also involve the ability to simulate the interaction of hydraulic fractures with pre-existing natural fractures, i.e. determine whether a hydraulic fracture propagates through or is arrested by a natural fracture when they intersect and subsequently propagates along the natural fracture. The branching of the hydraulic fracture at the intersection with the natural fracture may give rise to the development of a complex fracture network.

A crossing model may be extended from Renshaw and Pollard (see, e.g., Renshaw, C. E. and Pollard, D. D. 1995, *An Experimentally Verified Criterion for Propagation across Unbounded Frictional Interfaces in Brittle, Linear Elastic Materials*. Int. J. Rock Mech. Min. Sci. & Geomech. Abstr., 32: 237-249 (1995) the entire contents of which is hereby incorporated herein) interface crossing criterion, to apply to any intersection angle, and may be developed (see, e.g., Gu, H. and Weng, X. *Criterion for Fractures Crossing Frictional Interfaces at Non-orthogonal Angles*. 44th US Rock symposium, Salt Lake City, Utah, Jun. 27-30, 2010 (hereafter "Gu and Weng 2010"), the entire contents of which are hereby incorporated by reference herein) and validated against experimental data (see, e.g., Gu, H., Weng, X., Lund, J., Mack, M., Ganguly, U. and Suarez-Rivera R. 2011. *Hydraulic Fracture Crossing Natural Fracture at Non-Orthogonal Angles, A Criterion, Its Validation and Applications*. Paper SPE 139984 presented at the SPE Hydraulic Fracturing Conference and Exhibition, Woodlands, Tex., Jan. 24-26 (2011) (hereafter "Gu et al. 2011"), the entire contents of which are hereby incorporated by reference herein), and integrated in the UFM.

To properly simulate the propagation of multiple or complex fractures, the fracture model may take into account an interaction among adjacent hydraulic fracture branches, often referred to as the "stress shadow" effect. When a single planar hydraulic fracture is opened under a finite fluid net pressure, it may exert a stress field on the surrounding rock that is proportional to the net pressure.

In the limiting case of an infinitely long vertical fracture of a constant finite height, an analytical expression of the stress field exerted by the open fracture may be provided. See, e.g., Warpinski, N.F. and Teufel, L.W, *Influence of Geologic Discontinuities on Hydraulic Fracture Propagation*, JPT, February, 209-220 (1987) (hereafter "Warpinski and Teufel") and Warpinski, N.R., and Branagan, P.T., *Altered-Stress Fracturing*. SPE JPT, September, 1989, 990-997 (1989), the entire contents of which are hereby incorporated by reference herein. The net pressure (or more precisely, the pressure that produces the given fracture opening) may exert a compressive stress in the direction normal to the fracture on top of the minimum in-situ stress, which may equal the net pressure at the fracture face, but quickly falls off with the distance from the fracture.

At a distance beyond one fracture height, the induced stress may be only a small fraction of the net pressure. Thus, the term "stress shadow" may be used to describe this increase of stress in the region surrounding the fracture. If a second hydraulic fracture is created parallel to an existing open fracture, and if it falls within the "stress shadow" (i.e. the distance to the existing fracture is less than the fracture height), the second fracture may, in effect, see a closure stress greater than the original in-situ stress. As a result, a higher pressure may be needed to propagate the fracture, and/or the fracture may have a narrower width, as compared to the corresponding single fracture.

One application of the stress shadow study may involve the design and optimization of the fracture spacing between multiple fractures propagating simultaneously from a horizontal wellbore. In ultra low permeability shale formations, fractures may be closely spaced for effective reservoir drainage. However, the stress shadow effect may prevent a fracture propagating in close vicinity of other fractures (see, e.g., Fisher, M.K., J.R. Heinze, C.D. Harris, B.M. Davidson, C.A. Wright, and K.P. Dunn, *Optimizing horizontal completion techniques in the Barnett Shale using microseismic fracture mapping*. SPE 90051 presented at the SPE Annual Technical Conference and Exhibition, Houston, 26-29 Sep. 2004, the entire contents of which are hereby incorporated by reference herein in its entirety).

The interference between parallel fractures has been studied in the past (see, e.g., Warpinski and Teufel; Britt, L.K. and Smith, M.B., *Horizontal Well Completion, Stimulation Optimization, and Risk Mitigation*. Paper SPE 125526 presented at the 2009 SPE Eastern Regional Meeting, Charleston, Sep. 23-25, 2009; Cheng, Y. 2009. *Boundary Element Analysis of the Stress Distribution around Multiple Fractures: Implications for the Spacing of Perforation Clusters of Hydraulically Fractured Horizontal Wells*. Paper SPE 125769 presented at the 2009 SPE Eastern Regional Meeting, Charleston, Sep. 23-25, 2009; Meyer, B.R. and Bazan, L.W, *A Discrete Fracture Network Model for Hydraulically Induced Fractures: Theory, Parametric and Case Studies*. Paper SPE 140514 presented at the SPE Hydraulic Fracturing Conference and Exhibition, Woodlands, Tex., USA, Jan. 24-26, 2011; Roussel, N.P. and Sharma, M.M, *Optimizing Fracture Spacing and Sequencing in Horizontal-Well Fracturing*, SPEPE, May, 2011, pp. 173-184, the entire contents of which are hereby incorporated by reference herein). The studies may involve parallel fractures under static conditions.

An effect of stress shadow may be that the fractures in the middle region of multiple parallel fractures may have smaller width because of the increased compressive stresses from neighboring fractures (see, e.g., Germanovich, L.N., and Astakhov D., *Fracture Closure in Extension and Mechanical Interaction of Parallel Joints. J. Geophys. Res.*, 109, B02208, doi: 10.1029/2002 JB002131 (2004); Olson, J.E., *Multi-Fracture Propagation Modeling: Applications to Hydraulic Fracturing in Shales and Tight Sands*. 42nd US Rock Mechanics Symposium and 2nd US-Canada Rock Mechanics Symposium, San Francisco, Calif., Jun. 29-Jul. 2, 2008, the entire contents of which are hereby incorporated by reference herein). When multiple fractures are propagating simultaneously, the flow rate distribution into the fractures may be a dynamic process and may be affected by the net pressure of the fractures. The net pressure may be strongly dependent on fracture width, and hence, the stress shadow effect on flow rate distribution and fracture dimensions warrants further study.

The dynamics of simultaneously propagating multiple fractures may also depend on the relative positions of the initial fractures. If the fractures are parallel, e.g. in the case of multiple fractures that are orthogonal to a horizontal wellbore, the fractures may repel each other, resulting in the fractures curving outward. However, if the multiple fractures are arranged in an en echlon pattern, e.g. for fractures initiated from a horizontal wellbore that is not orthogonal to the fracture plane, the interaction between the adjacent fractures may be such that their tips attract each other and even connect (see, e.g., Olson, J. E. *Fracture Mechanics Analysis of Joints and Veins*. PhD dissertation, Stanford University, San Francisco, Calif. (1990); Yew, C. H., Mear, M.E., Chang, C.C., and Zhang, X.C. *On Perforating and Fracturing of Deviated Cased Wellbores*. Paper SPE 26514 presented at SPE 68th Annual Technical Conference and Exhibition, Houston, Tex., Oct. 3-6 (1993); Weng, X., *Fracture Initiation and Propagation from Deviated Wellbores*. Paper SPE 26597 presented at SPE 68th Annual Technical Conference and Exhibition, Houston, Tex., Oct. 3-6 (1993), the entire contents of which are hereby incorporated by reference herein).

When a hydraulic fracture intersects a secondary fracture oriented in a different direction, it may exert an additional closure stress on the secondary fracture that is proportional to the net pressure. This stress may be derived and be taken into account in the fissure opening pressure calculation in the analysis of pressure-dependent leakoff in fissured formation (see, e.g., Nolte, K., *Fracturing Pressure Analysis for nonideal behavior. JPT*, February 1991, 210-218 (SPE 20704) (1991) (hereafter "Nolte 1991"), the entire contents of which are hereby incorporated by reference herein).

For more complex fractures, a combination of various fracture interactions as discussed above may be present. To properly account for these interactions and remain computationally efficient so it can be incorporated in the complex fracture network model, a proper modeling framework may be constructed. A method based on an enhanced 2D Displacement Discontinuity Method (2D DDM) may be used for computing the induced stresses on a given fracture and in the rock from the rest of the complex fracture network (see, e.g., Olson, J.E., *Predicting Fracture Swarms-The Influence of Sub critical Crack Growth and the Crack-Tip Process Zone on Joints Spacing in Rock. In The Initiation, Propagation and Arrest of Joints and Other Fractures*, ed. J.W. Cosgrove and T. Engelder, Geological Soc. Special Publications, London, 231, 73-87 (2004)(hereafter "Olson 2004"), the entire contents of which are hereby incorporated by reference herein). Fracture turning may also be modeled based on the altered local stress direction ahead of the propagating fracture tip due to the stress shadow effect. The simulation results from the UFM model that incorporates the fracture interaction modeling are presented.

UFM Model Description

To simulate the propagation of a complex fracture network that consists of many intersecting fractures, equations governing the underlying physics of the fracturing process may be used. The basic governing equations may include, for example, equations governing fluid flow in the fracture network, the equation governing the fracture deformation, and the fracture propagation/interaction criterion.

Continuity equation assumes that fluid flow propagates along a fracture network with the following mass conservation:

$$\frac{\partial q}{\partial s} + \frac{\partial (H_{fl}\overline{w})}{\partial t} + q_L = 0 \quad (1)$$

where q is the local flow rate inside the hydraulic fracture along the length, $\overline{w}$ is an average width or opening at the cross-section of the fracture at position s=s(x,y), $H_{fl}$ is the height of the fluid in the fracture, and $q_L$ is the leak-off volume rate through the wall of the hydraulic fracture into the matrix per unit height (velocity at which fracturing fluid infiltrates into surrounding permeable medium) which is expressed through Carter's leak-off model. The fracture tips propagate as a sharp front, and the length of the hydraulic fracture at any given time t is defined as l(t).

The properties of driving fluid may be defined by power-law exponent n' (fluid behavior index) and consistency index K'. The fluid flow could be laminar, turbulent or Darcy flow through a proppant pack, and may be described correspondingly by different laws. For the general case of 1D laminar flow of power-law fluid in any given fracture branch, the Poiseuille law (see, e.g., Nolte, 1991) may be used:

$$\frac{\partial p}{\partial s} = -\alpha_0 \frac{1}{\overline{w}^{2n'+1}} \frac{q}{H_{fl}} \left|\frac{q}{H_{fl}}\right|^{n'-1} \quad (2)$$

where $$\alpha_0 = \frac{2K'}{\phi(n')^{n'}} \cdot \left(\frac{4n'+2}{n'}\right)^{n'}; \phi(n') = \frac{1}{H_{fl}} \int_{H_{fl}} \left(\frac{w(z)}{\overline{w}}\right)^{\frac{2n'+1}{n'}} dz \quad (3)$$

Here w(z) represents fracture width as a function of depth at current position s, α is coefficient, n' is power law exponent (fluid consistency index), ϕ is shape function, and dz is the integration increment along the height of the fracture in the formula.

Fracture width may be related to fluid pressure through the elasticity equation. The elastic properties of the rock (which may be considered as mostly homogeneous, isotropic, linear elastic material) may be defined by Young's modulus E and Poisson's ratio ν. For a vertical fracture in a layered medium with variable minimum horizontal stress $\sigma_h(x, y, z)$ and fluid pressure p, the width profile (w) can be determined from an analytical solution given as:

$$w(x,y,z)=w(p(x,y),H,z) \quad (4)$$

where W is the fracture width at a point with spatial coordinates x, y, z (coordinates of the center of fracture element); p(x,y) is the fluid pressure, H is the fracture element height, and z is the vertical coordinate along fracture element at point (x,y).

Because the height of the fractures may vary, the set of governing equations may also include the height growth calculation as described, for example, in Kresse 2011.

In addition to equations described above, the global volume balance condition may be satisfied:

$$\int_0^t Q(t)dt = \int_0^{L(t)} H(s,t)\overline{w}(s,t)ds + \int\int_{H_L}\int_0^t\int_0^{L(t)} 2g_L \, ds \, dt \, dh_l \quad (5)$$

where $g_L$ is fluid leakoff velocity, Q(t) is time dependent injection rate, H(s,t) height of the fracture at spacial point s(x,y) and at the time t, ds is length increment for integration along fracture length, $d_t$ is time increment, $dh_l$ is increment of leakoff height, $H_L$ is leakoff height, an $s_0$ is a spurt loss coefficient. Equation (5) provides that the total volume of fluid pumped during time t is equal to the volume of fluid in the fracture network and the volume leaked from the fracture up to time t. Here L(t) represents the total length of the HFN at the time t and $S_0$ is the spurt loss coefficient. The boundary conditions may require the flow rate, net pressure and fracture width to be zero at all fracture tips.

The system of Eq. 1-5, together with initial and boundary conditions, may be used to represent a set of governing equations. Combining these equations and discretizing the fracture network into small elements may lead to a nonlinear system of equations in terms of fluid pressure p in each element, simplified as f(p)=0, which may be solved by using a damped Newton-Raphson method.

Fracture interaction may be taken into account to model hydraulic fracture propagation in naturally fractured reservoirs. This includes, for example, the interaction between hydraulic fractures and natural fractures, as well as interaction between hydraulic fractures. For the interaction between hydraulic and natural fractures a semi-analytical crossing criterion may be implemented in the UFM using, for example, the approach described in Gu and Weng 2010, and Gu et al. 2011.

Modeling of Stress Shadow

For parallel fractures, the stress shadow can be represented by the superposition of stresses from neighboring fractures. FIG. 2 is a schematic depiction of a 2D fracture 200 about a coordinate system having an x-axis and a y-axis. Various points along the 2D fractures, such as a first end at h/2, a second end at −h/2 and a midpoint are extended to an observation point (x,y). Each line L extends at angles $\theta_1$, $\theta_2$ from the points along the 2D fracture to the observation point.

The stress field around a 2D fracture with internal pressure p can be calculated using, for example, the techniques as described in Warpinski and Teufel. The stress that affects fracture width is $\sigma_x$, and can be calculated from:

$$\sigma_x = p\left[1 - \frac{\overline{L}}{\sqrt{\overline{L}_1\overline{L}_2}}\cos\left(\theta - \frac{\theta_1+\theta_2}{2}\right) - \frac{\overline{L}}{(\overline{L}_1\overline{L}_2)^{\frac{3}{2}}}\sin\theta\sin\left(\frac{3}{2}(\theta_1+\theta_2)\right)\right] \quad (6)$$

where $$\theta = \arctan\left(-\frac{\overline{x}}{\overline{y}}\right) \quad (7)$$

$$\theta_1 = \arctan\left(-\frac{\overline{x}}{1+\overline{y}}\right)$$

$$\theta_2 = \arctan\left(\frac{\overline{x}}{1-\overline{y}}\right)$$

and where $\sigma_x$ is stress in the x direction, p is internal pressure, and $\overline{x}, \overline{y}, \overline{L}, \overline{L}_1, \overline{L}_2$ are the coordinates and distances in FIG. 2 normalized by the fracture half-height h/2. Since $\sigma_x$ varies in the y-direction as well as in the x-direction, an averaged stress over the fracture height may be used in the stress shadow calculation.

The analytical equation given above can be used to compute the average effective stress of one fracture on an adjacent parallel fracture and can be included in the effective closure stress on that fracture.

For more complex fracture networks, the fractures may orient in different directions and intersect each other. FIG. 3 shows a complex fracture network 300 depicting stress shadow effects. The fracture network 300 includes hydraulic fractures 303 extending from a wellbore 304 and interacting with other fractures 305 in the fracture network 300.

A more general approach may be used to compute the effective stress on any given fracture branch from the rest of the fracture network. In UFM, the mechanical interactions between fractures may be modeled based on an enhanced 2D Displacement Discontinuity Method (DDM) (Olson 2004) for computing the induced stresses (see, e.g., FIG. 3).

In a 2D, plane-strain, displacement discontinuity solution, (see, e.g., Crouch, S.L. and Starfield, A.M., *Boundary Element Methods in Solid Mechanics*, George Allen & Unwin Ltd, London. Fisher, M.K. (1983)(hereafter Crouch and Starfield 1983), the entire contents of which are hereby incorporated by reference) may be used to describe the normal and shear stresses ($\sigma_n$ and $\sigma_s$) acting on one fracture element induced by the opening and shearing displacement discontinuities ($D_n$ and $D_s$) from all fracture elements. To account for the 3D effect due to finite fracture height, Olson 2004 may be used to provide a 3D correction factor to the influence coefficients $C^{ij}$ in combination with the modified elasticity equations of 2D DDM as follows:

$$\sigma_n^i = \sum_{j=1}^{N} A^{ij} C_{ns}^{ij} D_s^j + \sum_{j=1}^{N} A^{ij} C_{nn}^{ij} D_n^j \qquad (8)$$

$$\sigma_s^i = \sum_{j=1}^{N} A^{ij} C_{ss}^{ij} D_s^j + \sum_{j=1}^{N} A^{ij} C_{sn}^{ij} D_n^j$$

where A is a matrix of influence coefficients described in eq. (9), N is a total number of elements in the network whose interaction is considered, i is the element considered, and j=1, N are other elements in the network whose influence on the stresses on element i are calculated; and where $C^{ij}$ are the 2D, plane-strain elastic influence coefficients. These expressions can be found in Crouch and Starfield 1983.

Elem i and j of FIG. 3 schematically depict the variables i and j in equation (8). Discontinuities $D_s$ and $D_n$ applied to Elem j are also depicted in FIG. 3. Dn may be the same as the fracture width, and the shear stress s may be 0 as depicted. Displacement discontinuity from Elem j creates a stress on Elem i as depicted by $\sigma_s$ and $\sigma_n$.

The 3D correction factor suggested by Olson 2004 may be presented as follows:

$$A^{ij} = 1 - \frac{d_{ij}^{\beta}}{\left[d_{ij}^2 + (h/\alpha)^2\right]^{\beta/2}} \qquad (9)$$

where h is the fracture height, $d_{ij}$ is the distance between elements i and j, $\alpha$ and $\beta$ are fitting parameters. Eq. 9 shows that the 3D correction factor may lead to decaying of interaction between any two fracture elements when the distance increases.

In the UFM model, at each time step, the additional induced stresses due to the stress shadow effects may be computed. It may be assumed that at any time, fracture width equals the normal displacement discontinuities ($D_n$) and shear stress at the fracture surface is zero, i.e., $D_n^j = w_j$, $\sigma_s^i = 0$. Substituting these two conditions into Eq. 8, the shear displacement discontinuities ($D_s$) and normal stress induced on each fracture element ($\sigma_n$) may be found.

The effects of the stress shadow induced stresses on the fracture network propagation pattern may be described in two folds. First, during pressure and width iteration, the original in-situ stresses at each fracture element may be modified by adding the additional normal stress due to the stress shadow effect. This may directly affect the fracture pressure and width distribution which may result in a change on the fracture growth. Second, by including the stress shadow induced stresses (normal and shear stresses), the local stress fields ahead of the propagating tips may also be altered which may cause the local principal stress direction to deviate from the original in-situ stress direction. This altered local principal stress direction may result in the fracture turning from its original propagation plane and may further affect the fracture network propagation pattern.

Validation of Stress Shadow Model

Validation of the UFM model for the cases of bi-wing fractures may be performed using, for example, Weng 2011 or Kresse 2011. Validation may also be performed using the stress shadow modeling approach. By way of example, the results may be compared using 2D DDM to Flac 3D as provided in Itasca Consulting Group Inc., 2002, *FLAC3D (Fast Lagrangian Analysis of Continua in 3 Dimensions)*, Version 2.1, Minneapolis: ICG (2002) (hereafter "Itasca, 2002").

Comparison of Enchanced 2D DDM to Flac3D

The 3D correction factors suggested by Olson 2004 contain two empirical constants, $\alpha$ and $\beta$. The values of $\alpha$ and $\beta$ may be calibrated by comparing stresses obtained from numerical solutions (enhanced 2D DDM) to the analytical solution for a plane-strain fracture with infinite length and finite height. The model may further be validated by comparing the 2D DDM results to a full three dimensional numerical solutions, utilizing, for example, FLAC3D, for two parallel straight fractures with finite lengths and heights.

The validation problem is shown in FIG. 4. FIG. 4 a schematic diagram 400 comparing enhanced 2D DDM to Flac3D for two parallel straight fractures. As shown in FIG. 400, two parallel fractures 407.1, 407.2 are subject to stresses $\sigma_x$, $\sigma_y$ along an x, y coordinate axis. The fractures have length $2L_{xf}$, and pressure of the fracture $p_1$, $p_2$, respectively. The fractures are a distance s apart.

The fracture in Flac3D may be simulated as two surfaces at the same location but with un-attached grid points. Constant internal fluid pressure may be applied as the normal stress on the grids. Fractures may also be subject to remote stresses, $\sigma_x$ and $\sigma_y$. Two fractures may have the same length and height with the ratio of height/half-length=0.3.

Stresses along x-axis (y=0) and y-axis (x=0) may be compared. Two closely spaced fractures (s/h=0.5) may be simulated as shown in the comparison of FIGS. 5.1-5.3. These figures provide a comparison of extended 2D DDM to Flac3D: Stresses along x-axis (y=0) and y-axis (x=0).

These figures include graphs 500.1, 500.2, 500.3, respectively, illustrating 2D DDM and Flac3D of extended fractures for σy along the y-axis, σx along the y-axis, and σy along the x-axis, respectively. FIG. 5.1 plots σy/p (y-axis) versus normalized distance from fracture (x-axis) using 2D DDM and Flac3D. FIG. 5.2 plots σx/p (y-axis) versus normalized distance from fracture (x-axis) using 2D DDM and Flac3D. FIG. 5.3 plots σy/p (y-axis) versus normalized distance from fracture (x-axis) using 2D DDM and Flac3D. The location $L_f$ of the fracture tip is depicted along line x/h.

As shown in FIGS. 5.1-5.3, the stresses simulated from enhanced 2D DDM approach with 3D correction factor match pretty well to those from the full 3D simulator results, which indicates that the correction factor allows capture the 3D effect from the fracture height on the stress field.

Comparison to CSIRO Model

The UFM model that incorporates the enchanced 2DDM approach may be validated against full 2D DDM simulator by CSIRO (see, e.g., Zhang, X., Jeffrey, R.G., and Thiercelin, M. 2007. *Deflection and Propagation of Fluid-Driven Fractures at Frictional Bedding Interfaces: A Numerical Investigation. Journal of Structural Geology*, 29: 396-410, (hereafter "Zhang 2007") the entire contents of which is hereby incorporated by reference in its entirety). This approach may be used, for example, in the limiting case of very large fracture height where 2D DDM approaches do not consider 3D effects of the fractures height.

The comparison of influence of two closely propagating fractures on each other's propagation paths may be employed. The propagation of two hydraulic fractures initiated parallel to each other (propagating along local max stress direction) may be simulated for configurations, such as: 1) initiation points on top of each other and offset from each other for isotropic, and 2) anisotropic far field stresses. The fracture propagation path and pressure inside of each fracture may be compared for UFM and CSIRO code for the input data given in Table 1.

TABLE 1

| Input data for validation against CSIRO model | | |
|---|---|---|
| Injection rate | 0.106 m3/s | 40 bbl/min |
| Stress anisotropy | 0.9 MPa | 130 psi |
| Young's modulus | 3 × 10^10 Pa | 4.35e+6 psi |
| Poisson's ratio | 0.35 | 0.35 |
| Fluid viscosity | 0.001 pa-s | 1 cp |
| Fluid Specific Gravity | 1.0 | 1.0 |
| Min horizontal stress | 46.7 MPa | 6773 psi |
| Max horizontal stress | 47.6 MPa | 6903 psi |
| Fracture toughness | 1 MPa-m^0.5 | 1000 psi/in^0.5 |
| Fracture height | 120 m | 394 ft |

When two fractures are initiated parallel to each other with initiation points separated by dx=0, dy=33 ft (10.1 m) (max horizontal stress field is oriented in x-direction), they may turn away from each other due to the stress shadow effect.

The propagation paths for isotropic and anisotropic stress fields are shown in FIGS. 6.1 and 6.2. These figures are graphs 600.1, 600.2 depicting propagation paths for two initially parallel fractures 609.1, 609.2 in isotropic and anisotropic stress fields, respectively. The fractures 609.1 and 609.2 are initially parallel near the injection points 615.1, 615.2, but diverge as they extend away therefrom. Comparing with isotropic case, the curvatures of the fractures in the case of stress anisotropy are depicted as being smaller. This may be due to the competition between the stress shadow effect which tends to turn fractures away from each other, and far-field stresses which pushes fractures to propagate in the direction of maximum horizontal stress (x-direction). The influence of far-field stress becomes dominant as the distance between the fractures increases, in which case the fractures may tend to propagate parallel to maximum horizontal stress direction.

FIGS. 7.1 and 7.2 depict graphs 700.1, 7002 showing a pair of fractures initiated from two different injection points 711.1, 711.2, respectively. These figures show a comparison for the case when fractures are initiated from points separated by a distance dx=dy=(10.1 m) for an isotropic and anisotropic stress field, respectively. In these figures, the fractures 709.1, 709.2 tend to propagate towards each other. Examples of similar type of behavior have been observed in lab experiments (see, e.g., Zhang 2007).

As indicated above, the enchanced 2D DDM approach implemented in UFM model may be able to capture the 3D effects of finite fracture height on fracture interaction and propagation pattern, while being computationally efficient. A good estimation of the stress field for a network of vertical hydraulic fractures and fracture propagation direction (pattern) may be provided.

EXAMPLE CASES

Case #1 Parallel Fractures in Horizontal Wells

Figure 8:
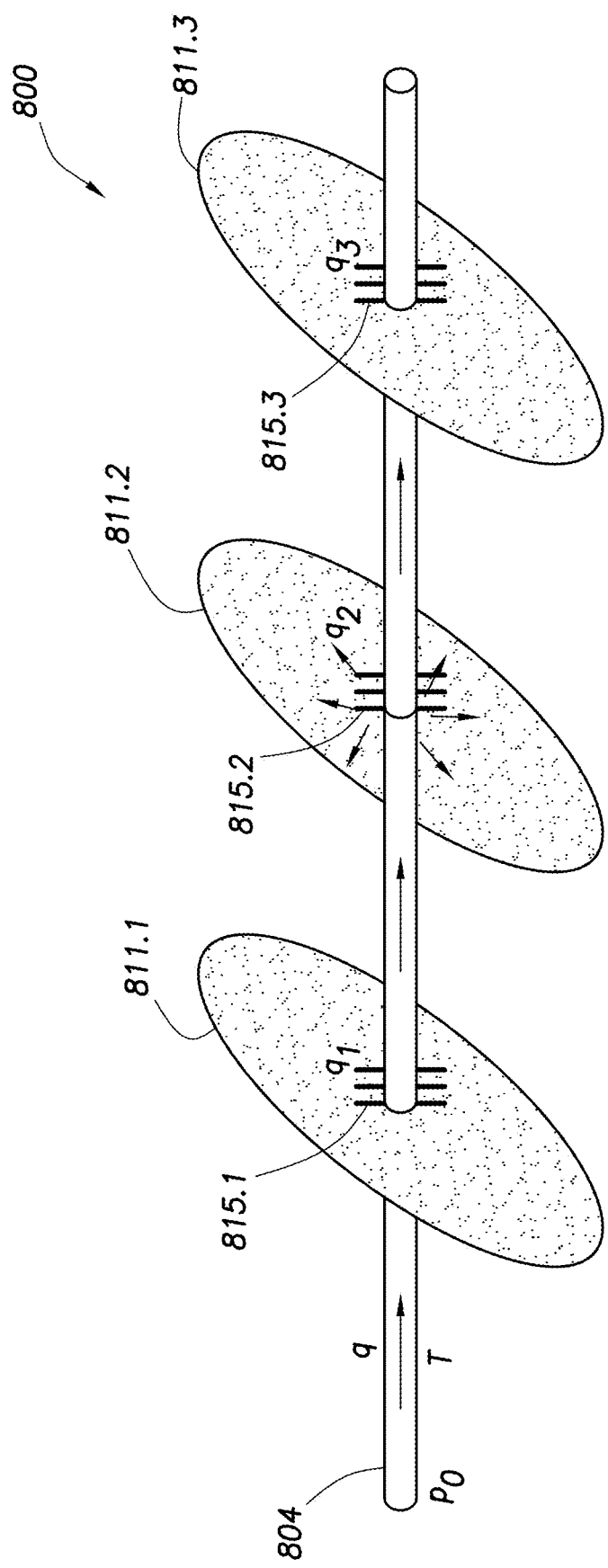
FIG. 8 is a schematic illustration of transverse parallel fractures along a horizontal well.

FIG. 8 is a schematic plot 800 of parallel transverse fractures 811.1, 811.2, 811.3 propagating simultaneously from multiple perforation clusters 815.1, 815.2, 815.3, respectively, about a horizontal wellbore 804. Each of the fractures 811.1, 811.2, 811.3 provides a different flow rate $q_1$, $q_2$, $q_3$ that is part of the total flow $q_t$ at a pressure $p_0$.

When the formation condition and the perforations are the same for all the fractures, the fractures may have about the same dimensions if the friction pressure in the wellbore between the perforation clusters is proportionally small. This may be assumed where the fractures are separated far enough and the stress shadow effects are negligible. When the spacing between the fractures is within the region of stress shadow influence, the fractures may be affected not only in width, but also in other fracture dimension. To illustrate this, a simple example of five parallel fractures may be considered.

In this example, the fractures are assumed to have a constant height of 100 ft (30.5 m). The spacing between the fractures is 65 ft (19.8 m). Other input parameters are given in Table 2.

TABLE 2

| Input parameters for Case #1 | |
|---|---|
| Young's modulus | 6.6 × 10^6 psi = 4.55e+10 Pa |
| Poisson's ratio | 0.35 |
| Rate | 12.2 bbl/min = 0.032 m3/s |
| Viscosity | 300 cp = 0.3 Pa-s |
| Height | 100 ft = 30.5 m |
| Leakoff coefficient | 3.9 × 10^−2 m/s^{1/2} |
| Stress anisotropy | 200 psi = 1.4 Mpa |
| Fracture spacing | 65 ft = 19.8 m |
| No. of perfs per frac | 100 |

For this simple case, a conventional Perkins-Kern-Nordgren (PKN) model (see, e.g., Mack, M.G. and Warpinski, N.R., *Mechanics of Hydraulic Fracturing. Chapter 6, Reservoir Stimulation, 3rd Ed., eds. Economides*, M.J. and Nolte, K.G. John Wiley & Sons (2000)) (hereafter "Mack and Warpinski") for multiple fractures may be modified by incorporating the stress shadow calculation as given from Eq. 6. The increase in closure stress may be approximated by averaging the computed stress from Eq. 6 over the entire fracture. Note that this simplistic PKN model may not simulate the fracture turning due to the stress shadow effect. The results from this simple model may be compared to the results from the UFM model that incorporates point-by-point stress shadow calculation along the entire fracture paths as well as fracture turning.

Figure 9:
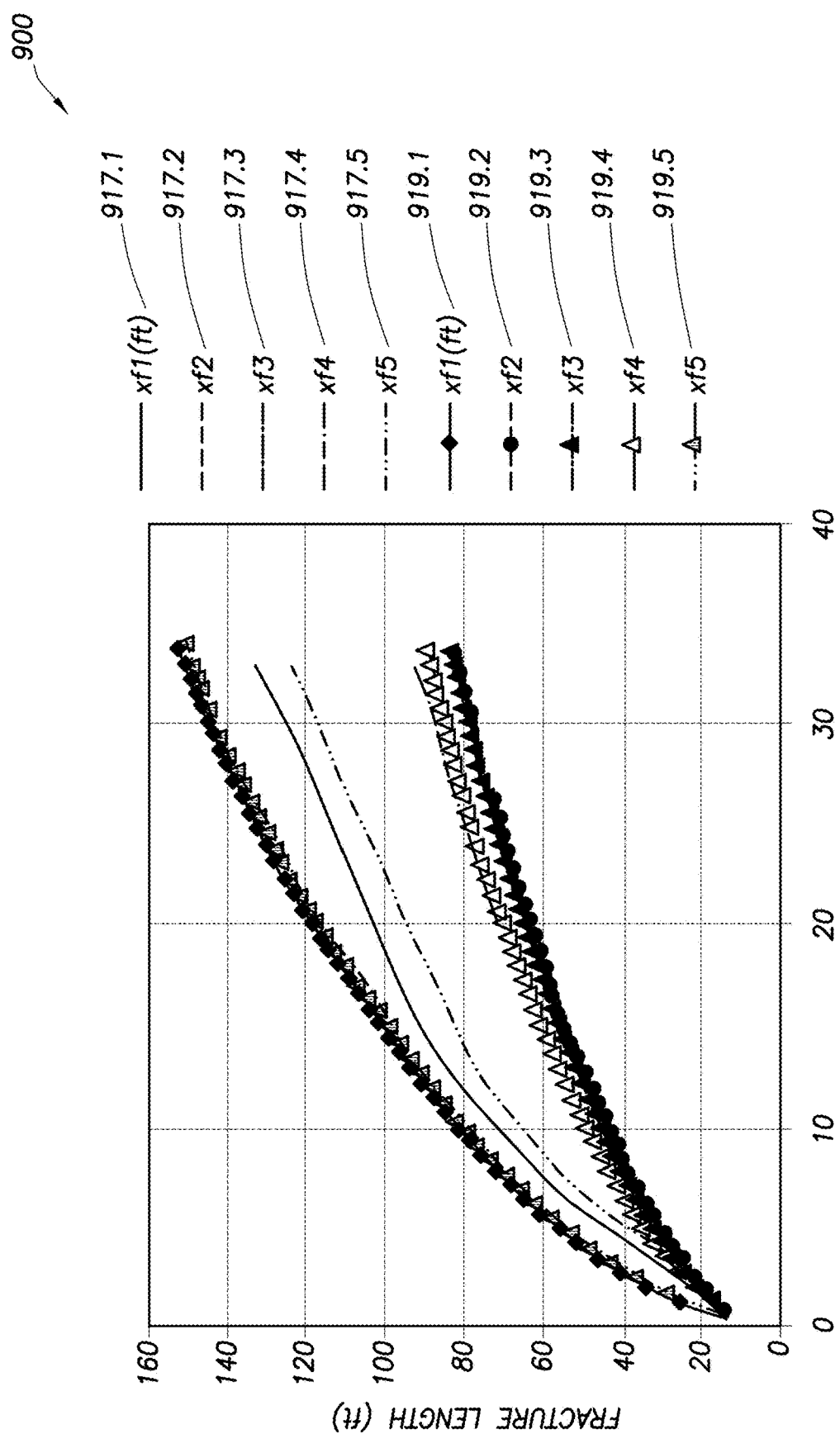
FIG. 9 is a graph depicting lengths for five parallel fractures.

FIG. 9 shows the simulation results of fracture lengths of the five fractures, computed from both models. FIG. 9 is a graph 900 depicting length (y-axis) versus time (t) of five parallel fractures during injection. Lines 917.1-917.5 are generated from the UFM model. Lines 919.1-919.5 are generated from the simplistic PKN model.

Figure 10:
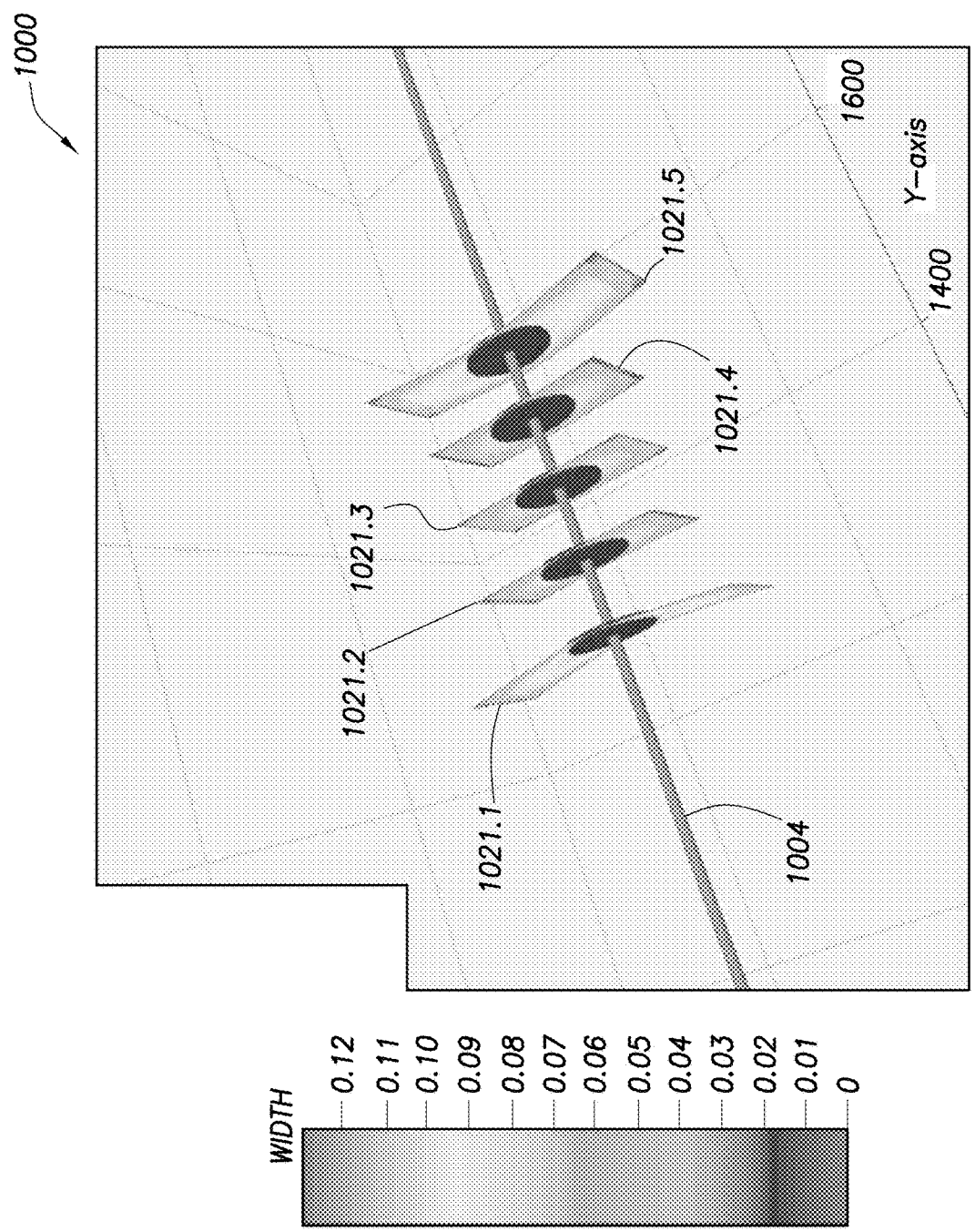
FIG. 10 is a schematic diagram depicting unconventional fracture model (UFM) fracture geometry and width for the parallel fractures of FIG. 9.

The fracture geometry and width contour from the UFM model for the five fractures of FIG. 9 are shown in FIG. 10. FIG. 10 is a schematic diagram 1000 depicting fractures 1021.1-1021.5 about a wellbore 1004.

Fracture 1021.3 is the middle one of the five fractures, and fractures 1021.1 and 1021.5 are the outmost ones. Since fractures 1021.2, 1021.3, and 1021.4 have smaller width than that of the outer ones due to the stress shadow effect, they may have larger flow resistance, receive less flow rate, and have shorter length. Therefore, the stress shadow effects may not only be fracture width but also fracture length under dynamic conditions.

The effect of stress shadow on fracture geometry may be influenced by many parameters. To illustrate the effect of some of these parameters, the computed fracture lengths for the cases with varying fracture spacing, perforation friction, and stress anisotropy are shown in Table 3.

FIGS. 11.1 and 11.2 shows the fracture geometry predicted by the UFM for the case of large perforation friction and the case of large fracture spacing (e.g., about 120 ft (36.6 m)). FIGS. 11.1 and 11.2 are schematic diagrams 1100.1 and 1100.2 depicting five fractures 1123.1-1123.5 about a wellbore 1104. When the perforation friction is large, a large diversion force that uniformly distributes the flow rate into all perforation clusters may be provided. Consequently, the stress shadow may be overcome and the resulting fracture lengths may become approximately equal as shown in FIG. 11.1. When fracture spacing is large, the effect of the stress shadow may dissipate, and fractures may have approximately the same dimensions as shown in FIG. 11.2.

TABLE 3

Influence of various parameters on fracture geometry

| Frac | Base case | 120 ft spacing (36.6 m) | No. of perfs = 2 | Anisotropy = 50 psi (345000 Pa) |
|---|---|---|---|---|
| 1 | 133 | 113 | 105 | 111 |
| 2 | 93 | 104 | 104 | 95 |
| 3 | 83 | 96 | 104 | 99 |
| 4 | 93 | 104 | 100 | 95 |
| 5 | 123 | 113 | 109 | 102 |

Case #2 Complex Fractures

Figure 12:
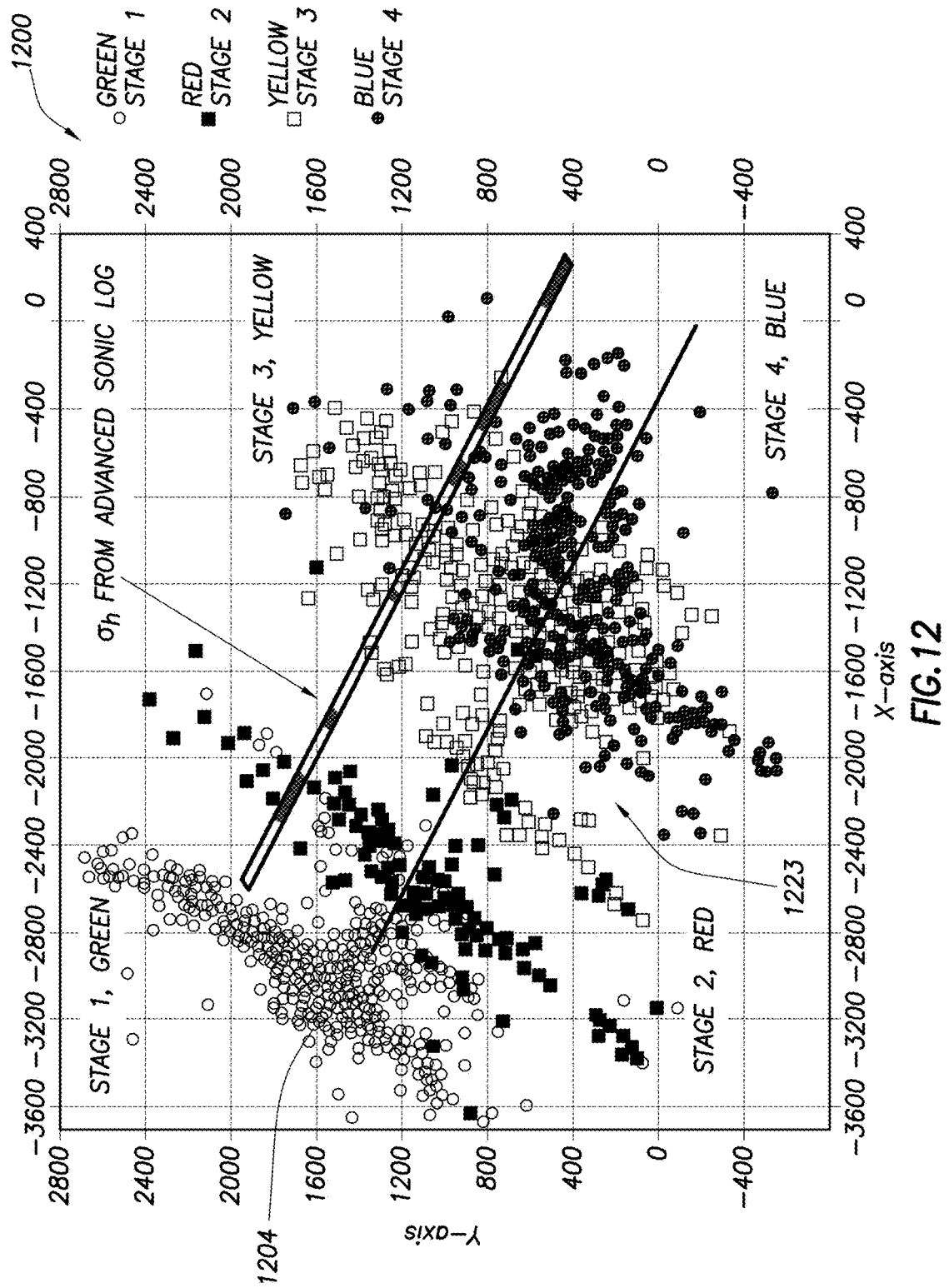
FIG. 12 is a graph depicting microseismic mapping.

In an example of FIG. 12, the UFM model may be used to simulate a 4-stage hydraulic fracture treatment in a horizontal well in a shale formation. See, e.g., Cipolla, C., Weng, X., Mack, M., Ganguly, U., Kresse, O., Gu, H., Cohen, C. and Wu, R., *Integrating Microseismic Mapping and Complex Fracture Modeling to Characterize Fracture Complexity. Paper SPE* 140185 presented at the SPE Hydraulic Fracturing Conference and Exhibition, Woodlands, Tex., USA, Jan. 24-26, 2011, (hereinafter "Cipolla 2011") the entire contents of which are hereby incorporated by reference in their entirety. The well may be cased and cemented, and each stage pumped through three or four perforation clusters. Each of the four stages may consist of approximately 25,000 bbls (4000 m$^3$) of fluid and 440,000 lbs (2e+6 kg) of proppant. Extensive data may be available on the well, including advanced sonic logs that provide an estimate of minimum and maximum horizontal stress. Microseismic mapping data may be available for all stages. See, e.g., Daniels, J., Waters, G., LeCalvez, J., Lassek, J., and Bentley, D., *Contacting More of the Barnett Shale Through an Integration of Real-Time Microseismic Monitoring, Petrophysics, and Hydraulic Fracture Design. Paper SPE* 110562 presented at the 2007 SPE Annual Technical Conference and Exhibition, Anaheim, Calif., USA, Oct. 12-14, 2007. This example is shown in FIG. 12. FIG. 12 is a graph depicting microseismic mapping of microseismic events 1223 at various stages about a wellbore 1204.

The stress anisotropy from the advanced sonic log, indicates a higher stress anisotropy in the toe section of the well compared to the heel. An advanced 3D seismic interpretation may indicate that the dominant natural fracture trend changes from NE-SW in the toe section to NW-SE in heel portion of the lateral. See, e.g., Rich, J.P. and Ammerman, M., *Unconventional Geophysics for Unconventional Plays. Paper SPE* 131779 presented at the Unconventional Gas Conference, Pittsburgh, Pa., USA, Feb. 23-25, 2010, the entire contents of which is hereby incorporated by reference herein in its entirety.

Simulation results may be based on the UFM model without incorporating the full stress shadow calculation (see, e.g., Cipolla 2011), including shear stress and fracture turning (see, e.g., Weng 2011). The simulation may be updated with the full stress model as provided herein. FIGS. 13.1-13.4 show a plan view of a simulated fracture network 1306 about a wellbore 1304 for all four stages, respectively, and their comparison to the microseismic measurements 1323.1-1323.4, respectively.

From simulation results in FIGS. 13.1-13.4, it can be seen that for Stages 1 and 2, the closely spaced fractures did not diverge significantly. This may be because of the high stress anisotropy in the toe section of the wellbore. For Stage 3 and 4, where stress anisotropy is lower, more fracture divergence can be seen as a result of the stress shadow effect.

Case #3 Multi-Stage Example

Case #3 is an example showing how stress shadow from previous stages can influence the propagation pattern of hydraulic fracture networks for next treatment stages, resulting in changing of total picture of generated hydraulic fracture network for the four stage treatment case.

This case includes four hydraulic fracture treatment stages. The well is cased and cemented. Stages 1 and 2 are pumped through three perforated clusters, and Stages 3 and 4 are pumped through four perforated clusters. The rock fabric is isotropic. The input parameters are listed in Table 4 below. The top view of total hydraulic fracture network without and with accounting for stress shadow from previous stages is shown in FIGS. 13.1-13.4.

TABLE 4

Input parameters for Case #3

| | |
|---|---|
| Young's modulus | 4.5 × 10$^6$ psi = 3.1e+10 Pa |
| Poisson's ratio | 0.35 |
| Rate | 30.9 bpm = 0.082 m3/s |
| Viscosity | 0.5 cp = 0.0005 pa-s |
| Height | 330 ft = 101 m |
| Pumping time | 70 min |

FIGS. 14.1-14.4 are schematic diagrams 1400.1-1400-4 depicting a fracture network 1429 at various stages during a fracture operation. FIG. 14.1 shows a discrete fracture network (DFN) 1429 before treatment. FIG. 14.2 depicts a simulated DFN 1429 after a first treatment stage. The DFN 1429 has propagated hydraulic fractures (HFN) 1431 extending therefrom due to the first treatment stage. FIG.

14.3 shows the DFN depicting a simulated HFN 1431.1-1431.4 propagated during four stages, respectively, but without accounting for previous stage effects. FIG. 14.4 shows the DFN depicting HFN 1431.1, 1431.2'-1431.4' propagated during four stages, but with accounting for the fractures, stress shadows and HFN from previous stages.

When stages are generated separately, they may not see each other as indicated in FIG. 14.3. When stress shadow and HFN from previous stages are taken into account as in FIG. 14.4 the propagation pattern may change. The hydraulic fractures 1431.1 generated for the first stage is the same for both case scenarios as shown in FIGS. 14.3 and 14.4. The second stage 1431.2 propagation pattern may be influenced by the first stage through stress shadow, as well as through new DFN (including HFN 1431.1 from Stage 1), resulting in the changing of propagation patterns to HFN 1431.2'. The HFN 1431.1' may start to follow HFN 1431.1 created at stage 1 while intercounting it. The third stage 1431.3 may follow a hydraulic fracture created during second stage treatment 1431.2, 1431.2', and may not propagate too far due to stress shadow effect from Stage 2 as indicated by 1431.3 versus 1431.3'. Stage 4 (1431.4) may tend to turn away from stage three when it could, but may follow HFN 1431.3' from previous stages when encounters it and be depicted as HFN 1431.4' in FIG. 14.4.

A method for computing the stress shadow in a complex hydraulic fracture network is presented. The method may involve an enhanced 2D or 3D Displacement Discontinuity Method with correction for finite fracture height. The method may be used to approximate the interaction between different fracture branches in a complex fracture network for the fundamentally 3D fracture problem. This stress shadow calculation may be incorporated in the UFM, a complex fracture network model. The results for simple cases of two fractures show the fractures can either attract or expel each other depending on their initial relative positions, and compare favorably with an independent 2D non-planar hydraulic fracture model.

Simulations of multiple parallel fractures from a horizontal well may be used to confirm the behavior of the two outmost fractures that may be more dominant, while the inner fractures have reduced fracture length and width due to the stress shadow effect. This behavior may also depend on other parameters, such as perforation friction and fracture spacing. When fracture spacing is greater than fracture height, the stress shadow effect may diminish and there may be insignificant differences among the multiple fractures. When perforation friction is large, sufficient diversion to distribute the flow equally among the perforation clusters may be provided, and the fracture dimensions may become approximately equal despite the stress shadow effect.

When complex fractures are created, if the formation has a small stress anisotropy, fracture interaction can lead to dramatic divergence of the fractures where they tend to repel each other. On the other hand, for large stress anisotropy, there may be limited fracture divergence where the stress anisotropy offsets the effect of fracture turning due to the stress shadow, and the fracture may be forced to go in the direction of maximum stress. Regardless of the amount of fracture divergence, the stress shadowing may have an effect on fracture width, which may affect the injection rate distribution into multiple perforation clusters, and overall fracture network footprint and proppant placement.

Figure 15:
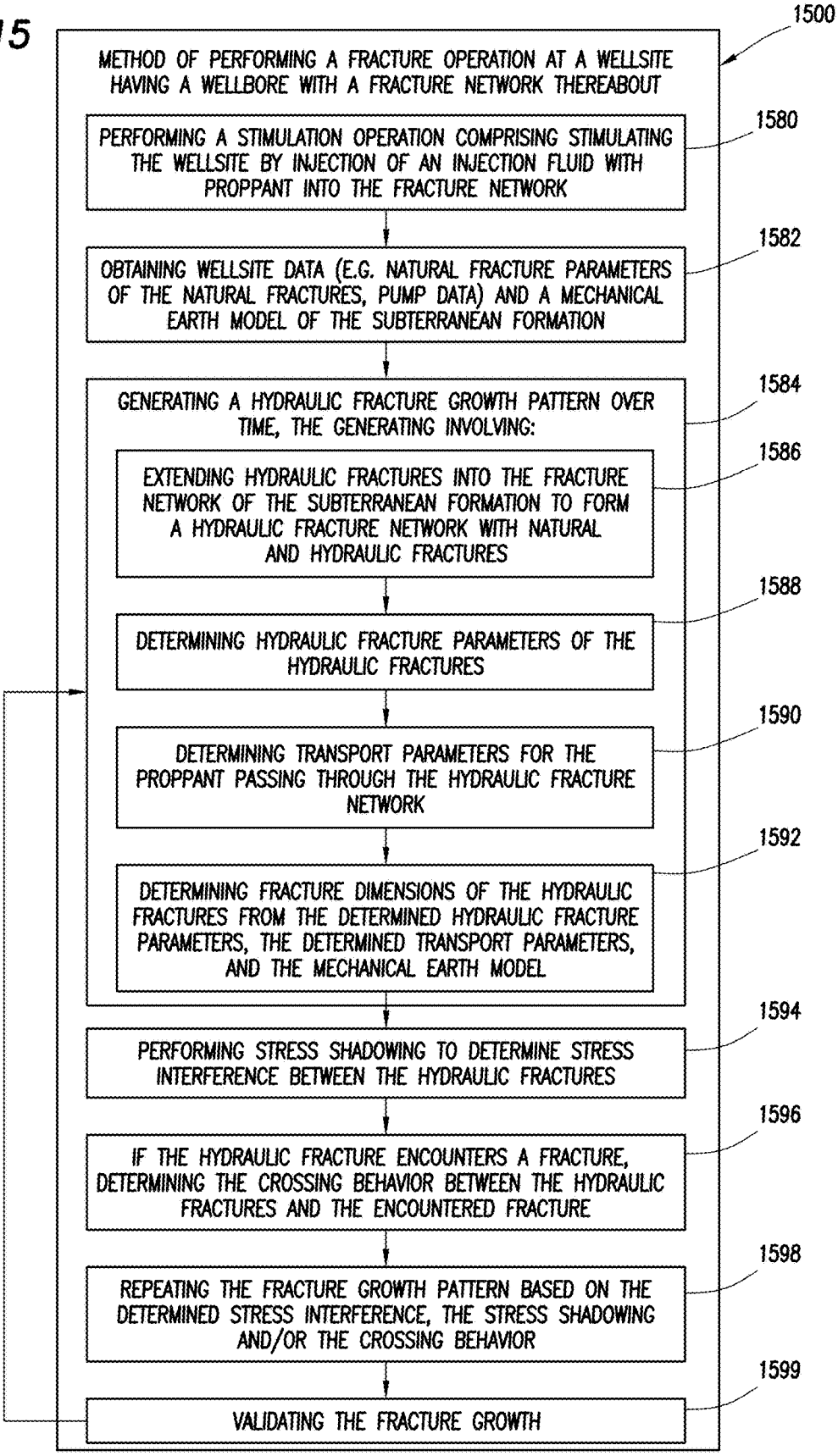
FIG. 15 is a flow chart depicting a method of performing a fracture operation.

FIG. 15 is a flow chart depicting a method 1500 of performing a fracture operation at a wellsite, such as the wellsite 100 of FIG. 1.1. The wellsite is positioned about a subterranean formation having a wellbore therethrough and a fracture network therein. The fracture network has natural fractures as shown in FIGS. 1.1 and 1.2. The method (1500) may involve (1580) performing a stimulation operation by stimulating the wellsite by injection of an injection fluid with proppant into the fracture network to form a hydraulic fracture network. In some cases, the stimulation may be performed at the wellsite or by simulation.

The method involves (1582) obtaining wellsite data and a mechanical earth model of the subterranean formation. The wellsite data may include any data about the wellsite that may be useful to the simulation, such as natural fracture parameters of the natural fractures, images of the fracture network, etc. The natural fracture parameters may include, for example, density orientation, distribution, and mechanical properties (e.g., coefficients of friction, cohesion, fracture toughness, etc.) The fracture parameters may be obtained from direct observations of borehole imaging logs, estimated from 3D seismic, ant tracking, sonic wave anisotropy, geological layer curvature, microseismic events or images, etc. Examples of techniques for obtaining fracture parameters are provided in PCT/US2012/48871 and US2008/0183451, previously incorporated by reference herein in their entirety.

Images may be obtained by, for example, observing borehole imaging logs, estimating fracture dimensions from wellbore measurements, obtaining microseismic images, and/or the like. The fracture dimensions may be estimated by evaluating seismic measurements, ant tracking, sonic measurements, geological measurements, and/or the like. Other wellsite data may also be generated from various sources, such as wellsite measurements, historical data, assumptions, etc. Such data may involve, for example, completion, geological structure, petrophysical, geomechanical, log measurement and other forms of data. The mechanical earth model may be obtained using conventional techniques.

The method (1500) also involves (1584) generating a hydraulic fracture growth pattern over time, such as during the stimulation operation. FIGS. 16.1-16.4 depict an example of (1584) generating a hydraulic fracture growth pattern. As shown in FIG. 16.1, in its initial state, a fracture network 1606.1 with natural fractures 1623 is positioned about a subterranean formation 1602 with a wellbore 1604 therethrough. As fracturing fluid is injected into the subterranean formation 1602 from the wellbore 1604, pressure from the fluid creates hydraulic fractures 1691 about the wellbore 1604. The hydraulic fractures 1691 extend into the subterranean formation along $L_1$ and $L_2$ (FIG. 16.2), and encounter other fractures in the fracture network 1606.1 over time as indicated in FIGS. 16.2-16.3. The points of contact with the other fractures are intersections 1625.

The generating (1584) may involve (1586) extending hydraulic fractures from the wellbore and into the fracture network of the subterranean formation to form a hydraulic fracture network including the natural fractures and the hydraulic fractures as shown in FIG. 16.2. The fracture growth pattern is based on the natural fracture parameters and a minimum stress and a maximum stress on the subterranean formation. The generating may also involve (1588) determining hydraulic fracture parameters (e.g., pressure p, width w, flow rate q, etc.) of the hydraulic fractures, (1590) determining transport parameters for the proppant passing through the hydraulic fracture network, and (1592) determining fracture dimensions (e.g., height) of the hydraulic fractures from, for example, the determined hydraulic fracture parameters, the determined transport parameters and the mechanical earth model. The hydraulic fracture parameters may be determined after the extending. The determining (1592) may also be performed by from the proppant transport parameters, wellsite parameters and other items.

The generating (1584) may involve modeling rock properties based on a mechanical earth model as described, for example, in Koutsabeloulis and Zhang, *3D Reservoir Geomechanics Modeling in Oil/Gas Field Production*, SPE Paper 126095, 2009 SPE Saudi Arabia Section Technical Symposium and Exhibition held in Al Khobar, Saudi Arabia, 9-11 May, 2009. The generating may also involve modeling the fracture operation by using the wellsite data, fracture parameters and/or images as inputs modeling software, such as UFM, to generate successive images of induced hydraulic fractures in the fracture network.

The method (1500) also involves (1594) performing stress shadowing on the hydraulic fractures to determine stress interference between the hydraulic fractures (or with other fractures), and (1598) repeating the generating (1584) based on the stress shadowing and/or the determined stress interference between the hydraulic fractures. The repeating may be performed to account for fracture interference that may affect fracture growth. Stress shadowing may involve performing, for example, a 2D or 3D DDM for each of the hydraulic fractures and updating the fracture growth pattern over time. The fracture growth pattern may propagate normal to a local principal stress direction according to stress shadowing. The fracture growth pattern may involve influences of the natural and hydraulic fractures over the fracture network (see FIG. 16.3).

Stress shadowing may be performed for multiple wellbores of the wellsite. The stress shadowing from the various wellbores may be combined to determine the interaction of fractures as determined from each of the wellbores. The generating may be repeated for each of the stress shadowings performed for one or more of the multiple wellbores. The generating may also be repeated for stress shadowing performed where stimulation is provided from multiple wellbores. Multiple simulations may also be performed on the same wellbore with various combinations of data, and compared as desired. Historical or other data may also be input into the generating to provide multiple sources of information for consideration in the ultimate results.

The method also involves (1596) determining crossing behavior between the hydraulic fractures and an encountered fracture if the hydraulic fracture encounters another fracture, and (1598) repeating the generating (1584) based on the crossing behavior if the hydraulic fracture encounters a fracture (see, e.g., FIG. 16.3). Crossing behavior may be determined using, for example, the techniques of PCT/US2012/059774, the entire contents of which is hereby incorporated herein in its entirety.

The determining crossing behavior may involve performing stress shadowing. Depending on downhole conditions, the fracture growth pattern may be unaltered or altered when the hydraulic fracture encounters the fracture. When a fracture pressure is greater than a stress acting on the encountered fracture, the fracture growth pattern may propagate along the encountered fracture. The fracture growth pattern may continue propagation along the encountered fracture until the end of the natural fracture is reached. The fracture growth pattern may change direction at the end of the natural fracture, with the fracture growth pattern extending in a direction normal to a minimum stress at the end of the natural fracture as shown in FIG. 16.4. As shown in FIG. 16.4, the hydraulic fracture extends on a new path 1627 according to the local stresses $\sigma_1$ and $\sigma_2$.

Optionally, the method (1500) may also involve (1599) validating the fracture growth pattern. The validation may be performed by comparing the resulting growth pattern with other data, such as microseismic images as shown, for example, in FIGS. 7.1 and 7.2.

The method may be performed in any order and repeated as desired. For example, the steps of generating (1584)-(1599) may be repeated over time, for example, by iteration as the fracture network changes. The generating (1584) may be performed to update the iterated simulation performed during the generating to account for the interaction and effects of multiple fractures as the fracture network is stimulated over time.

Generating a Hydraulic Fracture Growth Pattern

As indicated with respect to FIG. 15, fracture operations may involve 1584 generating a hydraulic fracture growth pattern over time. This generating 1584 may involve 1588 determining as described with respect to FIG. 15. The hydraulic fracture growth pattern may also be determined, for example, using simulations using fracture models, such as planar 3D (PL3D) and/or pseudo-3D (P3D) models. This section describes techniques for determining such hydraulic fracture parameters using a stacked height growth (SHG) model alone or in combination with the PL3D and/or P3D models.

Production from shale reservoirs may be affected by horizontal well completion with multiple stages of hydraulic fractures along the wellbore, and the effectiveness of fracturing treatments used to generate these hydraulic fractures. Since shale formations contain natural fractures, fracturing treatments may generate complex fracture networks due to interaction of the hydraulic fractures with the natural fractures. Simulations may be performed to generate fracture parameters, such as induced fracture dimensions and proppant placement in these fractures, and to assist in assessing, planning, and optimizing the completion to maximize the hydrocarbon recovery and economics.

The process of hydraulic fracture interaction with the natural fractures and the propagation of complex fracture network may be simulated. The fracture model may be used to simulate fracture height, so that fracture treatment may be designed to minimize or avoid unwanted height growth into non-hydrocarbon bearing layers, and/or the layers that could adversely affect hydrocarbon production (e.g., a water bearing formation). In shallow formations where vertical overburden stress may be low, the induced hydraulic fracture may initially be vertical, and may turn into a horizontal fracture as the vertical fracture height grows and intersects formation bedding planes when fluid pressure exceeds the overburden stress. This may create a so-called 'T-shaped' fracture. Simulations may be designed to address complex fracture configurations, such as non-planar T-shaped fracture, in order to design an effective fracture treatment.

Simulations may be also used to predict various wellsite conditions, such as complex hydraulic fracture geometry and proppant distribution in the fracture network in a formation containing pre-existing natural fractures, interaction among complex fracture branches, interaction between hydraulic fracture and natural fractures, and/or propagation of a network of fracture branches. Such simulations may involve applying a planar fracture model, such as PKN, Radial (RAD), Kristonovich-Geertsma-de Klerk (KGD), Planar 3D, and/or Pseudo 3D model. The simulations may be used for each fracture branch in the fracture network.

Various techniques may be used to perform simulations of various fracture networks. For example, as described herein, UFM may be used to simulate complex fracture networks in a naturally fractured formation. Examples of simulations are also provided in U.S. Pat. Nos. 8,412,500, 8,571,843, 8,428,923, 7,509,245, and PCT Application No. WO2013/067363, previously incorporated by reference herein. Examples of simulations are also provided in Weng et al., "Modeling of Hydraulic-Fracture-Network Propagation in a Naturally Fractured Formation," J. SPE Production & Operations, Vol. 26. No. 4, pp. 368-380, Nov. 2011 and Kresse et al., "Numerical Modeling of Hydraulic Fractures Interaction in Complex Naturally Fractured Formations," 46th U.S. Rock Mechanics/Geomechanics Symposium, Chicago, Ill., Jun. 24-27, 2012, and Cohen et al., "Parametric Study on Completion Design in Shale Reservoirs Based on Fracturing-to-Production Simulations," Paper, International Petroleum Technology Conference (IPTC)-AIME IPTC 17462, presented at IPTC, Doha, Qatar, 20-22 Jan., 2014.

Planar 3D (PL3D) and Pseudo 3D (P3D)

The PL3D model assumes the fracture to be a plane and its footprint is discretized into elements. Equations governing fluid flow, elasticity, and mass balance may be solved numerically, coupled with the fracture propagation rules. The fracture planes may be divided into small elements and a set of discretized mathematical equations governing fracture deformation, fluid flow in the entire fracture network, and propagation of the fracture fronts solved.

In cases where planar hydraulic fractures are induced, the mathematics and the resulting system of equations may be solved by using PL3D. The PL3D may be used, for example, when a large portion of the fracture propagates outside of the zone where the fracture was initiated and an amount of vertical flow is expected. PL3D may be used, for example, in cases where greater accuracy is needed and where time is available for extensive processing. Examples of PL3D are described in U.S. Pat. Nos. 8,428,923 and 7,509,245.

The P3D model is a cell-based technique which separately considers vertical growth and horizontal propagation of the fractures. With this approach, a width profile and fracture height may be calculated based on local pressure and a local vertical stress profile. Fracture height growth modeling in the UFM may be based on the P3D approach. For more general complex fracture networks consisting of fracture branches oriented in different directions, a full 3D fracture model, which is an extension of PL3D to non-planar fractures and which may involve intensive computation, may be used. A computationally more efficient approach may be to use the P3D model for each of the fracture branches 1732.

Figure 17:
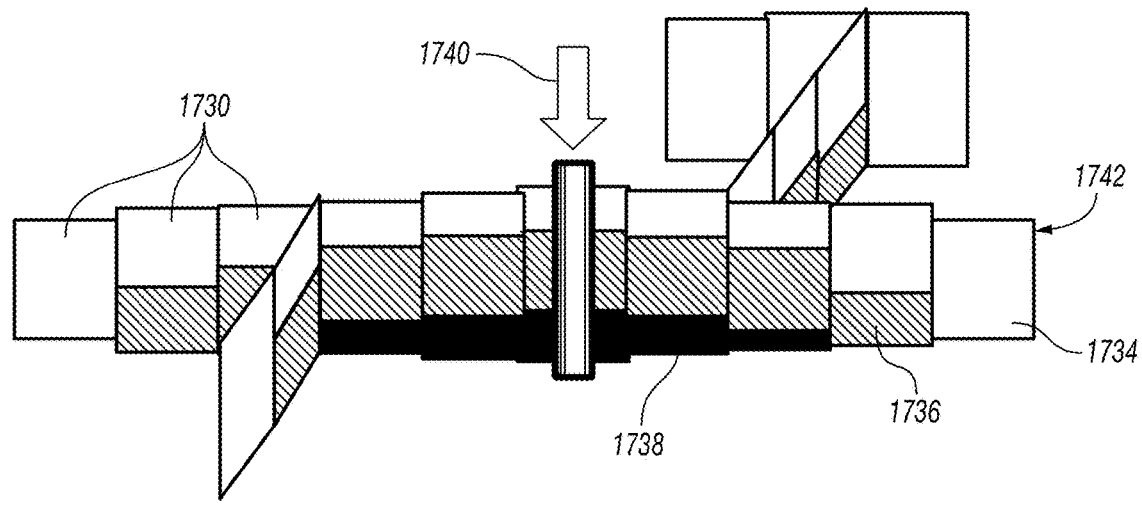
FIG. 17 is a schematic diagram of a hydraulic fracture network divided into elements.

FIG. 17 is a schematic diagram of a fracture network 1700 divided into small vertical elements 1730. The network has fluid 1734, slurry 1736 and bank 1738 therein. The P3D model divides each fracture plane 1742 into the multiple vertical elements (or cells) 1730, with each element 1730 spanning the entire fracture height at that location. Using P3D, the equations for fluid flow inside the fracture network 1700 is discretized, coupled with elasticity equations that relate fracture width to fluid pressure, and may be solved numerically for the fluid pressure in each element 1730. The arrow 1740 depicts fracturing fluid being pumped into the wellbore fracture network 1700.

Figure 18:
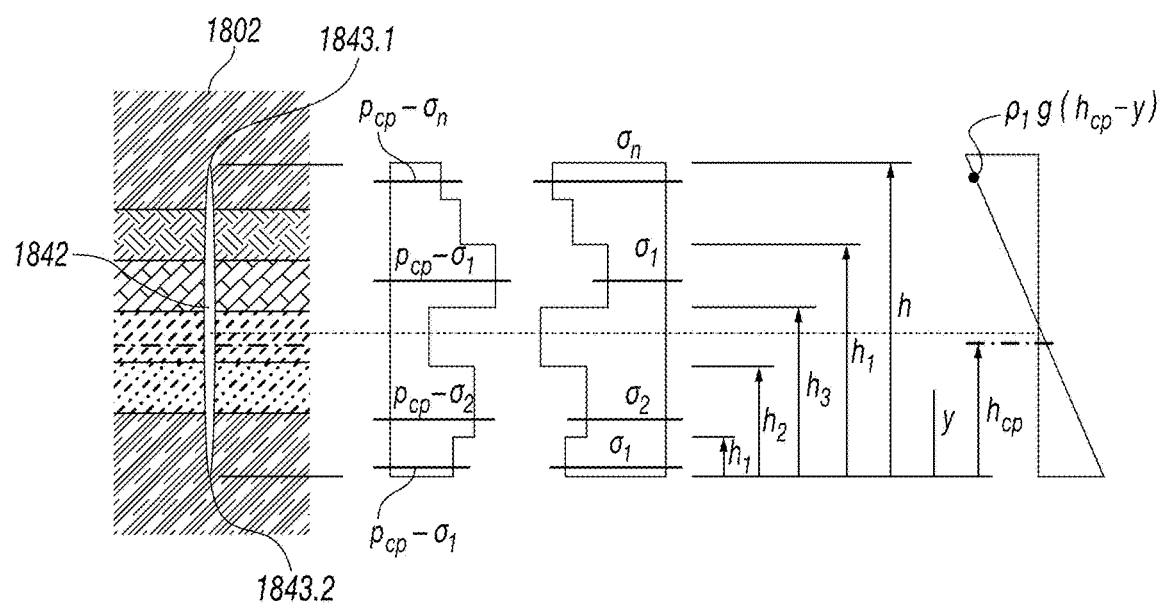
FIG. 18 is a schematic diagram illustrating a fracture width and stress profile for a fracture.

The fracture height and width profile may be computed analytically based on, for example, local fluid pressure inside the fracture, a vertical in-situ stress profile, and layered rock properties. The fracture height and width profile may be computed based on a 2D analytical solution for a layered formation with piecewise constant stress in each layer as illustrated in FIG. 18. FIG. 18 depicts an example width and stress profile 1800 of a fracture 1842 extending along multiple layers of the formation 1802. Corresponding gravity $g=\rho g(h_{cp}-y)$, net pressure $p_{cp}-\sigma(y)$ stresses $\sigma(y)$, fracture height h measured from the bottom tip of the fracture, zone depth $h_i$ for layer i, and initiation depth $h_{cp}$ graphs are shown relative to the fracture 1842.

The cell-based P3D model represents the fracture 1842 as a series of horizontally connected cells. It assumes plane strain condition for each cell, and calculates the fracture height and width profile of each cell based on a 2D analytical solution for a layered formation with piecewise constant stress in each layer, as illustrated in FIG. 18. The stress intensity factors $K_{Iu}$, $K_{Il}$ at top and bottom tips 1843.1, 1843.2 of the fracture 1842 and the width profile w(z) are given as follows:

$$K_{Iu} = \sqrt{\frac{\pi h}{2}} \left[ p_{cp} - \sigma_n + \rho_f g \left( h_{cp} - \frac{3}{4}h \right) \right] + \sqrt{\frac{2}{\pi h}} \sum_{i=1}^{n-1} (\sigma_{i+1} - \sigma_i) \left[ \begin{array}{l} \frac{h}{2} \arccos\left( \frac{h - 2h_i}{h} \right) \\ - \sqrt{h_i(h - h_i)} \end{array} \right] \tag{10}$$

$$H_{Il} = \sqrt{\frac{\pi h}{2}} \left[ p_{cp} - \sigma_n + \rho_f g \left( h_{cp} - \frac{h}{4} \right) \right] + \sqrt{\frac{2}{\pi h}} \sum_{i=1}^{n-1} (\sigma_{i+1} - \sigma_i) \left[ \begin{array}{l} \frac{h}{2} \arccos\left( \frac{h - 2h_i}{h} \right) \\ + \sqrt{h_i(h - h_i)} \end{array} \right] \tag{11}$$

$$w(y) = \frac{4}{E'} \left[ p_{cp} - \sigma_n + \rho_f g \left( h_{cp} - \frac{h}{4} - \frac{y}{2} \right) \right] \sqrt{y(h-y)} + \frac{4}{\pi E'} \sum_{i=1}^{n-1} (\sigma_{i+1} - \sigma_i) \left[ \begin{array}{l} (h_i - y)\cosh^{-1} \frac{z\left(\frac{h-2h_i}{h}\right) + h_i}{|z - h_i|} \\ + \sqrt{y(h-y)} \arccos\left( \frac{h - 2h_i}{h} \right) \end{array} \right] \tag{12}$$

where $p_{cp}$, is the perforation depth, g is gravity, $\rho$ is density, and y is a vertical coordinate. See, e.g., Mack and Warpinski.

The stress intensity factors $K_{Iu}$, $K_{Il}$ and width w(z) may be calculated based on the pressure in each element at the reference perforation depth $p_{cp}$ and the pressure may be assumed to be constant vertically (other than due to hydrostatic gradient). In a so-called equilibrium height model, for a given pressure $p_{cp}$, the equilibrium fracture height may be determined so that the stress intensity factor at the tips of the fracture equal to the fracture toughness in respective layers. The equilibrium height model neglects the local pressure gradient near the tips of the fracture when the tips are moving. The so-called non-equilibrium height model incorporates additional contributions to the tip stress intensity factors due to the tip velocity. This allows the tip velocities to be computed for a given $p_{cp}$ and stress profile, and then used to update the fracture height.

The P3D approach may be less processing intensive than PL3D, and may rely on assumptions, such as that the fracture is initiated and its leading front propagates in the lower stress layer compared to the neighboring layers above and below. If this is not the case, the fracture height growth may become unstable which may affect accuracy, since it may not directly correlate to the global fracture compliance and fracture front growth as is done with the PL3D model.

FIGS. 19.1 and 19.2 are schematic diagrams 1900.1, 1900.2 illustrating stress profiles 1943.1, 1943.2 with corresponding fracture growth. Each figure shows vertical distribution of the minimum stress a the layers of the formation, and the predicted half of the fracture geometry 1944.1, 1944.2 associated therewith based on the P3D model. The realistic expected fracture growth 1946.1, 1946.2 is also displayed for comparision. As demonstrated by these figures, in some cases, the fractures may become unstable and affect the predictions generated by the P3D model.

FIG. 19.1 shows perforations placed in a reverse stress contrast condition with a low stress layer 1941.1 along the stress profile 1943.1 above a higher stress layer 1941.2. The fracture is initially propagating in the perforated layer 1941.2. Initially, a first group of elements 1950.1 is generated. Over time, additional elements 1950.2 may be added. The elements 1950.1 and 1950.2 may be extended to extend a height of the fracture as indicated by portion 1950.3.

In this case, upward height growth is initially contained by the thin high stress layer 1941.5. When the top tip of the fracture breaks through this high stress layer 1941.5 into the upper layer 1941.1 that has lower stress than the perforated layer, the P3D model indicates that a run-away height growth ensues with a single fracture lobe as indicated by the stack 1949 of elements and the solid line 1944.1. While in reality, as indicated by the dashed line 1946.1, the upward height growth may still be contained if another layer 1941.6 exists above with positive stress contrast, thereby creating a double lobed fracture.

The difference between the P3D model 1944.1 and reality 1946.1 may be due to an underlying assumption inherent in the P3D model. The P3D model assumes that the fracture shape is elliptic-like and the fracture 'front' contains a zone where the perforation interval lies (or, for multiple vertical perforations, the perforation where fracture initiates, which corresponds to the lowest stress). Since fluid flow is from the wellbore towards the front along a single fracture, the fluid pressure at the wellbore is greater than the pressure at the front tip which is approximately equal to the stress in the initiation zone. When fracture height at the wellbore breaks into a zone with stress much lower than the perforated layer, the fluid pressure is much higher than the stress at the tip, leading to run-away height growth as shown by line 1944.1 in FIG. 19.1.

In reality, the high stress layer 1941.5 provides containment before the breakthrough creates a pinch point 1947 and a vertical pressure drop, so that the actual fluid pressure in the part of the fracture that breaks into the low stress layer 1941.1 along the second lobe is lower than the pressure at perforations 1945, thereby slowing down the height growth. Furthermore, if there is a layer of positive stress contrast 1941.6 further above as depicted in FIG. 19.1, it can contain the height, and the fracture growth in the upper lower stress layer becomes more preferable than the original perforated layer, creating the additional fracture front. The upper low stress layer 1941.1 then becomes the new fracture front. FIGS. 19.1 suggest that the P3D model may need further adjustment to address reverse pressure situations with multiple fronts.

As shown in FIG. 19.2, the perforation may be placed in a stress condition with a high stress layer 1941.3 that is adjacent to and above a layer of lower stress 1941.4. After the fracture initiation, the fracture grows into the lower stress layer 1941.4, and it is expected to be contained mostly in the low stress layer 1941.4 as indicated by the dashed line 1946.2.

The P3D model predicts greater height growth into the higher stress layer 1941.3 due to the higher net pressure resulting from the assumption of fracture leading front lying in the perforated zone as indicated by the solid line 1944.2. The P3D prediction of FIG. 19.2 overpredicts the upward height growth because it forces the leading front to be in the zone containing the perforations 1945, leading to higher pressure and hence more upward height growth. Adjustment may be needed to further align the prediction of P3D with the realistic estimate.

Stacked Height Growth

In predicting fracture parameters, the SHG model is intended to generate the accuracy provided by PL3D while reducing processing time as provided in P3D. Additionally, this method is intended to provide a method usable for various zone property changes, such as cases with fractures extending from high to low stress layers as in FIG. 19.1 and for any type of fracture scenario (e.g., complex, vertical, T-shaped, etc.) Other methods, such as PL3D, P3D, and other UFMs may also be performed for validation and/or comparison.

As indicated above, the P3D model (and other models) may make assumptions that affect results. For example, an assumption may be made that a perforation (or 'initiation layer') is the lowest stress layer of the fracture cross section, in order for the fracture height growth to be contained. This assumption may be relaxed to remove this limitation and to consider the possibility of different stress configurations.

Using the SHG method, fracture height can be computed to take into consideration stress contrast situations at a faster computation time. The SHG model may be capable of addressing situations where fracture height is reasonably contained (e.g. positive stress contrast), or reverse stress contrast where fracture height grows from and/or breaks through higher stress layers 1941.2 into lower stress layers 1941.1, and/or where non-complex and/or complex fractures (e.g., fracture network or T-shaped fractures) are present.

To address a variety of situations, the SHG model may be provided to cope with the possibility of fracture height growth switches from positive and/or reverse stress contrast situations. This allows the SHG model to address situations where growth switches from the initial higher stress zone to a lower stress zone, and/or multiple fronts that can propagate simultaneously in the same vertical plane, at a lower computational cost.

The SHG model may be used to simulate hydraulic fracture parameters using multiple rows of elements vertically stacked as shown by P3D and connected. With the SHG model, each fracture plane may consist of one or more stacks of elements. For each stack of elements, the SHG model assumes that the fracture front being in the lower stress layer is satisfied locally. The width profile and stress intensity factor at the top and bottom of the fracture depends on the vertical stress profile and the pressure profile along the stack of elements.

In situations with positive stress contrast where in-situ stress in the fracture initiation layers is lower or about the same as the layers above and below, fracture height growth is stable and relatively contained in the perforated zones, one stack of cells may be used as with the P3D model. For a formation with layers of reverse stress contrast as in FIG. 19.1, the fracture can grow in height into a layer of lower stress, making it a favorable path for subsequent fracture growth and another stack of P3D cells may be created in the lower stress layer as shown in FIG. 20. Each stack can grow its length horizontally in its respective layers as in the conventional P3D model, and be connected to the stacks above and below. For a T-shaped fracture, the horizontal fracture that lies on top of a vertical fracture may be simulated as a stack of horizontal P3D elements, separate from but connected to the stacks of elements representing the vertical fracture.

Figure 21:
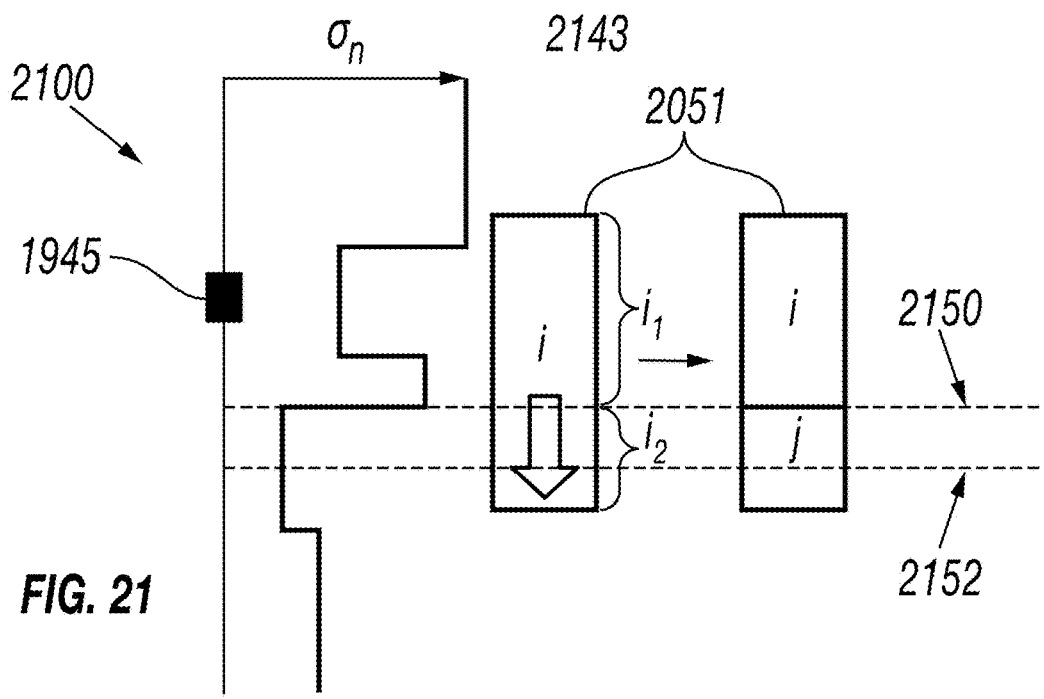
FIG. 21 is a schematic diagram depicting splitting of the elements along a stress profile.
Figure 22:
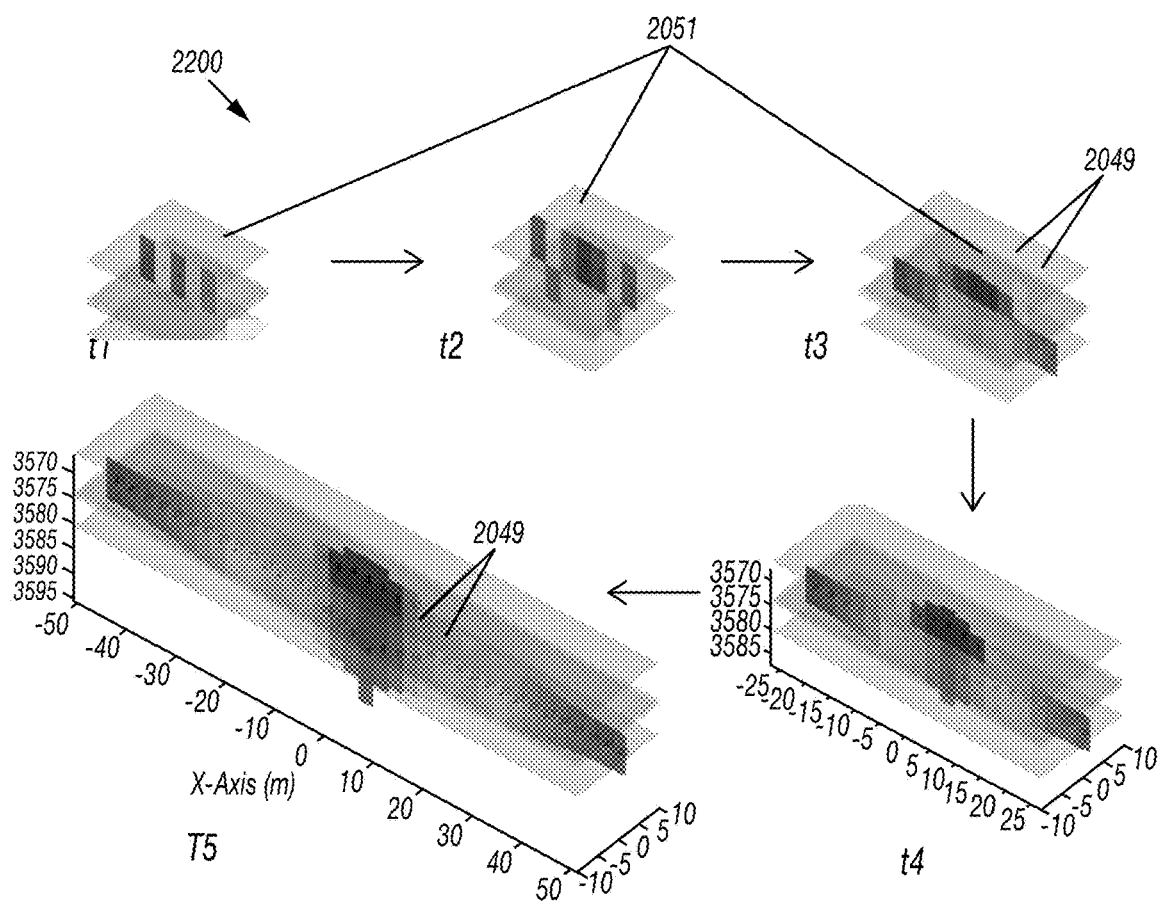
FIG. 22 is a schematic diagram depicting time steps during the generation of the predicted fracture growth using the SHG model.

FIGS. 20-22 depict various implementations of the SHG model. The SHG model may involve constructing vertically stacked and connected multiple P3D fractures on the same plane as shown in FIG. 20. FIG. 20 is a schematic diagram depicting stress profile 2000 generated using SHG for the scenario of FIG. 19.1, except with elements of two stacks 2049.1, 2049.2 of elements on the same plane generated by the SHG model in place of the stack 1949 generated by the P3D model in FIG. 19.1. The elements for the upper stack 2049.1 started when an upper part of the fracture grows into the lower stress layer 1941.1. Using cell based model framework, the upper stack 2049.1 belonging to the top fracture can be deemed as regular P3D elements (or cells), except they have different 'initiation zone' corresponding to layer 1941.1. This approach accounts for the vertical flow toward the lower stress layer 1941.1 through the pinched section 1947 of the fracture.

The stacks 2049.1, 2049.2 of FIG. 20 may be initially created by the propagation of cells 2051 into the lower stress zone 1941.1. If a specific criterion is verified, such as a change in a zone property, the cells 2051 may be split into two stacks 2049.1, 2049.2 of cells 2051 connected vertically. The zone property change may be, for example, a reverse stress contrast in the stress profile, a change in natural fracture pattern, a change of fracture plane from vertical to horizontal orientation, etc. If a given zone property change is encountered, then another stack of the vertically stacked elements in the zones of zone property change may be generated by splitting at least a portion of the extended vertically stacked elements of FIG. 19.1. A depth of the split may be chosen in order for both old and new cells to verify locally the P3D assumption that the initiation layer is in the lowest stress layer covered by their height.

Figure 21 illustrates an example of the type of propagation sequence that the SHG model can produce and the conditions for element splitting. FIG. 21 provides a schematic diagram 2100 showing a stress profile 2143 with perforation 1945, a stress barrier 2150, and initiation depth 2152 corresponding to the newly created lower stack after the cell split as shown in FIG. 20. This figure shows the fracture elements 2051 as it extends from i1 to i2 in an initial time step, and then splits at a subsequent propagation time step. As shown by this diagram, the elements 2051 split along the stress barrier 2150 from a single element i into two adjacent elements i,j. One or more such elements may form the stacks 2049.1, 2049.2 as shown in FIG. 20.

FIG. 22 illustrates a type of propagation sequence 2200 the SHG model can produce. This figure shows the fracture elements 2051 generated at several propagation time steps t1-t5. This figure also shows that the stacks 2049.1, 2049.2 of fracture elements 2051 enable the main propagation path to deviate toward the lowest stress layer.

The split of the stacks 2049.1, 2049.2 into verticaly connected stacked elements may be accounted for in the propagation rules. A first consequence is that the fracture can have multiple tips propagating at different depths. Special situations may be encountered, such as multiple layers, hydraulic fracture-hydraulic fracture (HF-HF) or HF-natural fracture (NF) interactions. The propagation algorithm may be configured to react accordingly for each one of them.

Since the elements in the vertically stacked fractures belong to the same fracture, they may be connected in some way to properly account for the vertical fluid flow and proppant transport. As the fracture height of the top and bottom-most stacks grow, one or more criteria based on evaluation of a combination of the stress change in the newly contacted layer, the thickness of the layer and fracture tip stress intensity can be constructed to determine when to split the fracture further into more stacks.

The leading front of each stack can grow horizontally by adding new elements at the fracture front in the same way as in the conventional P3D model based on the propagation criterion. The boundary condition at the fracture front of each stack can be different due to different stresses at the respective layers. For the stacked fractures, fracture width is computed by combining the stacked elements into one fracture. The same is true for computing stress intensity factors at the top and bottom tips for height growth calculation. The different fluid pressures in the stacked cells are used in these calculations.

The UFM model can be extended to incorporate the SHG model using a system of equations for the fluid pressure in the network of stacked P3D elements. By solving these equations, fluid pressure, fracture width and flow rate distribution in the fracture network may be obtained. Proppant transport in the fracture network, including transport between the vertically stacked elements may also be computed.

Referring back to FIGS. 19.1-20, the stacks of elements of FIG. 20 may have elements at each end that never contact another element. The stacks 2049.1, 2049.2 of elements 2051 of FIG. 20 may have elements that do contact elements of an adjacent stack 2049. In this case, the top or bottom of the stacked elements are not necessarily fracture tips, and may be in a contact with another element. To account for this, the width profile equations may be adjusted by applying superposition principle on stacked elements. In such cases, Equation (12) may be modified as follows:

$$w(h, y) = \frac{4}{E^*\pi} \sum_{j=1}^{Nstack} \int_{H_{j-1}}^{H_j} \begin{bmatrix} p_{cp,j} \\ +\rho_{f,j}g(h_{cp,j}-a) \\ -\sigma(a) \end{bmatrix} \times \cosh^{-1}\left[\frac{y\left(\frac{h-2a}{h}\right)+a}{|y-a|}\right] da \qquad (13)$$

The width profile equation (13) may be determined by the following equations:

$$w(h, y) = \qquad (14)$$

$$\frac{4}{E^*\pi} \sum_{j=1}^{Nstack} \int_{H_{j-1}}^{H_j} \begin{bmatrix} p_{cp,j} \\ +\rho_{f,g}g(h_{cp,j}-a) \\ -\sigma(a) \end{bmatrix} \cosh^{-1}\left[\frac{y\left(\frac{h-2a}{h}\right)+a}{|y-a|}\right] da =$$

$$\frac{4}{E^*\pi}\{I_1 - I_2 + I_3\} \text{ with}$$

$$I_1 = \sum_{j=1}^{Nstack} \int_{H_{j-1}}^{H_j} [p_{cp,j} + \rho_{f,j}g(h_{cp,j}-a)]\cosh^{-1}\left[\frac{y\frac{(h-2a)}{h}+a}{|y-a|}\right] da \qquad (15)$$

$$I_2 = \int_0^h \sigma_n \cosh^{-1}\left[\frac{y\frac{(h-2a)}{h}+a}{|y-a|}\right] da \qquad (16)$$

$$I_3 = \sum_{i=1}^{n-1} \int_0^{h_i} [\sigma_{i+1} - \sigma_i]\cosh^{-1}\left[\frac{y\frac{(h-2a)}{h}+a}{|y-a|}\right] da \qquad (17)$$

To calculate $I_1$, equations (15)-(17) are broken down in two parts $I_{1,1}$ and $I_{1,2}$:

$$I_1 = I_{1,1} - I_{1,2} \tag{18}$$

$$I_{1,1} = \sum_{j=1}^{Nstack} \int_{H_{j-1}}^{H_j} [p_{cp,j} + \rho_{f,j} g h_{cp,j}] \cosh^{-1}\left[\frac{y\left(\frac{h-2a}{h}\right)+a}{|y-a|}\right] da \tag{19}$$

$$I_{1,2} = \sum_{j=1}^{Nstack} \int_{H_{j-1}}^{H_j} \rho_{f,j} g a \cosh^{-1}\left[\frac{y\left(\frac{h-2a}{h}\right)+a}{|y-a|}\right] da \tag{20}$$

Integration of these equations gives the following:

$$I_{1,1} = \sum_{j=1}^{Nstack} \left[ \begin{array}{c} [p_{cp,j} + \rho_{f,j} g h_{cp,j}] \\ \times \left\{ (a-y)\cosh^{-1}\left[\frac{y\frac{(h-2a)}{h}+a}{|y-a|}\right] \right\} \\ -\sqrt{y(h-y)} \arcsin\frac{h-2a}{h} \end{array} \right]_{a=H_{j-1}}^{a=H_j} \tag{21}$$

$$I_{1,2} = \sum_{j=1}^{Nstack} \rho_{f,j} g \left[ \begin{array}{c} \frac{a^2-y^2}{2}\cosh^{-1}\left[\frac{y\frac{(h-2a)}{h}+a}{|y-a|}\right] \\ -\frac{(h+2y)\sqrt{y(h-y)}}{4} \\ \times \arcsin\left[\frac{h-2a}{h}\right] \\ -\frac{\sqrt{ay}\sqrt{(h-y)(h-a)}}{2} \end{array} \right]_{a=H_{j-1}}^{a=H_j} \tag{22}$$

then $$I_2 = \sigma_n \pi \sqrt{y(h-y)} \tag{23}$$

$$I_3 = \sum_{i=1}^{n-1} [\sigma_{i+1} - \sigma_i]\left[ \begin{array}{c} (h_i - y)\cosh^{-1}\left[\frac{y\frac{(h-2h_i)}{h}+h_i}{|y-h_i|}\right] \\ +\sqrt{y(h-y)} \arccos\frac{h-2h_i}{h} \end{array} \right] \tag{24}$$

where $I_n$ is an integer, and $da$ is an integration variable.

Figure 23:
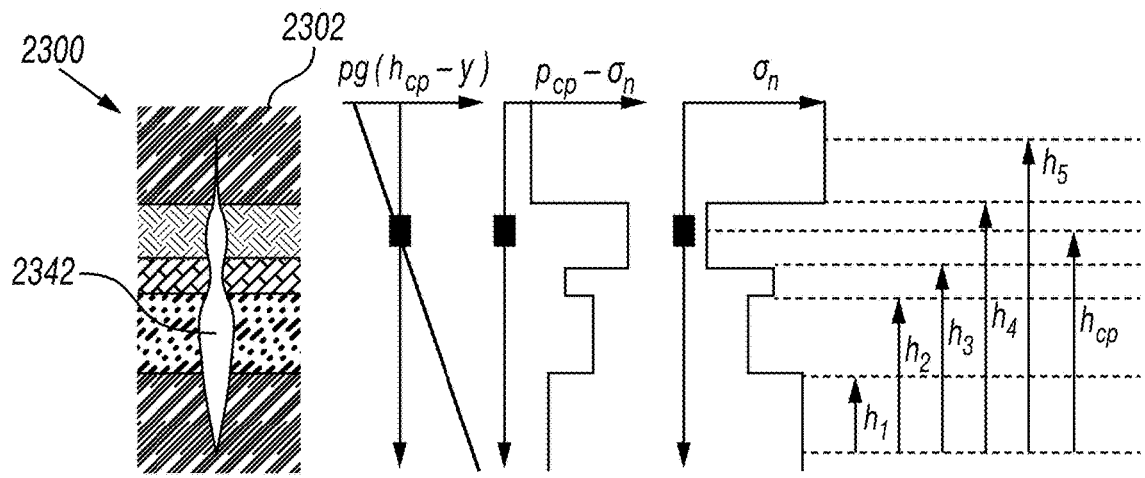
FIG. 23 is a schematic diagram illustrating a fracture width and stress profile for another fracture.

FIG. 23 shows a fracture width and stress profile 2342 in a formation 2302. The height growth depends on the stress intensity factor at the top and bottom tip of the fracture as described in equations (10) and (11). Like the width profile, these stress intensity factors are functions of the pressure profile and the stress profile along the whole fracture cross-section. Therefore, these calculations now include all stacked elements of the cross section resulting in the following:

$$K_{lup} = \sqrt{\frac{2}{\pi h}} \sum_{j=1}^{Nstack} \int_{H_{j-1}}^{H_j} \left[ \begin{array}{c} p_{cp,j} \\ +\rho_{f,j} g(h_{cp,j} - a) \\ -\sigma(a) \end{array} \right] \sqrt{\frac{a}{h-a}} \, da \tag{25}$$

$$K_{ldown} = \sqrt{\frac{2}{\pi h}} \sum_{j=1}^{Nstack} \int_{H_{j-1}}^{H_j} \left[ \begin{array}{c} p_{cp,j} \\ +\rho_{f,j} g(h_{cp,j} - a) \\ -\sigma(a) \end{array} \right] \sqrt{\frac{a}{h-a}} \, da \tag{26}$$

The stress intensity factor equations (25) and (26) may be determined by the following equations for the stress intensity factor at the top tip:

$$K_{lup} = \sqrt{\frac{2}{\pi h}} \sum_{j=1}^{Nstack} \int_{H_{j-1}}^{H_j} \left[ \begin{array}{c} p_{cp,j} \\ +\rho_{f,j} g(h_{cp,j} - a) \\ -\sigma(a) \end{array} \right] \sqrt{\frac{a}{h-1a}} \, da = \tag{27}$$

$$\sqrt{\frac{2}{\pi h}} \{I_1 - I_2 + I_3\} \text{ with}$$

$$I_1 = \sum_{j=1}^{Nstack} \int_{H_{j-1}}^{H_j} [p_{cp,j} + \mu_{f,j} g(h_{cp,j} - a)] \sqrt{\frac{a}{h-a}} \, da \tag{28}$$

$$I_2 = \int_0^h \sigma_n \sqrt{\frac{a}{h-a}} \, da \tag{29}$$

$$I_3 = \sum_{i=1}^{n-1} \int_0^h [\sigma_{i+1} - \sigma_i] \sqrt{\frac{h}{h-a}} \, da \tag{30}$$

$I_1$ may be broken down as follows:

$$I_1 = I_{1,1} - I_{1,2} \tag{31}$$

$$I_{1,1} = \sum_{j=1}^{Nstack} \int_{H_{j-1}}^{H_j} [p_{cp,j} + \rho_{f,j} g h_{cp,j}] \sqrt{\frac{a}{h-a}} \, da \tag{32}$$

$$I_{1,2} = \sum_{j=1}^{Nstack} \int_{H_{j-1}}^{H_j} \rho_{f,j} g a \sqrt{\frac{a}{h-a}} \, da \tag{33}$$

which integrate as:

$$I_{1,1} = \sum_{j=1}^{Nstack} [p_{cp,j} + \rho_{f,j} g h_{cp,j}] \left[ \begin{array}{c} -\sqrt{a(h-a)} \\ +h \arctan\sqrt{\frac{a}{h-a}} \end{array} \right]_{a=H_{j-1}}^{a=H_j} \tag{34}$$

$$I_{1,2} = \sum_{j=1}^{Nstack} \rho_{f,j} g \left[ \begin{array}{c} -\frac{2a+3h}{4}\sqrt{a(h-a)} \\ -\frac{3h^2}{8}\arcsin\frac{h-2a}{h} \end{array} \right]_{a=H_{j-1}}^{a=H_j} \tag{35}$$

and the integration of $I_1$ and $I_2$ gives $$I_2 = \sigma_n \frac{\pi h}{2} \tag{36}$$

$$I_3 = \sum_{i=1}^{n-1} (\sigma_{i+1} - \sigma_i)\left[\frac{h}{2}\arccos\left(\frac{h-2h_i}{h}\right) - \sqrt{h_i(h-h_i)}\right] \tag{37}$$

The stress intensity factor at the bottom tip may be determined from the following:

$$K_{ldown} = \sqrt{\frac{2}{\pi h}} \sum_{j=1}^{Nstack} \int_{H_{j-1}}^{H_j} \begin{bmatrix} p_{cp,j} \\ +\rho_{f,j}g(h_{cp,j}-a) \\ -\sigma(a) \end{bmatrix} \sqrt{\frac{h-a}{a}} \, da = \quad (38)$$

$$\sqrt{\frac{2}{\pi h}} \{I_1 - I_2 + I_3\} \text{ with}$$

$$I_1 = \sum_{j=1}^{Nstack} \int_{H_{j-1}}^{H_j} [p_{cp,j} + \rho_{f,j}g(h_{cp,j}-a)]\sqrt{\frac{h-a}{a}} \, da \quad (39)$$

$$I_2 = \int_0^h \sigma_n \sqrt{\frac{h-a}{a}} \, da \quad (40)$$

$$I_3 = \sum_{i=1}^{n-1} \int_0^{h_i} [\sigma_{i+1} - \sigma_i] \sqrt{\frac{h-a}{a}} \, da \quad (41)$$

$$I_1 = I_{1,1} - I_{1,2} \quad (42)$$

$$I_{1,1} = \sum_{j=1}^{Nstack} \int_{H_{j-1}}^{H_j} [p_{cp,j} + \rho_{f,j}gh_{cp,j}]\sqrt{\frac{h-a}{a}} \, da \quad (43)$$

$$I_{1,2} = \sum_{j=1}^{Nstack} \int_{H_{j-1}}^{H_j} \rho_{f,j}ga\sqrt{\frac{h-a}{a}} \, da \quad (44)$$

which be integrated as:

$$I_{1,1} = \sum_{j=1}^{Nstack} \begin{bmatrix} p_{cp,j} \\ +\rho_{f,j}gh_{cp,j} \end{bmatrix} \begin{bmatrix} \sqrt{a(h-a)} \\ +h \arctan\sqrt{\frac{a}{h-a}} \end{bmatrix}_{a=H_{j-1}}^{a=H_j} \quad (45)$$

$$I_{1,2} = \sum_{j=1}^{Nstack} \rho_{f,j}g \begin{bmatrix} \frac{2a-h}{4}\sqrt{a(h-a)} \\ -\frac{h^2}{8}\arcsin\frac{h-2a}{h} \end{bmatrix}_{a=H_{j-1}}^{a=H_j} \quad (46)$$

and finally $$I_2 = \sigma_n \frac{\pi h}{2} \quad (47)$$

$$I_2 = \sigma_n \frac{\pi h}{2} \quad (48)$$

In order to account for flow vertically and horizontally through the stacked elements, the SHG model may consider one or more initiation layers for each fracture. While flow may be determined between horizontal fracture elements, the SHG model may also consider vertical flow and gravity that may result from splitting elements vertically. The following equation may be used to consider such vertical flow:

$$\left(\frac{q}{\theta}\right)^{n'} = -\left(\frac{\overline{w}^{2n'+1}}{\alpha_0} \frac{\partial(p+\rho g s e_s.e_z)}{\partial s}\right) \quad (49)$$

where θ=L when applied to vertical flow, θ=H when applied to horizontal flow, $e_s$ and $e_z$ are unit vectors in horizontal direction along the fracture plane and in vertical direction, ao is a constant, and s is a distance along the fracture.

Height Growth Validation

One or more models, such as the PL3D, P3D, and/or SHG models, may be used to determine fracture parameters. By using more than one such model, the results of the various models may be compared to validate the results. FIGS. 24-27 show an example of modeling using PL3D, P3D, and SGH in a single fracture with different perforation locations, one with positive stress contrast (fracture initiates in a low stress zone) and one with reverse stress contrast (fracture initiates in a higher stress zone). FIGS. 28.1-30.3 show modeling using PL3D, P3D, and SGH for the same reverse stress contrast example for different fluid viscosities. FIGS. 31-35.3 show an example of modeling using PL3D, P3D, and SGH for a bi-wing fracture in a formation with complex stress profile. These examples compare results generated using each of the models for the given example, and potential effects of stress and/or other factors on the results.

Figure 24:
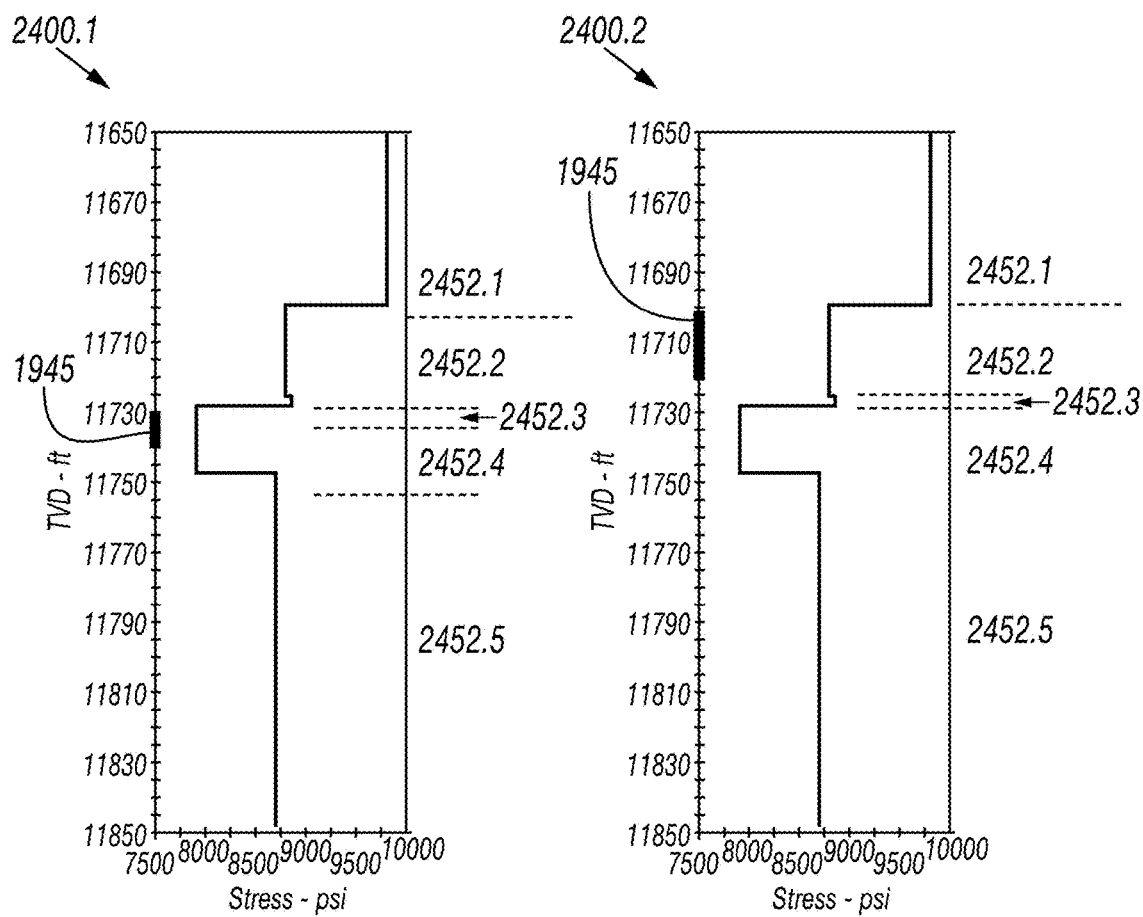
FIG. 24 is a series of graphs illustrating stress profiles of portions of a formation with perforations at various locations therein.

As shown in FIG. 24, certain conditions, such as stresses, may be taken into consideration. FIG. 24 are graphs 2400.1, 2400.2 depicting stress (x-axis) versus depth (y-axis) in an example of a single planar fracture. These graphs 2400.1, 2400.2 show the stresses along five zones (or layers) 2452.1-2452.5 of a formation. These zones have different minimum horizontal stresses.

In FIG. 24, the perforations 1945 are placed in a low stress zone 2452.4. In FIG. 24, the perforations 1945 are placed in the third highest stress zone 2452.2. FIGS. 25-27 show simulations performed using PL3D, P3D, and SHG for comparison. The assumptions of the P3D model may conform under certain conditions, such as those of FIG. 24, and may not conform to the conditions of FIG. 24.

FIGS. 25.1-26.2 show various simulation results for stress configurations using the PL3D and P3D models. FIGS. 25.1-25.2 are graphs 2500.1, 2500.2 depicting estimated fracture growth for the stress profile shown in FIG. 24. These graphs 2500.1, 2500.2 show fracture growth in the x direction (x-axis) and y direction (y-axis) using the PL3D and P3D models, respectively. These figures indicate that the results from the PL3D and P3D are comparable and relatively similar. Since PL3D is the most accurate model, it can be used as a benchmark for determining the validity and accuracy of the P3D model.

FIGS. 26.1-26.2 are graphs 2600.1, 2600.2 depicting estimated fracture growth for the stress profile shown in FIG. 24. These graphs 2600.1, 2600.2 show fracture growth in the x direction (x-axis) and y direction (y-axis) using the PL3D and P3D models, respectively. The results of FIGS. 26.1 and 26.2 shows very different fracture shapes between the PL3D and the P3D simulator. These figures indicate that the P3D model may not correspond with PL3D under the reverse stress contrast condition given in this example.

In FIG. 26.1, the PL3D simulator predicts the propagation from the perforation to the lowest stress layer and large fracture length extension in that layer, but the P3D model fails to do so as shown in 26.2 and its half length may be much underestimated. From this comparison, the assumption that the peforations are in the lowest stress zone may not be respected, and the simulators using the P3D models may not accurately simulate the fracturing process. These comparisons also indicate that an adjustment may be needed to accurately simulate the fracturing process under similar conditions.

The SHG model is used to consider the stress configurations of both FIG. 24 while maintaining accuracy and processing efficiency. FIG. 27 is a graph 2700 depicting estimated fracture growth for the stress profile shown in FIG. 24 using the SHG model. This graph 2700 shows fracture growth in the x direction (x-axis) and y direction (y-axis) using the SHG model for comparison with the results of FIGS. 26.1 and 26.2. As shown by these graphs, the SHG provides similar results to the PL3D thereby indicating a validation of its results.

FIGS. 28.1-30.3 and FIGS. 31-35.3 depict additional validations for a series of example cases. FIGS. 28.1-30.3 depict simulations using PL3D, P3D, and SHG for the stress profile of FIG. 24 using various fluid viscosities. The fluid treatment is made of 6,520 gallons of fluids injected into the formation at 20 bbl/min pump rate. This variation of viscosity provides different fracture shapes, to extend the comparison.

FIGS. 28.1-28.3 are graphs 2800.1-2800.3 showing fracture growth in the x direction (x-axis) and y direction (y-axis) using the PL3D, P3D, and SHG models, respectively, for a fluid viscosity of 1 cp. FIGS. 29.1-29.3 are graphs 2900.1-2900.3 showing fracture growth in the x direction (x-axis) and y direction (y-axis) using the PL3D, P3D, and SHG models, respectively, for a fluid viscosity of 10 cp. FIGS. 29.1-29.3 may be similar to FIGS. 25.1, 26.2 and 27. FIGS. 30.1-30.3 are graphs 3000.1-3000.3 showing fracture growth in the x direction (x-axis) and y direction (y-axis) using the PL3D, P3D, and SHG models, respectively, for a fluid viscosity of 100 cp. As demonstrated by FIGS. 28.1-30.3, the final fracture shape generated by PL3D and P3D differ, while the final fracture shape generated by PL3D and SHG are comparable.

FIGS. 31-34.3 depict an example involving a bi-wing fracture in a formation with complex stress profile 3143. FIG. 31 is a graph 3100 depicting stress (x-axis) versus depth (y-axis) in an example involving a complex stress profile involving a bi-wing fracture. The graph 3100 shows the bi-wing fracture propagated in a reservoir with thirty-one (31) vertical layers. These zones have different minimum horizontal stresses.

FIGS. 32.1-34.3 depict simulations using PL3D, P3D, and SHG for the stress profile of FIG. 31 using various fluid viscosities. The fluid treatment through the fracture includes 50000 gallons of fluid injected at 50 bbl/min pump rate. This variation of viscosity in a fracture with different vertical layers further extends the comparison.

FIGS. 32.1-32.3 are graphs 3200.1-3200.3 showing fracture growth in the x direction (x-axis) and y direction (y-axis) using the PL3D, P3D, and SHG models, respectively, for a fluid viscosity of 1 cp. FIGS. 33.1-33.3 are graphs 3300.1-3300.3 showing fracture growth in the x direction (x-axis) and y direction (y-axis) using the PL3D, P3D, and SHG models, respectively, for a fluid viscosity of 10 cp. FIGS. 34.1-34.3 are graphs 3400.1-3400.3 showing fracture growth in the x direction (x-axis) and y direction (y-axis) using the PL3D, P3D, and SHG models, respectively, for a fluid viscosity of 100 cp.

As demonstrated by FIGS. 32.1-34.3, with decreasing viscosity, two distinct propagating fronts appear, one at the depth of the perforation and another above. The comparison shows that while the P3D model ignores the propagation front above the perforation, the SHG model simulates both fronts with a fracture length similar to that of PL3D model.

As described herein, the UFM can simulate complex hydraulic fracture network created by interactions with natural fractures and stress shadow effects. FIGS. 35.1-35.3 are graphs 3500.1-3500.3 depicting various interactions of natural fractures using the SHG model. As demonstrated by FIGS. 35.1-35.3, the SHG model may also be used within UFM with some modifications to the propagation algorithm and to the stress shadow algorithm to generate a simulated fracture network.

FIG. 35.1 shows a pair of natural fractures 3560 symmetrically positioned on each side of a perforation 3545 and oriented in the direction of minimum horizontal stress using the same conditions as shown in FIGS. 29.1-29.3. This figure shows how a fracture made of stacked elements can grow into a natural fracture after intersection. Simulations as shown in FIGS. 35.2 and 35.3 were performed under the conditions as used with FIGS. 32.1-34.3, and with pre-existing natural fractures (not shown). FIG. 35.2 shows the induced hydraulic fracture network and the fracture width throughout the network, and FIG. 35.3 shows the network broken down into elements. These figures illustrate how the SHG model behaves with a more complex stress profile as shown in FIG. 35.2 and with a complex natural fracture network as shown in FIG. 35.3.

Figure 36:
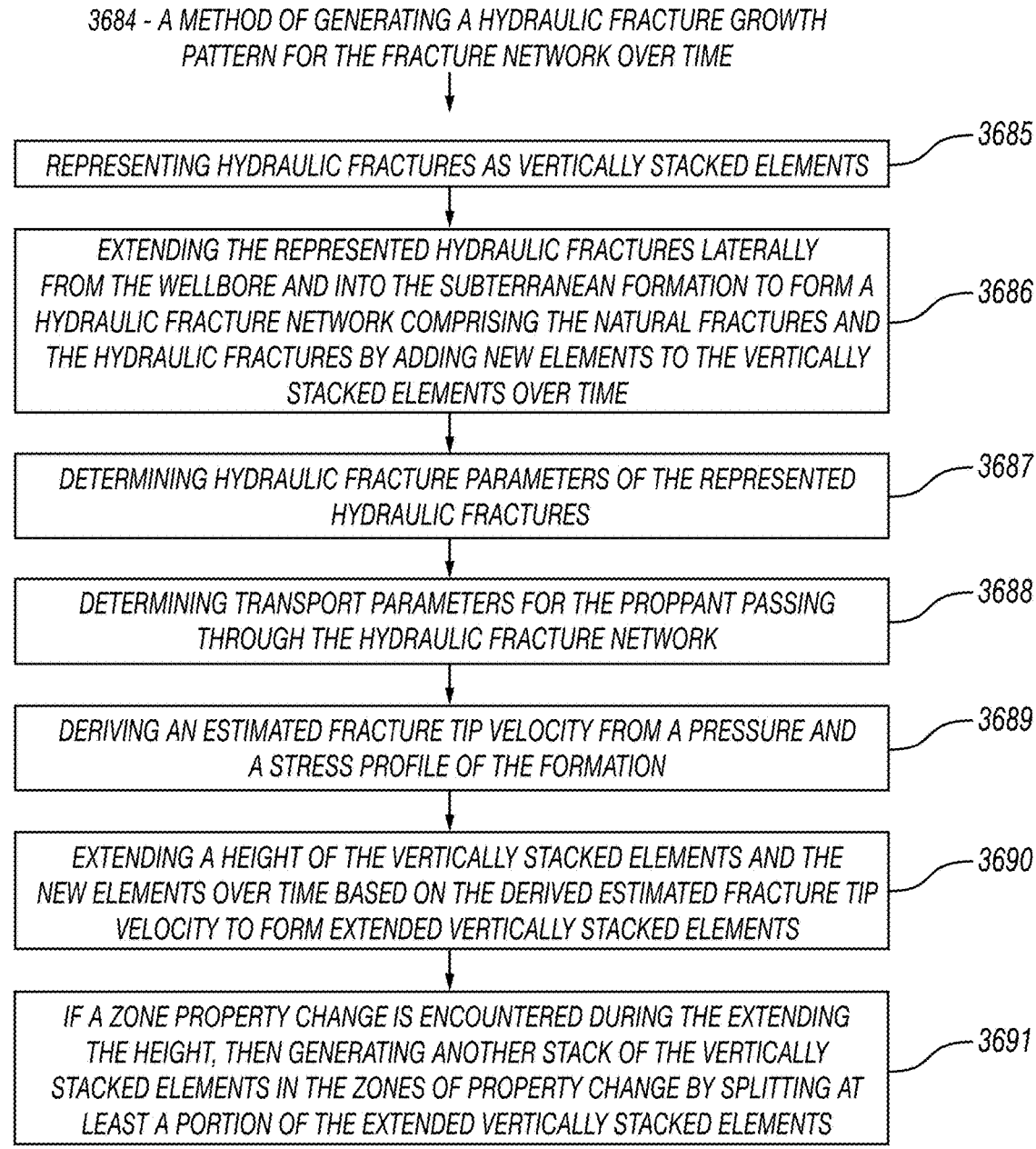
FIG. 36 is a flow chart depicting a method of generating a hydraulic fracture growth pattern.

FIG. 36 is a flow chart depicting a method 3684 of generating a hydraulic fracture growth pattern over time which may be used in the method 1500 of FIG. 15 in place of the determining 1584. The generating 3684 may be performed using one or more of the models described herein. As provided in FIG. 36, the method 3684 involves 3685—representing hydraulic fractures as vertically stacked elements, and 3686—extending the represented hydraulic fractures laterally from the wellbore and into the subterranean formation to form a hydraulic fracture network comprising the natural fractures and the hydraulic fractures by adding new elements to the vertically stacked elements over time. The representing 3685 and extending 3686 may be performed as described, for example, with respect to FIG. 19.1.

The method also involves 3687—determining hydraulic fracture parameters of the represented hydraulic fractures, 3688—determining transport parameters for the proppant passing through the hydraulic fracture network, and 3689—deriving an estimated fracture tip velocity from a pressure and a stress profile of the formation. The method continues with 3690—extending a height of the vertically stacked elements and the new elements over time based on the derived estimated fracture tip velocity to form extended vertically stacked elements (see, e.g., FIG. 19.1). The method also involves 3691—if a zone property change is encountered during the extending the height, then generating another stack of the vertically stacked elements in the zones of reverse stress contrast by splitting at least a portion of the extended vertically stacked elements as shown, for example, in FIG. 20.

The method may also involve validating the generating 3684 by comparing the hydraulic fracture network using one or more of the models (e.g., PL3D, P3D, SHG) herein. The method 3684 may be used with part or all of the method 1500. Part or all of the methods 3600 and/or 1500 may be performed in any order and repeated as desired.

Although the present disclosure has been described with reference to exemplary embodiments and implementations thereof, the present disclosure is not to be limited by or to such exemplary embodiments and/or implementations. Rather, the systems and methods of the present disclosure are susceptible to various modifications, variations and/or enhancements without departing from the spirit or scope of the present disclosure. Accordingly, the present disclosure expressly encompasses all such modifications, variations and enhancements within its scope.

It should be noted that in the development of any such actual embodiment, or numerous implementation, specific decisions must be made to achieve the developer's specific goals, such as compliance with system related and business related constraints, which will vary from one implementation to another. Moreover, it will be appreciated that such a development effort might be complex and time consuming but would nevertheless be a routine undertaking for those of ordinary skill in the art having the benefit of this disclosure. In addition, the embodiments used/disclosed herein can also include some components other than those cited.

In the description, each numerical value should be read once as modified by the term "about" (unless already expressly so modified), and then read again as not so modified unless otherwise indicated in context. Also, in the description, it should be understood that any range listed or described as being useful, suitable, or the like, is intended that any and every value within the range, including the end points, is to be considered as having been stated. For example, "a range of from 1 to 10" is to be read as indicating each and every possible number along the continuum between about 1 and about 10. Thus, even if specific data points within the range, or even no data points within the range, are explicitly identified or refer to only a few specific ones, it is to be understood that inventors appreciate and understand that any and all data points within the range are to be considered to have been specified, and that inventors possessed knowledge of the entire range and all points within the range.

The statements made herein merely provide information related to the present disclosure and may not constitute prior art, and may describe some embodiments illustrating the invention. All references cited herein are incorporated by reference into the current application in their entirety.

Although only a few example embodiments have been described in detail above, those skilled in the art will readily appreciate that many modifications are possible in the example embodiments without materially departing from the system and method for performing wellbore stimulation operations. Accordingly, all such modifications are intended to be included within the scope of this disclosure as defined in the following claims. In the claims, means-plus-function clauses are intended to cover the structures described herein as performing the recited function and not only structural equivalents, but also equivalent structures. Thus, although a nail and a screw may not be structural equivalents in that a nail employs a cylindrical surface to secure wooden parts together, whereas a screw employs a helical surface, in the environment of fastening wooden parts, a nail and a screw may be equivalent structures. It is the express intention of the applicant not to invoke 35 U.S.C. § 112, paragraph 6 for any limitations of any of the claims herein, except for those in which the claim expressly uses the words 'means for' together with an associated function.

What is claimed is:

1. A method of performing a fracture operation at a wellsite, the wellsite positioned about a subterranean formation having a wellbore therethrough and a fracture network therein, the fracture network comprising natural fractures, the wellsite stimulated by injection of an injection fluid with proppant into the fracture network, the method comprising:
   obtaining wellsite data comprising natural fracture parameters of the natural fractures and obtaining a mechanical earth model of the subterranean formation;
   generating a hydraulic fracture growth pattern for the fracture network over time, the generating comprising:
      representing hydraulic fractures as vertically stacked elements;
      extending the represented hydraulic fractures laterally from the wellbore and into the subterranean formation to form a hydraulic fracture network comprising the natural fractures and the hydraulic fractures by adding new elements to the vertically stacked elements over time, the new elements connected to the vertically stacked elements above and below the new elements and defining a fracture front boundary, the subterranean formation having a plurality of zone properties therein;
      determining hydraulic fracture parameters of the represented hydraulic fractures based on rows of the vertically stacked elements;
      determining transport parameters for the proppant passing through the hydraulic fracture network;
      deriving an estimated fracture tip velocity from a pressure and a stress profile of the subterranean formation;
      extending a height of the vertically stacked elements and the new elements over time based on the derived estimated fracture tip velocity to form extended vertically stacked elements;
      determining effects of stress shadow in the hydraulic facture network, wherein the effects of stress shadow account for local stress fields ahead of propagating tips of neighboring fractures;
      determining whether a zone property change is encountered while extending the height; and
      generating another stack of the vertically stacked elements by splitting at least a portion of the extended vertically stacked elements based on a determination that a zone property change is encountered while extending the height; and
   based on the wellsite data obtained and the hydraulic fracture growth pattern generated, performing a multi-stage simulation in a reservoir within the subterranean formation by injecting the injection fluid with proppant into the hydraulic facture network.

2. The method of claim 1, wherein representing the hydraulic fractures comprises modeling using a Pseudo-3D model.

3. The method of claim 1, wherein generating another stack comprises modeling using a stacked height growth model.

4. The method of claim 1, wherein the zone property change comprises at least one of a reverse stress contrast in the stress profile, a change in natural fracture pattern, a change of fracture plane from vertical to horizontal, and a change of fracture plane to another orientation.

5. The method of claim 1, wherein the hydraulic natural fracture is one of bi-wing, T-shaped, and combinations thereof.

6. The method of claim 1, wherein the generating comprises:
   extending hydraulic fractures from the wellbore and into the fracture network of the subterranean formation to form a hydraulic fracture network comprising the natural fractures and the hydraulic fractures;
   determining hydraulic fracture parameters of the hydraulic fractures after the extending;
   determining transport parameters for the proppant passing through the hydraulic fracture network; and
   determining fracture dimensions of the hydraulic fractures from the determined hydraulic fracture parameters, the determined transport parameters and the mechanical earth model.

7. The method of claim 6, further comprising if the hydraulic fractures encounter another fracture, determining crossing behavior at the encountered another fracture, and repeating the generating.

8. The method of claim 7, wherein the hydraulic fracture growth pattern is unaltered by the crossing behavior.

9. The method of claim 7, wherein the fracture growth pattern is altered by the crossing behavior.

10. The method of claim 7, wherein a fracture pressure of the hydraulic fracture network is greater than a stress acting on the encountered fracture and wherein the fracture growth pattern propagates along the encountered fracture.

11. The method of claim 7, wherein the fracture growth pattern continues to propagate along the encountered fracture until an end of the natural fracture is reached.

12. The method of claim 11, wherein the fracture growth pattern changes direction at the end of the natural fracture, the fracture growth pattern extending in a direction normal to a minimum stress at the end of the natural fracture.

13. The method of claim 7, wherein the fracture growth pattern propagates normal to a local principal stress according to a stress shadowing.

14. The method of claim 6, further comprising validating the fracture growth pattern.

15. The method of claim 14, wherein the validating comprises comparing the fracture growth pattern with at least one simulation of stimulation of the fracture network.

16. The method of claim 6, wherein the extending comprises extending the hydraulic fractures along the hydraulic fracture growth pattern based on the natural fracture parameters and a minimum stress and a maximum stress on the subterranean formation.

17. The method of claim 6, wherein the determining fracture dimensions comprises one of evaluating seismic measurements, ant tracking, sonic measurements, geological measurements and combinations thereof.

18. The method of claim 6, wherein the wellsite data further comprises at least one of geological, petrophysical, geomechanical, log measurements, completion, historical and combinations thereof.

19. The method of claim 6, wherein the natural fracture parameters are generated by one of observing borehole imaging logs, estimating fracture dimensions from wellbore measurements, obtaining microseismic images, and combinations thereof.

20. The method of claim 6, further comprising:
if the hydraulic fracture encounters another fracture, determining crossing behavior between the hydraulic fractures and an encountered fracture based on stress interference; and
repeating the generating.

21. The method of claim 20, further comprising validating the fracture growth pattern.

22. The method of claim 1, further comprising repeating the generating over another zone of the subterranean formation.

23. A method of performing a fracture operation at a wellsite, the wellsite positioned about a subterranean formation having a wellbore therethrough and a fracture network therein, the fracture network comprising natural fractures, the wellsite stimulated by injection of an injection fluid with proppant into the fracture network, the method comprising:
obtaining wellsite data comprising natural fracture parameters of the natural fractures and obtaining a mechanical earth model of the subterranean formation;
generating a hydraulic fracture growth pattern for the fracture network over time, the generating comprising:
representing hydraulic fractures as vertically stacked elements;
extending the represented hydraulic fractures laterally from the wellbore and into the subterranean formation to form a hydraulic fracture network comprising the natural fractures and the hydraulic fractures by adding new elements to the vertically stacked elements over time, the new elements connected to the vertically stacked elements above and below the new elements and defining a fracture front boundary, the subterranean formation having a plurality of zone properties therein;
determining hydraulic fracture parameters of the represented hydraulic fractures based on rows of the vertically stacked elements;
determining transport parameters for the proppant passing through the hydraulic fracture network;
deriving an estimated fracture tip velocity from a pressure and a stress profile of the subterranean formation;
extending a height of the vertically stacked elements and the new elements over time based on the derived estimated fracture tip velocity to form extended vertically stacked elements;
determining whether a zone property change is encountered while extending the height;
generating another stack of the vertically stacked elements by splitting at least a portion of the extended vertically stacked elements based on a determination that a zone property change is encountered while extending the height;
performing stress shadowing on the hydraulic fractures to determine stress interference between the hydraulic fractures, wherein the stress shadowing accounts for local stress fields ahead of propagating tips of neighboring fractures; and
repeating the generating; and
based on the wellsite data obtained and the hydraulic fracture growth pattern generated, performing a stimulation in a shale reservoir within the subterranean formation by injecting the injection fluid with proppant into the fracture network.

24. The method of claim 23, wherein the stress shadowing comprises performing displacement discontinuity for each of the hydraulic fractures.

25. The method of claim 23, wherein the stress shadowing comprises performing the stress shadowing about multiple wellbores of a wellsite.

26. The method of claim 23, wherein the stress shadowing comprises performing the stress shadowing at multiple stimulation stages in the wellbore.

27. A method of performing a fracture operation at a wellsite, the wellsite positioned about a subterranean formation having a wellbore therethrough and a fracture network therein, the fracture network comprising natural fractures, the method comprising:
stimulating the wellsite by injection of an injection fluid with proppant into the fracture network;
obtaining wellsite data comprising natural fracture parameters of the natural fractures and obtaining a mechanical earth model of the subterranean formation;
generating a hydraulic fracture growth pattern for the fracture network over time, the generating comprising:

representing hydraulic fractures as vertically stacked elements, the elements defining a fracture front boundary;

extending the represented hydraulic fractures laterally from the wellbore and into the subterranean formation to form a hydraulic fracture network comprising the natural fractures and the hydraulic fractures by adding new elements to the vertically stacked elements over time at the fracture front boundary, the new elements connected to the vertically stacked elements above and below the new elements, the subterranean formation having a plurality of zone properties therein;

determining hydraulic fracture parameters of the represented hydraulic fractures based on rows of the vertically stacked elements;

determining transport parameters for the proppant passing through the hydraulic fracture network;

deriving an estimated fracture tip velocity from a pressure and a stress profile of the subterranean formation;

performing stress shadowing on the hydraulic fractures, wherein the stress shadowing accounts for local stress fields ahead of propagating tips of neighboring fractures;

extending a height of the vertically stacked elements and the new elements over time based on the derived estimated fracture tip velocity to form extended vertically stacked elements;

determining whether a zone property change is encountered while extending the height; and generating another stack of the vertically stacked elements by splitting at least a portion of the extended vertically stacked elements based on a determination that a zone property change is encountered while extending the height; and using the wellsite data and the hydraulic fracture growth pattern generated to optimize stimulation of a reservoir within the subterranean formation by injecting the injection fluid with proppant into the fracture network.

28. The method of claim 27, further comprising repeating the generating.

29. The method of claim 27, further comprising validating the hydraulic fracture growth pattern.

30. The method of claim 27, further comprising if the hydraulic fractures encounters another fracture, determining crossing behavior between the hydraulic fractures and the encountered another fracture and repeating the generating.

* * * * *